US012471376B2

(12) United States Patent
Zhang et al.

(10) Patent No.: US 12,471,376 B2
(45) Date of Patent: Nov. 11, 2025

(54) ARRAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Tiaomei Zhang, Beijing (CN); Haigang Qing, Beijing (CN); Gukhwan Song, Beijing (CN); Ziyang Yu, Beijing (CN); Yunsheng Xiao, Beijing (CN); Quanyong Gu, Beijing (CN); Mengqi Wang, Beijing (CN); Zhengkun Li, Beijing (CN); De Li, Beijing (CN); Hong Yi, Beijing (CN); Wenbo Chen, Beijing (CN); Zhongliu Yang, Beijing (CN); Shilong Wang, Beijing (CN); Pan Zhao, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/043,304

(22) PCT Filed: Jun. 22, 2022

(86) PCT No.: PCT/CN2022/100270
§ 371 (c)(1),
(2) Date: Feb. 27, 2023

(87) PCT Pub. No.: WO2023/245464
PCT Pub. Date: Dec. 28, 2023

(65) Prior Publication Data
US 2024/0274613 A1 Aug. 15, 2024

(51) Int. Cl.
G09G 5/00 (2006.01)
H10D 86/40 (2025.01)
H10D 86/60 (2025.01)

(52) U.S. Cl.
CPC ........... *H10D 86/60* (2025.01); *H10D 86/441* (2025.01); *H10D 86/421* (2025.01)

(58) Field of Classification Search
CPC ......... G09G 3/3233; G09G 2300/0426; G09G 2300/0819; G09G 2300/0861;
(Continued)

(56) References Cited

U.S. PATENT DOCUMENTS

2009/0057760 A1 3/2009 Cho
2016/0260792 A1* 9/2016 Kim ..................... H10K 59/131
(Continued)

FOREIGN PATENT DOCUMENTS

CN 104409416 A 3/2015
CN 104701175 A 6/2015
(Continued)

OTHER PUBLICATIONS

International Search Report & Written Opinion mailed Dec. 27, 2022, regarding PCT/CN2022/100270.
(Continued)

*Primary Examiner* — Joe H Cheng
(74) *Attorney, Agent, or Firm* — Intellectual Valley Law, P.C.

(57) ABSTRACT

An array substrate is provided. The array substrate includes a plurality of first reset signal lines configured to provide a plurality of first reset signals, a plurality of second reset signal lines configured to provide a plurality of second reset signals, a plurality of third reset signal lines, and a plurality of first connecting lines. A respective first reset signal line is connected to a row of first connecting lines, which in turn are
(Continued)

connected to source electrodes of first reset transistors in a row of subpixels, respectively. The plurality of second reset signal lines and the plurality of third reset signal lines form an interconnected reset signal supply network. A respective second reset signal line is connected to one or more of the plurality of third reset signal lines. A respective third reset signal line is connected to one or more of the plurality of second reset signal lines.

20 Claims, 46 Drawing Sheets

(58) Field of Classification Search
CPC ... G09G 2310/0251; G09G 2310/0262; G09G 2320/0209; G09G 2330/06; H10L 25/167; H10K 59/1201; H10K 59/131; H10D 86/60; H10D 86/421; H10D 86/441; H10D 86/481
See application file for complete search history.

(56) References Cited

U.S. PATENT DOCUMENTS

| | | |
|---|---|---|
| 2016/0365030 A1 | 12/2016 | Wu |
| 2018/0130409 A1 | 5/2018 | Xiang et al. |
| 2019/0019453 A1 | 1/2019 | Chen |
| 2022/0077265 A1 | 3/2022 | Ma et al. |
| 2022/0302219 A1* | 9/2022 | Li .................. H10K 59/353 |
| 2022/0328579 A1* | 10/2022 | Shang ............. H10K 59/124 |
| 2023/0042060 A1 | 2/2023 | Wang et al. |
| 2024/0177661 A1* | 5/2024 | Shang ............. G09G 3/3233 |
| 2024/0357869 A1* | 10/2024 | Li .................. H10D 86/441 |

FOREIGN PATENT DOCUMENTS

| | | |
|---|---|---|
| CN | 104575394 B | 2/2017 |
| CN | 107068060 A | 8/2017 |
| CN | 107274829 A | 10/2017 |
| CN | 107230451 B | 1/2018 |
| CN | 105810145 B | 6/2018 |
| CN | 108878494 A | 11/2018 |
| CN | 210837109 U | 6/2020 |
| CN | 111583872 B | 3/2021 |
| CN | 112909054 A | 6/2021 |
| CN | 113096601 A | 7/2021 |
| CN | 114373773 A | 4/2022 |
| CN | 114550653 A | 5/2022 |
| WO | 2022082596 A1 | 4/2022 |
| WO | WO-2022082773 A1 * | 4/2022 ........... G09G 3/3233 |

OTHER PUBLICATIONS

Extended European Search Report in the European Patent Application No. 22947243.6, dated Dec. 16, 2024.

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2022/100270, filed Jun. 22, 2022, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a plurality of first reset signal lines configured to provide a plurality of first reset signals, a plurality of second reset signal lines configured to provide a plurality of second reset signals, a plurality of third reset signal lines, and a plurality of first connecting lines; wherein a respective first reset signal line of the plurality of first reset signal lines is connected to a row of first connecting lines of the plurality of first connecting lines, which in turn are connected to source electrodes of first reset transistors in a row of subpixels, respectively; the plurality of second reset signal lines and the plurality of third reset signal lines form an interconnected reset signal supply network; a respective second reset signal line of the plurality of second reset signal lines is connected to one or more of the plurality of third reset signal lines; a respective third reset signal line of the plurality of third reset signal lines is connected to one or more of the plurality of second reset signal lines; the plurality of second reset signal lines respectively cross over the plurality of third reset signal lines; and the respective third reset signal line is connected to source electrodes of second reset transistors in a column of subpixels.

Optionally, voltage levels of the plurality of first reset signals and the plurality of second reset signals are different from each other.

Optionally, the array substrate comprises a plurality of pixel driving circuits configured to drive light emission in a plurality of subpixels; wherein a respective pixel driving circuit of the plurality of pixel driving circuits comprises an N1 node connected to a gate electrode of a driving transistor and an N4 node connected to a drain electrode of a light emitting control transistor; and reset voltage levels at the N1 node and the N4 node are different from each other.

Optionally, the array substrate comprises a plurality of pixel driving circuits configured to drive light emission in a plurality of subpixels; wherein the plurality of first reset signal lines, the plurality of second reset signal lines are in a second conductive layer comprising second capacitor electrodes of storage capacitors of the plurality of pixel driving circuits; and the plurality of third reset signal lines and the plurality of first connecting lines are in a first signal line layer comprising a plurality of voltage supply lines.

Optionally, a respective third reset signal line of the plurality of third reset signal lines comprises a main line with an overall extension direction along a second direction, and a branch line connected to and extending away from the main line; and the branch line extends along a direction substantially parallel to a first direction.

Optionally, an orthographic projection of the branch line on a base substrate is between an orthographic projection of a respective reset control signal line of a plurality of reset control signal lines on the base substrate and an orthographic projection of an interference preventing block on the base substrate, and between an orthographic projection of the main line on the base substrate and an orthographic projection of a respective voltage supply line of a plurality of voltage supply lines on the base substrate.

Optionally, an orthographic projection of the branch line on a base substrate is non-overlapping with an orthographic projection of any signal line in a first conductive layer on the base substrate, is non-overlapping with an orthographic projection of any signal line in a second conductive layer on the base substrate, and is non-overlapping with an orthographic projection of any signal line in a second signal line layer on the base substrate.

Optionally, a respective third reset signal line of the plurality of third reset signal lines comprises a first portion extending along a direction substantially parallel to a first direction, and a second portion extending along a direction substantially parallel to a second direction; an orthographic projection of the first portion on a base substrate at least partially overlaps with an orthographic projection of a respective second reset signal line of a present stage on the base substrate; and an orthographic projection of the second portion on the base substrate at least partially overlaps with an orthographic projection of a gate protrusion of a respective gate line of a plurality of gate lines on the base substrate.

Optionally, a respective third reset signal line of the plurality of third reset signal lines comprises a third portion extending along a direction substantially parallel to a first direction, and a fourth portion extending along a direction substantially parallel to a second direction; an orthographic projection of the third portion on a base substrate at least partially overlaps with an orthographic projection of a respective second reset signal line of a present stage of the plurality of second reset signal lines on the base substrate, and at least partially overlaps with an orthographic projection of a respective reset control signal line in the present stage of a plurality of reset control signal lines on the base substrate; and an orthographic projection of the fourth portion on the base substrate at least partially overlaps with an orthographic projection of a gate protrusion of a respective gate line of a plurality of gate lines on the base substrate.

Optionally, the array substrate comprises a plurality of pixel driving circuits configured to drive light emission in a plurality of subpixels; wherein a respective pixel driving circuit of the plurality of pixel driving circuits comprises at least one transistor includes a source electrode, a drain electrode, and an active layer having a channel part; and the active layer further comprises at least one of a first lightly doped drain region between the channel part and the source electrode, or a second lightly doped drain region between the channel part and the drain electrode.

Optionally, the at least one transistor having lightly doped drain region is a reset transistor.

Optionally, the at least one transistor having lightly doped drain region is a reset transistor having a drain electrode connected to an N1 node; and the N1 node is a node connected to a gate electrode of a driving transistor, and connected to a first capacitor electrode of a storage capacitor.

Optionally, the at least one transistor having lightly doped drain region is a reset transistor having a drain electrode connected to an N3 node; and the N3 node is a node connected to a drain electrode of a driving transistor and a source electrode of a light emitting control transistor.

Optionally, the at least one transistor having lightly doped drain region is a compensation transistor configured to provide a compensation voltage signal to a gate electrode of a driving transistor; a source electrode of the compensation transistor is connected to an N1 node; a drain electrode of the compensation transistor is connected to an N3 node; the N1 node is a node connected to a gate electrode of a driving transistor, and connected to a first capacitor electrode of a storage capacitor; and the N3 node is a node connected to a drain electrode of a driving transistor and a source electrode of a light emitting control transistor.

Optionally, the at least one transistor having lightly doped drain region is a double-gate transistor.

Optionally, the array substrate comprises a plurality of pixel driving circuits configured to drive light emission in a plurality of subpixels; wherein a respective pixel driving circuit of the plurality of pixel driving circuits comprises a third reset transistor; a drain electrode of the third reset transistor is connected to an N3 node; and the N3 node is a node connected to a drain electrode of a driving transistor and a source electrode of a light emitting control transistor.

Optionally, the array substrate comprises a plurality of pixel driving circuits configured to drive light emission in a plurality of subpixels; wherein a respective pixel driving circuit of the plurality of pixel driving circuits comprises an interference preventing block; the interference preventing block comprises at least one of a first interference preventing portion, a second interference preventing portion, a third interference preventing portion, or a fourth interference preventing portion; an orthographic projection of the first interference preventing portion on the base substrate is between an orthographic projection of a gate electrode of a compensation transistor on the base substrate and an orthographic projection of a gate electrode of a third reset transistor on the base substrate; and the orthographic projection of the first interference preventing portion on the base substrate spaces apart the orthographic projection of the gate electrode of the compensation transistor on the base substrate and the orthographic projection of the gate electrode of the third reset transistor on the base substrate.

Optionally, the second interference preventing portion connects to, and extends away from, a first end of the first interference preventing portion; the second interference preventing portion extends away from the first interference preventing portion along a direction substantially parallel to a second direction; an orthographic projection of the second interference preventing portion on the base substrate at least partially overlaps with an orthographic projection of a third part of an active layer of the compensation transistor on the base substrate; and the third part is between a first channel part and a second channel part of the active layer of the compensation transistor.

Optionally, the third interference preventing portion and the fourth interference preventing portion connect to a second end of the first interference preventing portion, respectively; the second end is opposite to the first end; the third interference preventing portion and the fourth interference preventing portion extend away from the first interference preventing portion, respectively, along opposite directions; both of the opposite directions are substantially parallel to a second direction; the third interference preventing portion extends away from the first interference preventing portion toward a respective second reset signal line of a present stage of the plurality of second reset signal lines; the fourth interference preventing portion extends away from the first interference preventing portion toward a second capacitor electrode of a storage capacitor; an orthographic projection of the third interference preventing portion and the fourth interference preventing portion on the base substrate at least partially overlaps with an orthographic projection of an N1 node on the base substrate; and the N1 node is a node connected to a gate electrode of a driving transistor, and connected to a first capacitor electrode of the storage capacitor.

In another aspect, the present disclosure provides a display apparatus, comprising the array substrate described herein or fabricated by a method described herein, and an integrated circuit connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of first reset signal lines configured to provide a plurality of first reset signals, a plurality of second reset signal lines configured to provide a plurality of second reset signals, a plurality of third reset signal lines, and a plurality of first connecting lines. Optionally, a respective first reset signal line of the plurality of first reset signal lines is connected to a row of first connecting lines of the plurality of first connecting lines, which in turn are connected to source electrodes of first reset transistors in a row of subpixels, respectively. Optionally, the plurality of second reset signal lines and the plurality of third reset signal lines form an interconnected reset signal supply network. Optionally, a respective second reset signal line of the plurality of second reset signal lines is connected to one or more of the plurality of third reset signal lines. Optionally, a respective third reset signal line of the plurality of third reset signal lines is connected to one or more of the plurality of second reset signal lines. Optionally, the plurality of second reset signal lines respectively cross over the plurality of third reset signal lines. Optionally, the respective third reset signal line is connected to source electrodes of second reset transistors in a column of subpixels.

Figure 1:
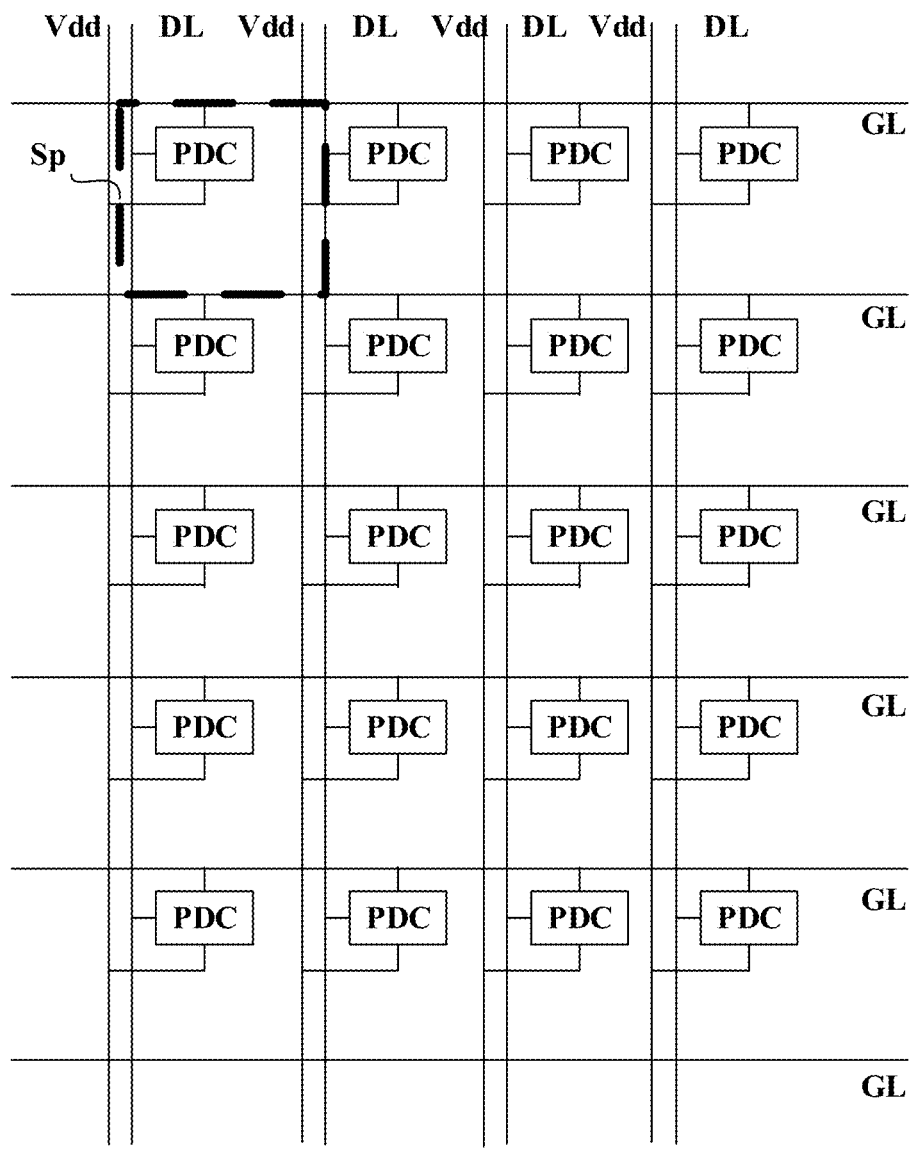
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of gate lines GL, a plurality of data lines DL, and a plurality of voltage supply lines Vdd. Light emission in a respective subpixel is driven by a respective pixel driving circuit PDC. In one example, a high voltage signal is input, through a respective one of the plurality of voltage supply lines Vdd, to the respective pixel driving circuit PDC connected to an anode of the light emitting element; a low voltage signal is input to a cathode of the light emitting element. A voltage difference between the high voltage signal (e.g., the VDD signal) and the low voltage signal (e.g., the VSS signal) is a driving voltage AV that drives light emission in the light emitting element.

The array substrate in some embodiments includes a plurality of subpixels. In some embodiments, the plurality of subpixels includes a respective first subpixel, a respective second subpixel, a respective third subpixel, and a respective fourth subpixel. Optionally, a respective pixel of the array substrate includes the respective first subpixel, the respective second subpixel, the respective third subpixel, and the respective fourth subpixel. The plurality of subpixels in the array substrate are arranged in an array. In one example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel.

In some embodiments, a minimum repeating unit of the plurality of subpixels of the array substrate includes the respective first subpixel, the respective second subpixel, the respective third subpixel, and the respective fourth subpixel. Optionally, each of the respective first subpixel, the respective second subpixel, the respective third subpixel, and the respective fourth subpixel, includes a first transistor T1, a second transistor T2, a third transistor T3, a fourth transistor T4, a fifth transistor T5, a sixth transistor T6, and a driving transistor Td. Optionally, each of the respective first subpixel, the respective second subpixel, the respective third subpixel, and the respective fourth subpixel, includes a first transistor T1, a second transistor T2, a third transistor T3, a fourth transistor T4, a fifth transistor T5, a sixth transistor T6, a seventh transistor T7, and a driving transistor Td.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 2A:
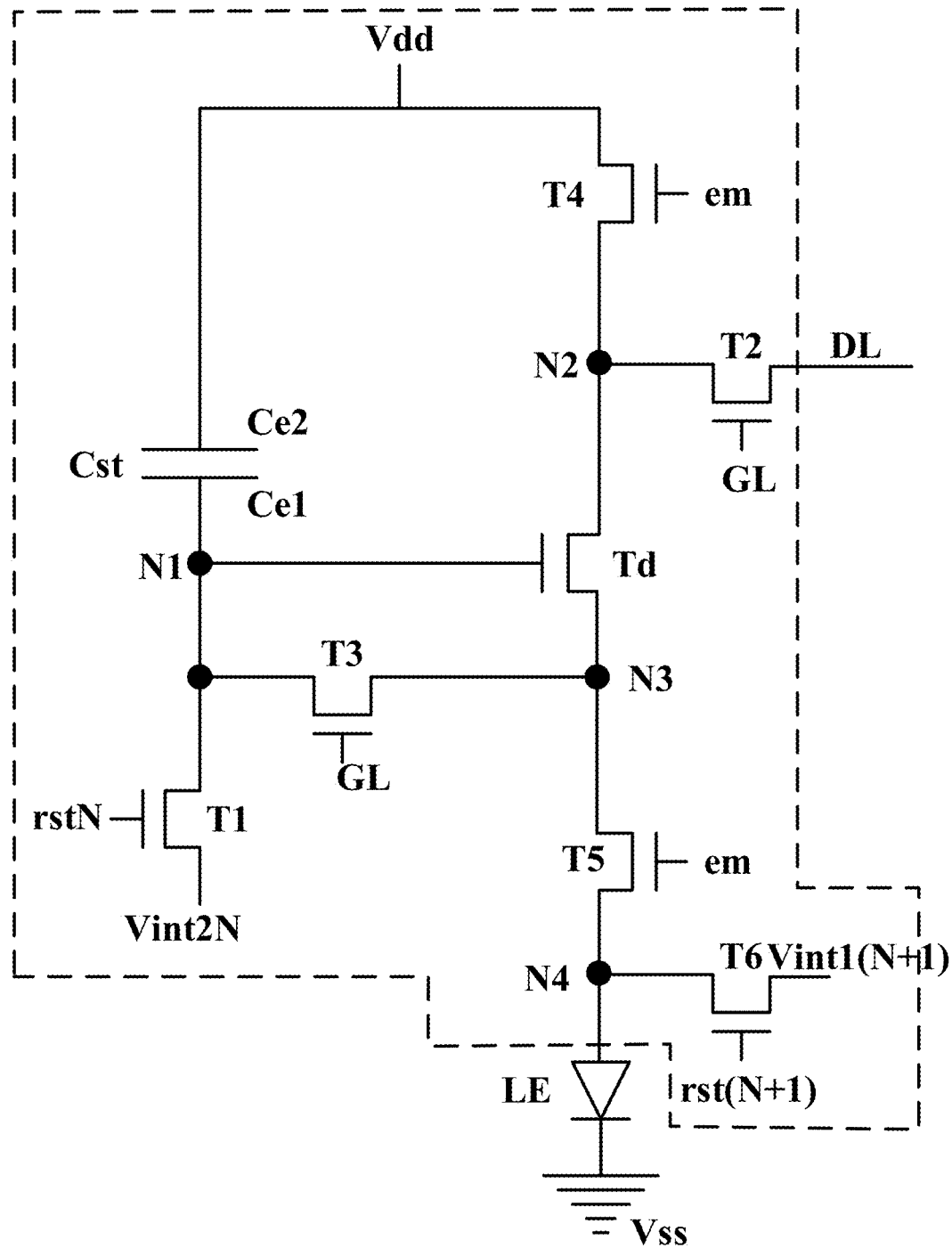
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2A, in some embodiments, the respective pixel driving circuit includes a driving transistor Td; a storage capacitor Cst having a first capacitor electrode Ce1 and a second capacitor electrode Ce2; a first transistor T1 having a gate electrode connected to a respective reset control signal line rstN in a present stage of a plurality of reset control signal lines, a source electrode connected to a respective second reset signal line Vint2N in a present stage of a plurality of second reset signal lines, and a drain electrode connected to a first capacitor electrode Ce1 of the storage capacitor Cst and a gate electrode of the driving transistor Td; a second transistor T2 having a gate electrode connected to a respective gate line of a plurality of gate lines GL, a source electrode connected to a respective data line of a plurality of data lines DL, and a drain electrode connected to a source electrode of the driving transistor Td; a third transistor T3 having a gate electrode connected to the respective gate line, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a respective light emitting control signal line of a plurality of light emitting control signal lines em, a source electrode connected to a respective voltage supply line of a plurality of voltage supply lines Vdd, and a drain electrode connected to the source electrode of the driving transistor Td and the drain electrode of the second transistor T2; a fifth transistor T5 having a gate electrode connected to the respective light emitting control signal line, a source electrode connected to drain electrodes of the driving transistor Td and the third transistor T3, and a drain electrode connected to an anode of a light emitting element LE; and a sixth transistor T6 having a gate electrode connected to a respective reset control signal line rst(N+1) in a next adjacent stage of the plurality of reset control signal lines, a source electrode connected to a respective first reset signal line Vint1(N+1) in the next adjacent stage of the plurality of first reset signal lines, and a drain electrode connected to the drain electrode of the fifth transistor and the anode of the light emitting element LE. The second capacitor electrode Ce2 is connected to the respective voltage supply line and the source electrode of the fourth transistor T4.

Figure 2B:
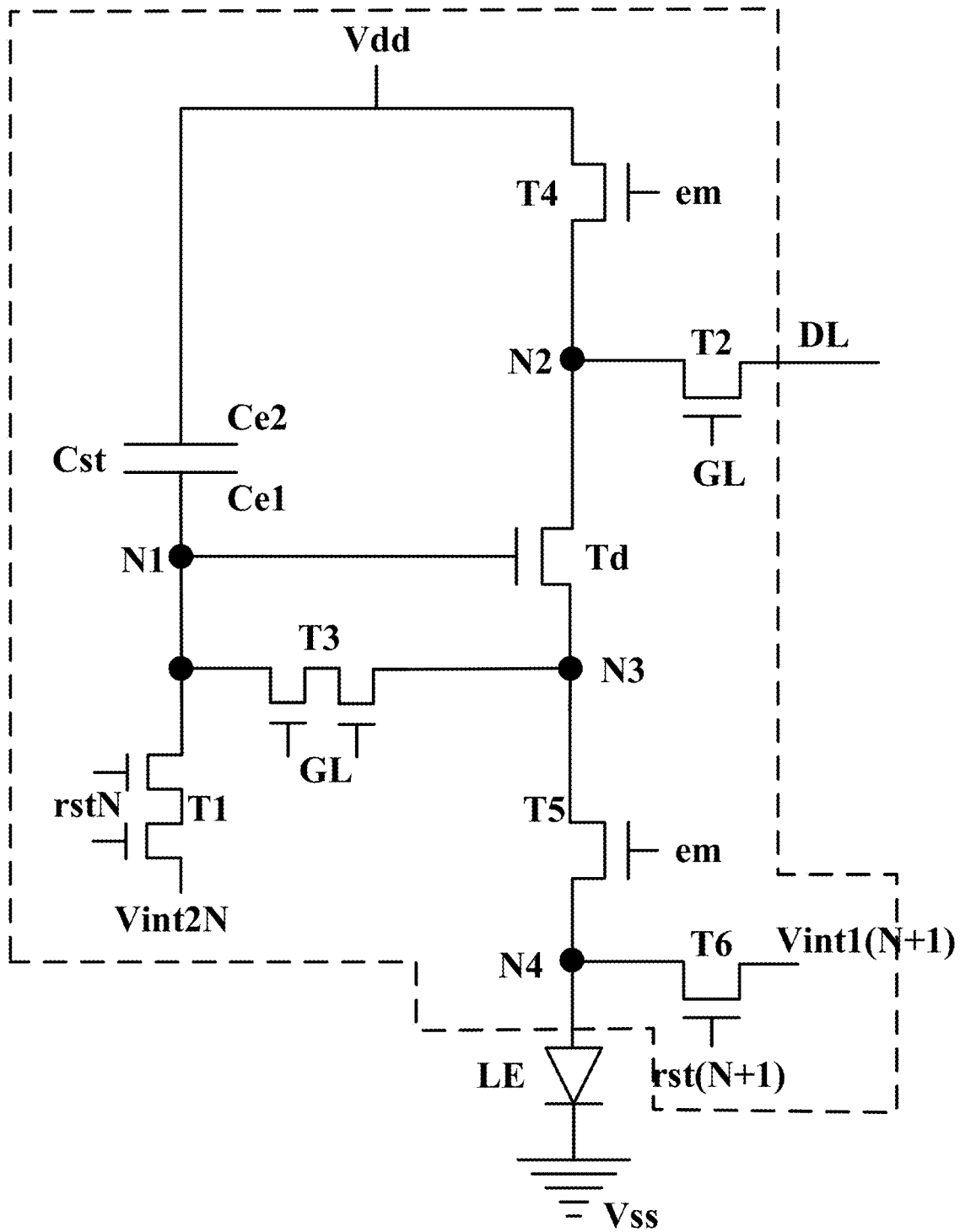
FIG. 2B is a circuit diagram illustrating the structure of a pixel driving circuit in some embodiments according to the present disclosure.

FIG. 2B is a circuit diagram illustrating the structure of a pixel driving circuit in some embodiments according to the present disclosure. Referring to FIG. 2B, in some embodiments, the third transistor T3 is a "double gate" transistor, and the first transistor T1 is a "double gate" transistor. Optionally, in a "double gate" first transistor, the active layer of the first transistor crosses over a respective reset control signal lines twice (alternatively, the respective reset control signal line crosses over the active layer of the first transistor T1 twice). Similarly, in a "double gate" third transistor, the active layer of the third transistor T3 crosses over a respective gate line of the plurality of gate lines GL twice (alternatively, the respective gate line crosses over the active layer of the third transistor T3 twice).

The pixel driving circuit further include a first node N1, a second node N2, a third node N3, and a fourth node N4. The first node N1 is connected to the gate electrode of the driving transistor Td, the first capacitor electrode Ce1, and the source electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Td, the drain electrode of the third transistor T3, and the source electrode of the fifth transistor T5. The fourth node N4 is connected to the drain electrode of the fifth transistor T5, the drain electrode of the sixth transistor T6, and the anode of the light emitting element LE.

Figure 2C:
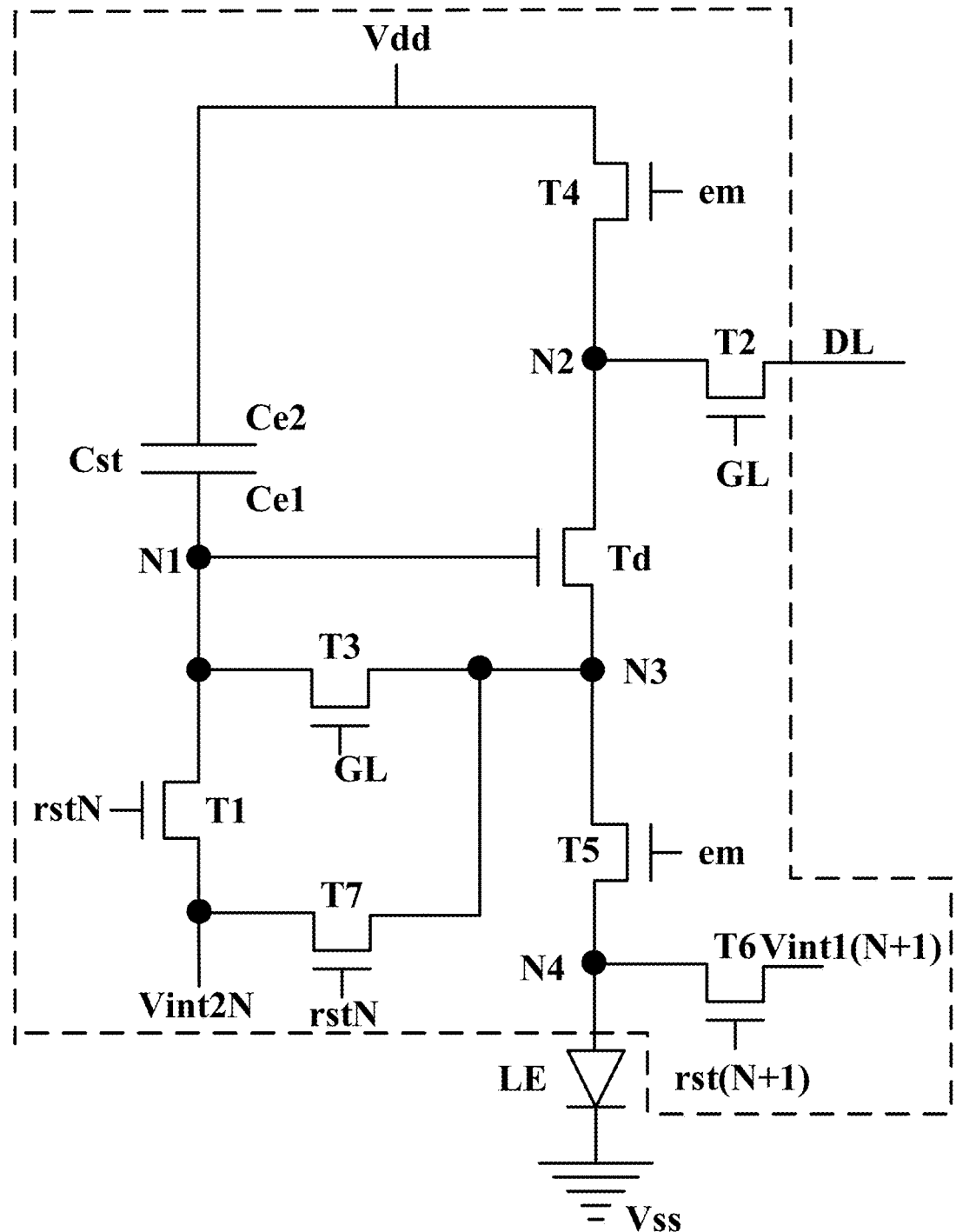
FIG. 2C is a circuit diagram illustrating the structure of a pixel driving circuit in some embodiments according to the present disclosure.

FIG. 2C is a circuit diagram illustrating the structure of a pixel driving circuit in some embodiments according to the present disclosure. Referring to FIG. 2C, in some embodiments, the respective pixel driving circuit includes a driving transistor Td; a storage capacitor Cst having a first capacitor electrode Ce1 and a second capacitor electrode Ce2; a first transistor T1 having a gate electrode connected to a respective reset control signal line rstN in a present stage of a plurality of reset control signal lines, a source electrode connected to a respective second reset signal line Vint2N in a present stage of a plurality of second reset signal lines, and a drain electrode connected to a first capacitor electrode Ce1 of the storage capacitor Cst and a gate electrode of the driving transistor Td; a second transistor T2 having a gate electrode connected to a respective gate line of a plurality of gate lines GL, a source electrode connected to a respective data line of a plurality of data lines DL, and a drain electrode connected to a source electrode of the driving transistor Td; a third transistor T3 having a gate electrode connected to the respective gate line, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a respective light emitting control signal line of a plurality of light emitting control signal lines em, a source electrode connected to a respective voltage supply line of a plurality of voltage supply lines Vdd, and a drain electrode connected to the source electrode of the driving transistor Td and the drain electrode of the second transistor T2; a fifth transistor T5 having a gate electrode connected to the respective light emitting control signal line, a source electrode connected to drain electrodes of the driving transistor Td and the third transistor T3, and a drain electrode connected to an anode of a light emitting element LE; a sixth transistor T6 having a gate electrode connected to a respective reset control signal line rst(N+1) in a next adjacent stage of the plurality of reset control signal lines, a source electrode connected to a respective first reset signal line Vint1(N+1) in the next adjacent stage of the plurality of first reset signal lines, and a drain electrode connected to the drain electrode of the fifth transistor and the anode of the light emitting element LE; and a seventh transistor T7 having a gate electrode connected to the respective reset control signal line rstN in a present stage of a plurality of reset control signal lines, a source electrode connected to the respective second reset signal line Vint2N in a present stage of a plurality of second reset signal lines, and a drain electrode connected to the drain electrode of the driving transistor Td. The second capacitor electrode Ce2 is connected to the respective voltage supply line and the source electrode of the fourth transistor T4. By having the seventh transistor T7 connected to the third node N3, the seventh transistor T7 is turned on during a reset stage, resetting the voltage level at the third node N3. This ensures that the voltage levels at third nodes of all subpixels are uniform at the time prior to a data write stage.

Figure 2D:
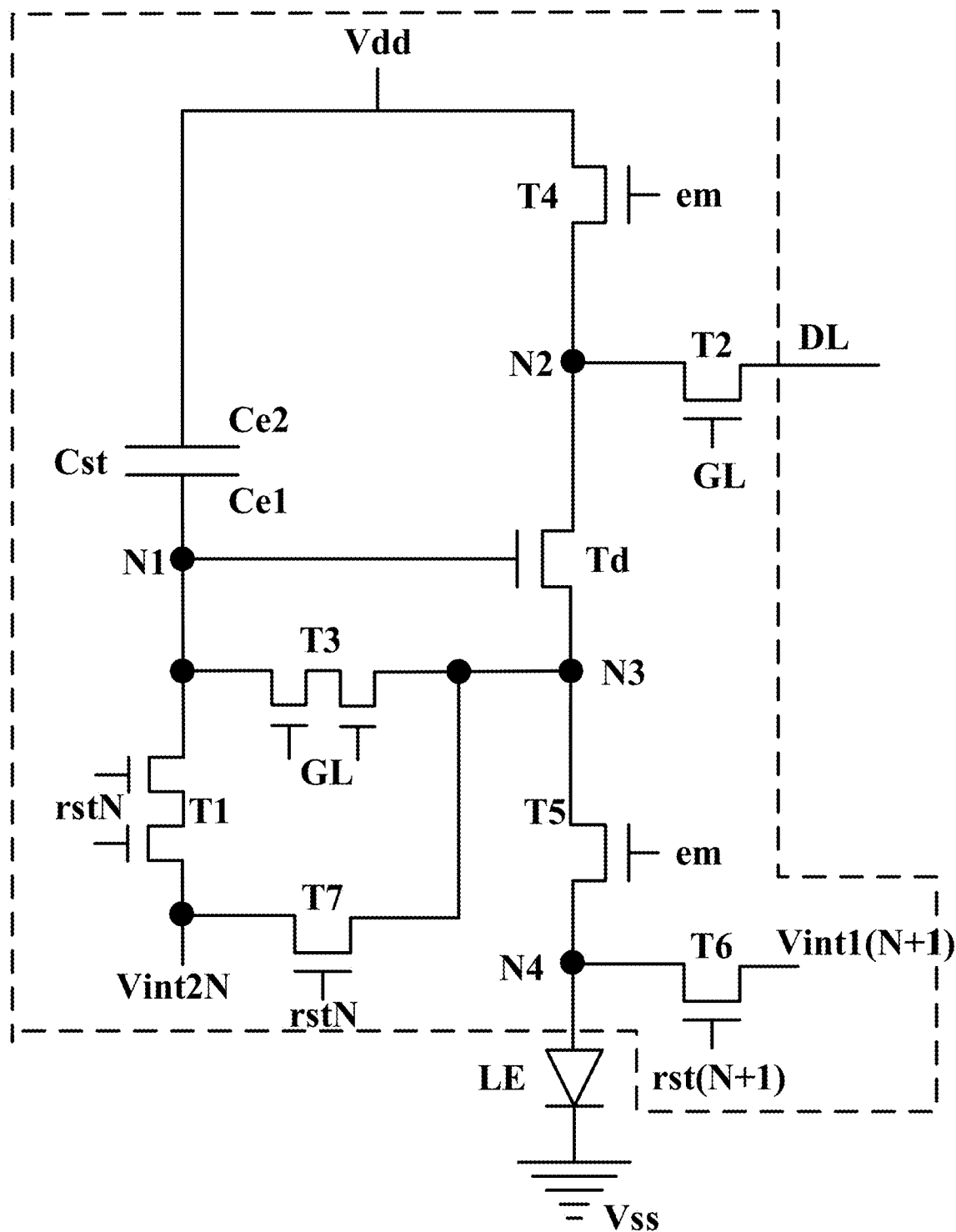
FIG. 2D is a circuit diagram illustrating the structure of a pixel driving circuit in some embodiments according to the present disclosure.

FIG. 2D is a circuit diagram illustrating the structure of a pixel driving circuit in some embodiments according to the present disclosure. Referring to FIG. 2D, in some embodiments, the third transistor T3 is a "double gate" transistor, and the first transistor T1 is a "double gate" transistor. Optionally, in a "double gate" first transistor, the active layer of the first transistor crosses over a respective reset control signal lines twice (alternatively, the respective reset control signal line crosses over the active layer of the first transistor T1 twice). Similarly, in a "double gate" third transistor, the active layer of the third transistor T3 crosses over a respective gate line of the plurality of gate lines GL twice (alternatively, the respective gate line crosses over the active layer of the third transistor T3 twice).

The pixel driving circuit further include a first node N1, a second node N2, a third node N3, and a fourth node N4. The first node N1 is connected to the gate electrode of the driving transistor Td, the first capacitor electrode Ce1, and the source electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Td, the drain electrode of the third transistor T3, the drain electrode of the seventh transistor T7, and the source electrode of the fifth transistor T5. The fourth node N4 is connected to the drain electrode of the fifth transistor T5, the drain electrode of the sixth transistor T6, and the anode of the light emitting element LE.

Figure 2E:
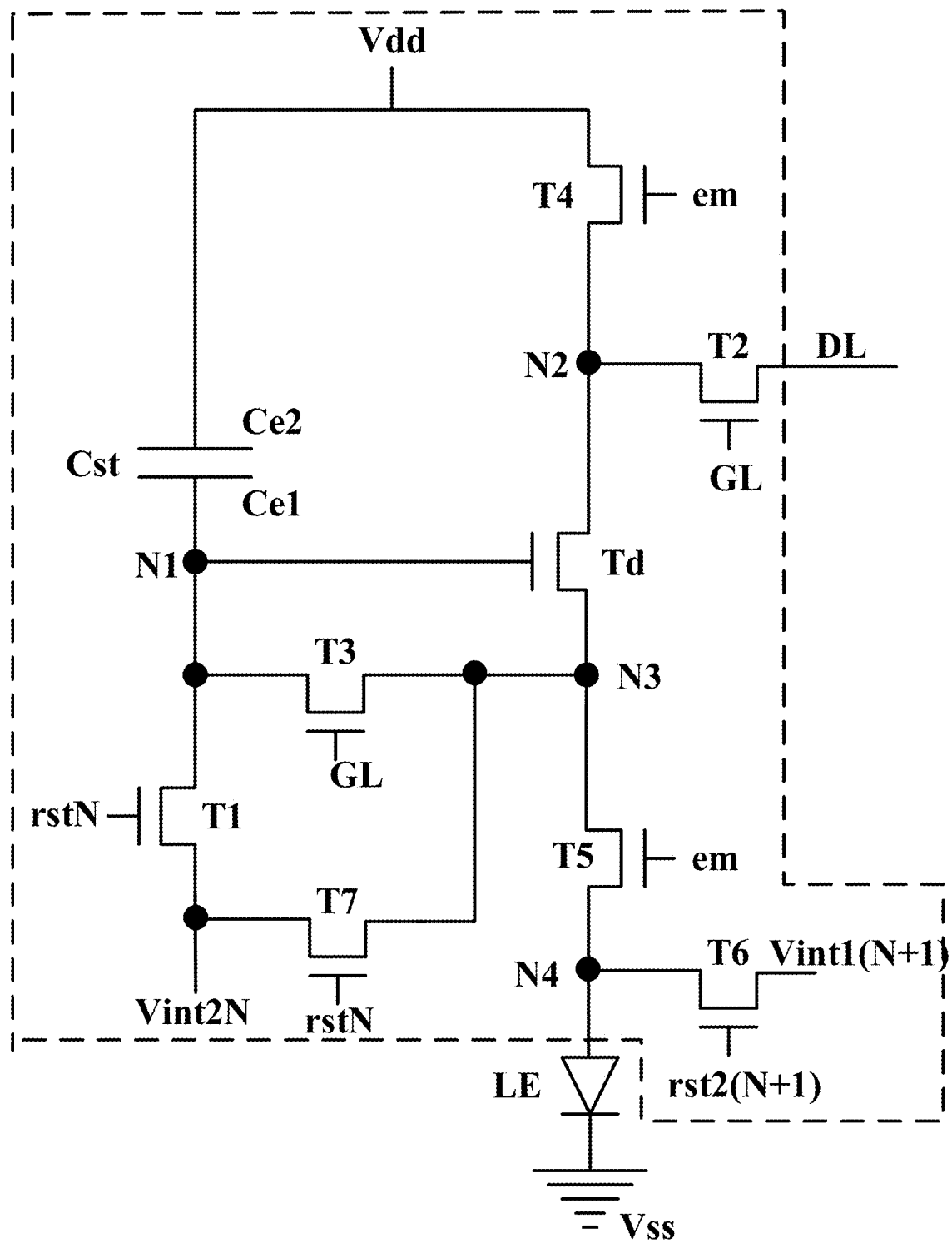
FIG. 2E is a circuit diagram illustrating the structure of a pixel driving circuit in some embodiments according to the present disclosure.

FIG. 2E is a circuit diagram illustrating the structure of a pixel driving circuit in some embodiments according to the present disclosure. Referring to FIG. 2E, in some embodiments, the respective pixel driving circuit includes a driving transistor Td; a storage capacitor Cst having a first capacitor electrode Ce1 and a second capacitor electrode Ce2; a first transistor T1 having a gate electrode connected to a respective reset control signal line rstN in a present stage of a plurality of reset control signal lines, a source electrode connected to a respective second reset signal line Vint2N in a present stage of a plurality of second reset signal lines, and a drain electrode connected to a first capacitor electrode Ce1 of the storage capacitor Cst and a gate electrode of the driving transistor Td; a second transistor T2 having a gate electrode connected to a respective gate line of a plurality of gate lines GL, a source electrode connected to a respective data line of a plurality of data lines DL, and a drain electrode connected to a source electrode of the driving transistor Td; a third transistor T3 having a gate electrode connected to the respective gate line, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a respective light emitting control signal line of a plurality of light emitting control signal lines em, a source electrode connected to a respective voltage supply line of a plurality of voltage supply lines Vdd, and a drain electrode connected to the source electrode of the driving transistor Td and the drain electrode of the second transistor T2; a fifth transistor T5 having a gate electrode connected to the respective light emitting control signal line, a source electrode connected to drain electrodes of the driving transistor Td and the third transistor T3, and a drain electrode connected to an anode of a light emitting element LE; a sixth transistor T6 having a gate electrode connected to a respective second reset control signal line rst2(N+1) in a next adjacent stage of a plurality of second reset control signal lines, a source electrode connected to a respective first reset signal line Vint1(N+1) in the next adjacent stage of the plurality of first reset signal lines, and a drain electrode connected to the drain electrode of the fifth transistor and the anode of the light emitting element LE; and a seventh transistor T7 having a gate electrode connected to the respective reset control signal line rstN in a present stage of a plurality of reset control signal lines, a source electrode connected to the respective second reset signal line Vint2N in a present stage of a plurality of second reset signal lines, and a drain electrode connected to the drain electrode of the driving transistor Td. The second capacitor electrode Ce2 is connected to the respective voltage supply line and the source electrode of the fourth transistor T4. By having the seventh transistor T7 connected to the third node N3, the seventh transistor T7 is turned on during a reset stage, resetting the voltage level at the third node N3. This ensures that the voltage levels at third nodes of all subpixels are uniform at the time prior to a data write stage.

Figure 2F:
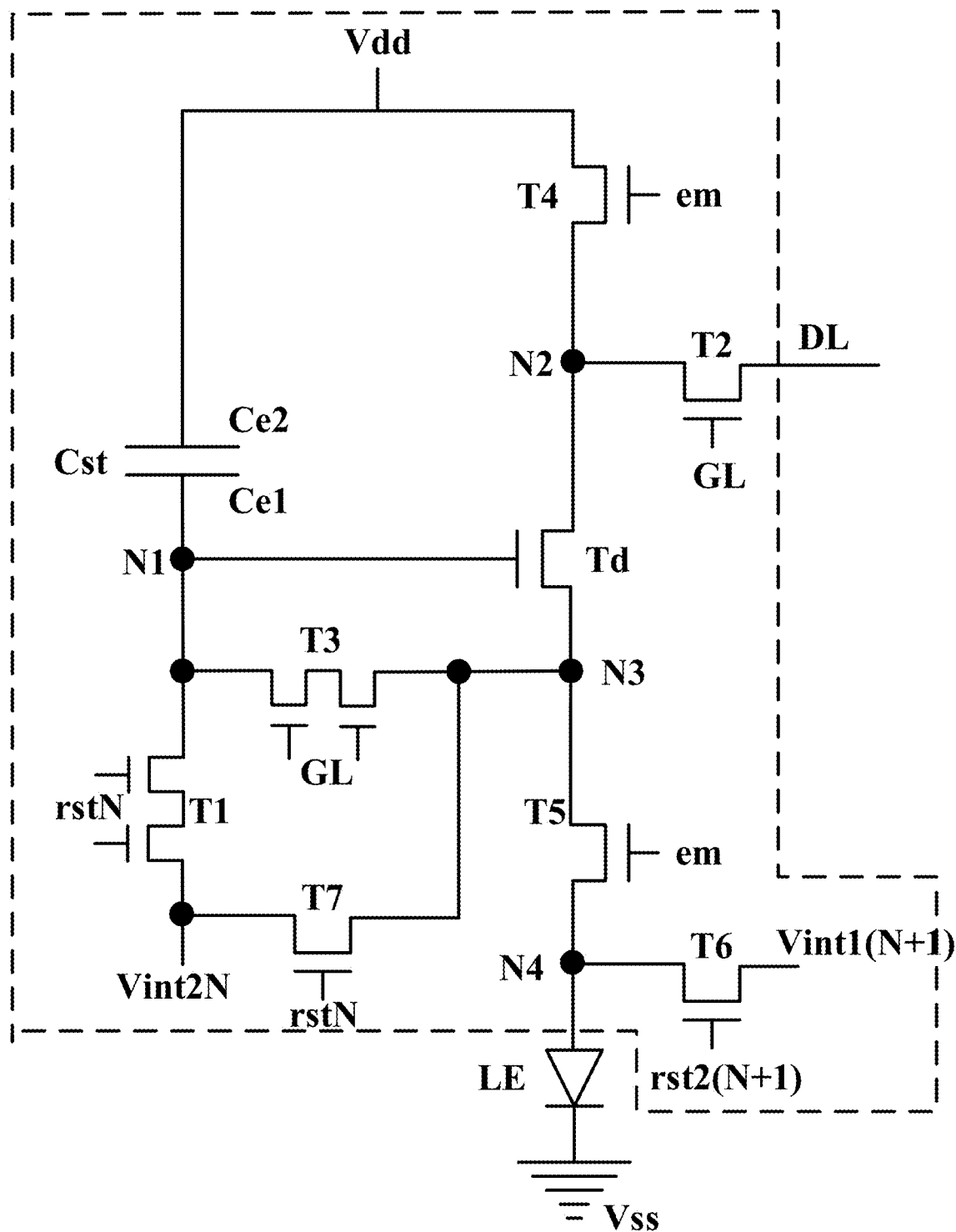
FIG. 2F is a circuit diagram illustrating the structure of a pixel driving circuit in some embodiments according to the present disclosure.

FIG. 2F is a circuit diagram illustrating the structure of a pixel driving circuit in some embodiments according to the present disclosure. Referring to FIG. 2F, in some embodiments, the third transistor T3 is a "double gate" transistor, and the first transistor T1 is a "double gate" transistor. Optionally, in a "double gate" first transistor, the active layer of the first transistor crosses over a respective reset control signal lines twice (alternatively, the respective reset control signal line crosses over the active layer of the first transistor T1 twice). Similarly, in a "double gate" third transistor, the active layer of the third transistor T3 crosses over a respective gate line of the plurality of gate lines GL twice (alternatively, the respective gate line crosses over the active layer of the third transistor T3 twice).

The pixel driving circuit further include a first node N1, a second node N2, a third node N3, and a fourth node N4. The first node N1 is connected to the gate electrode of the driving transistor Td, the first capacitor electrode Ce1, and the source electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Td, the drain electrode of the third transistor T3, the drain electrode of the seventh transistor T7, and the source electrode of the fifth transistor T5. The fourth node N4 is connected to the drain electrode of the fifth transistor T5, the drain electrode of the sixth transistor T6, and the anode of the light emitting element LE.

As used herein, a source electrode or a drain electrode refers to one of a first terminal and a second terminal of a transistor, the first terminal and the second terminal being connected to an active layer of the transistor. A direction of a current flowing through the transistor may be configured to be from a source electrode to a drain electrode, or from a drain electrode to a source electrode. Accordingly, depending on the direction of the current flowing through the transistor, in one example, the source electrode is configured to receive an input signal and the drain electrode is configured to output an output signal; in another example, the drain electrode is configured to receive an input signal and the source electrode is configured to output an output signal.

Figure 3A:
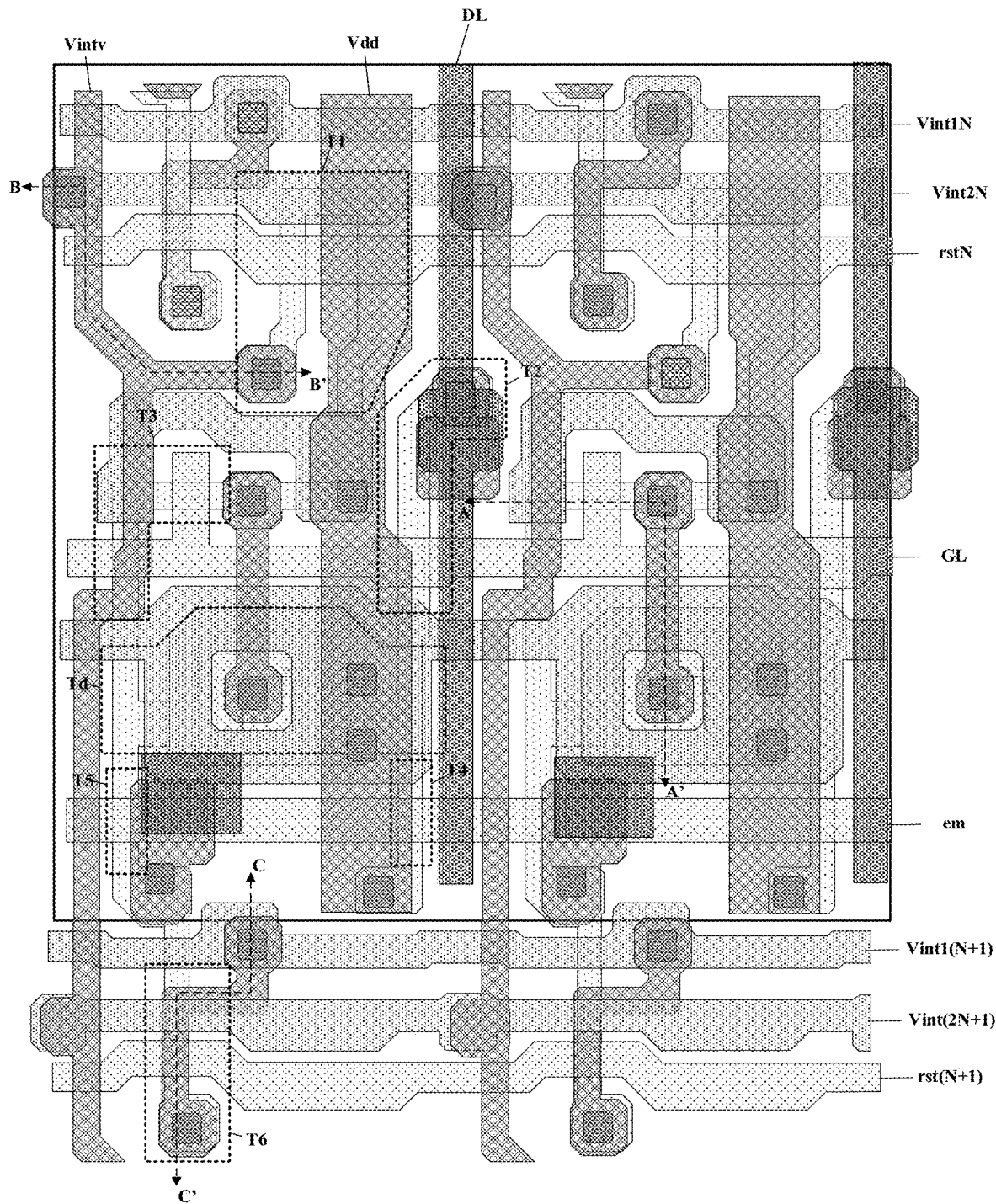
FIG. 3A is a diagram illustrating the structure of an array substrate in some embodiments according to the present disclosure.
Figure 3B:
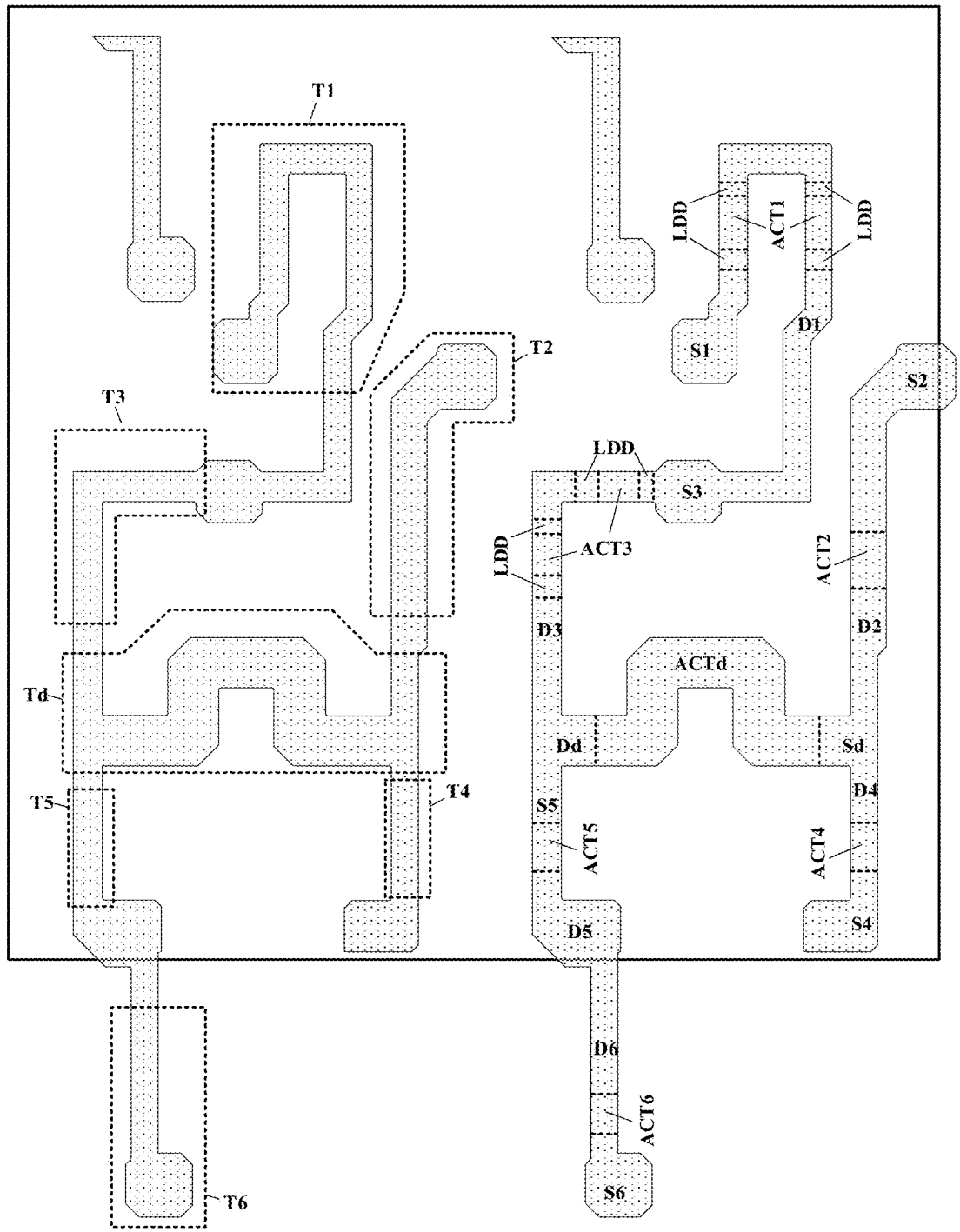
FIG. 3B is a diagram illustrating the structure of a semiconductor material layer in an array substrate depicted in FIG. 3A.
Figure 3C:
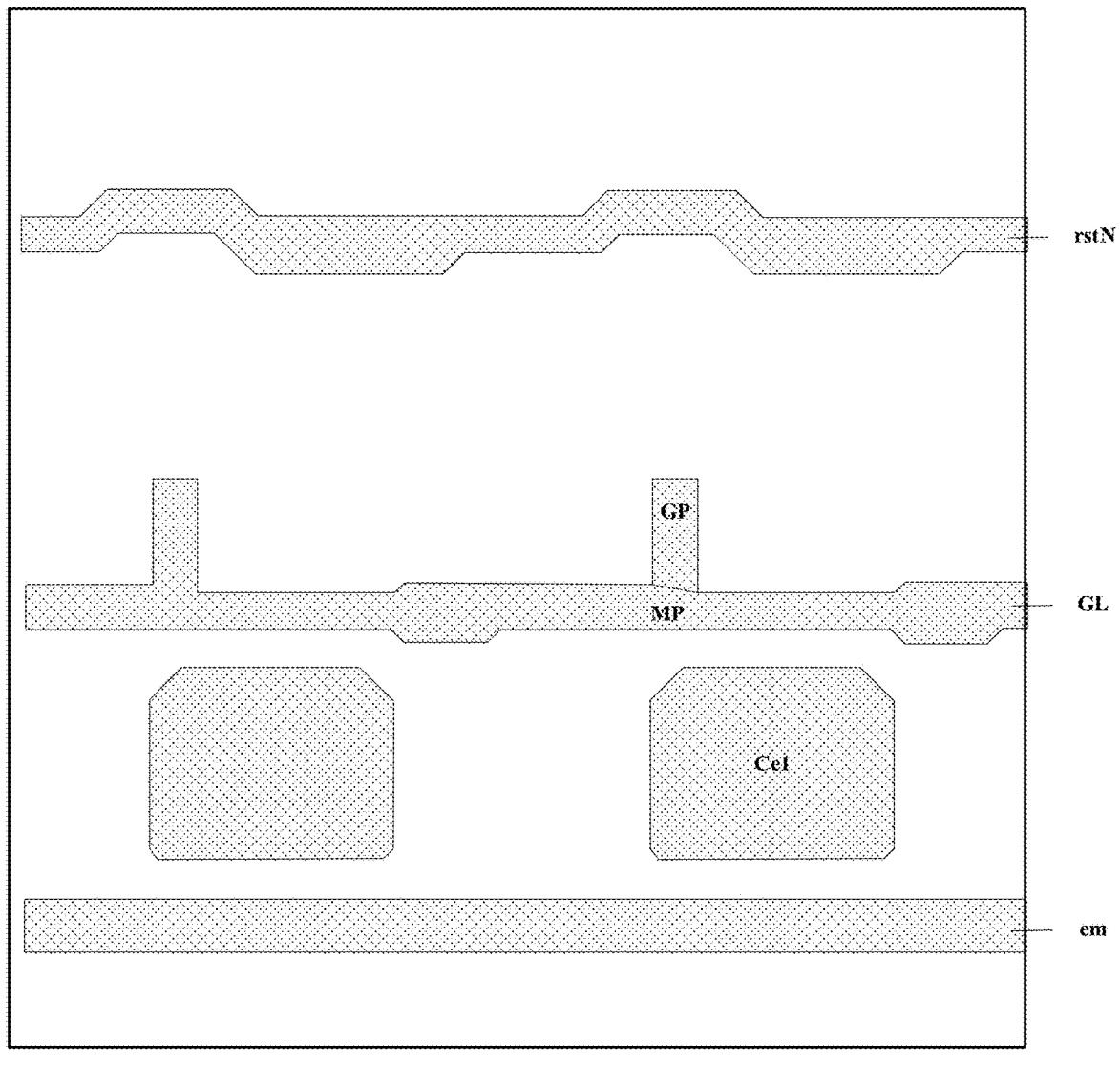
FIG. 3C is a diagram illustrating the structure of a first conductive layer in an array substrate depicted in FIG. 3A.
Figure 3C:
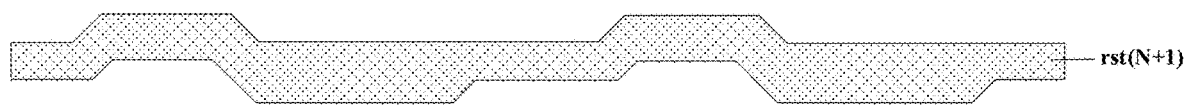
Figure 3D:
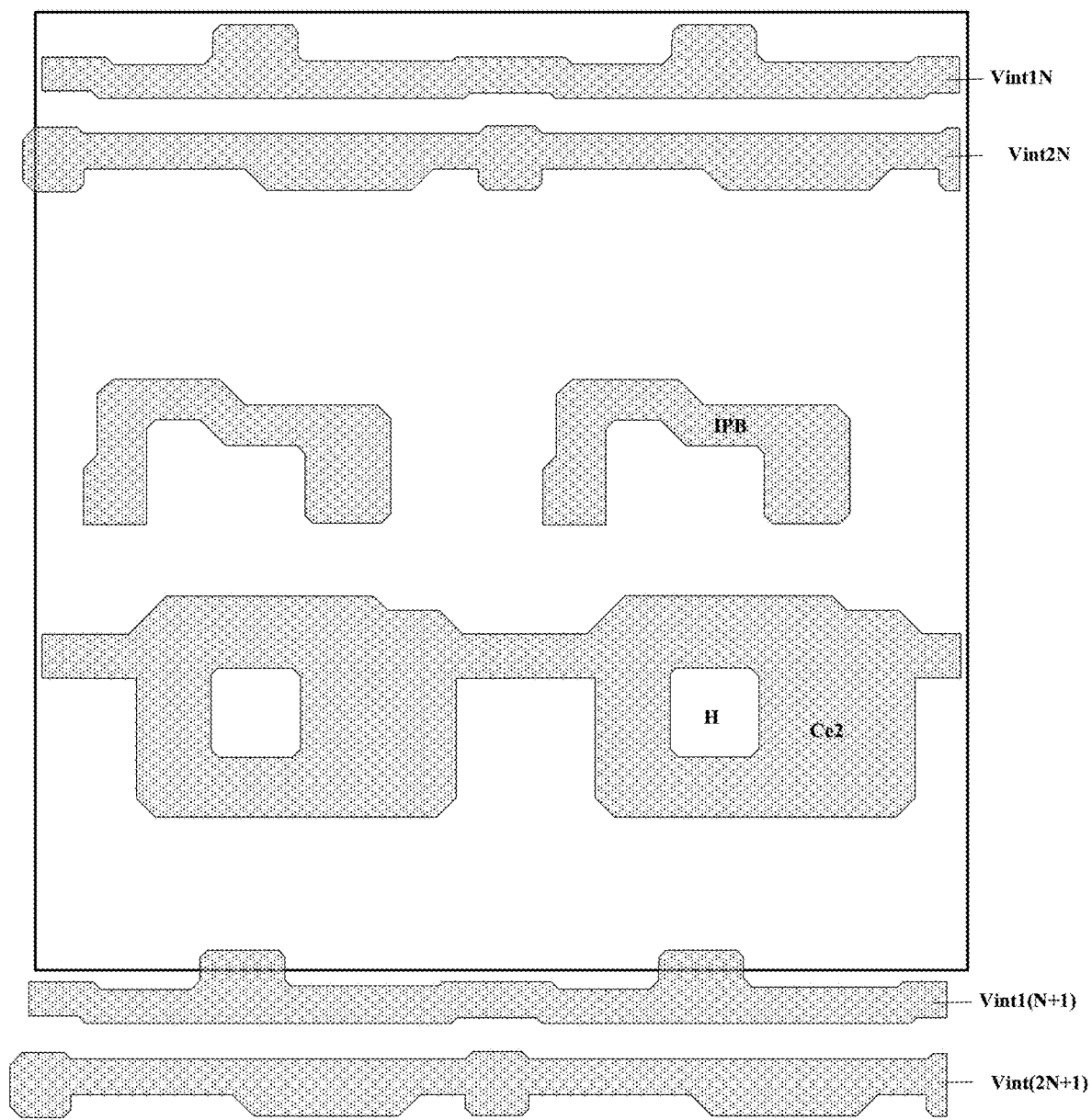
FIG. 3D is a diagram illustrating the structure of a second conductive layer in an array substrate depicted in FIG. 3A.
Figure 3E:
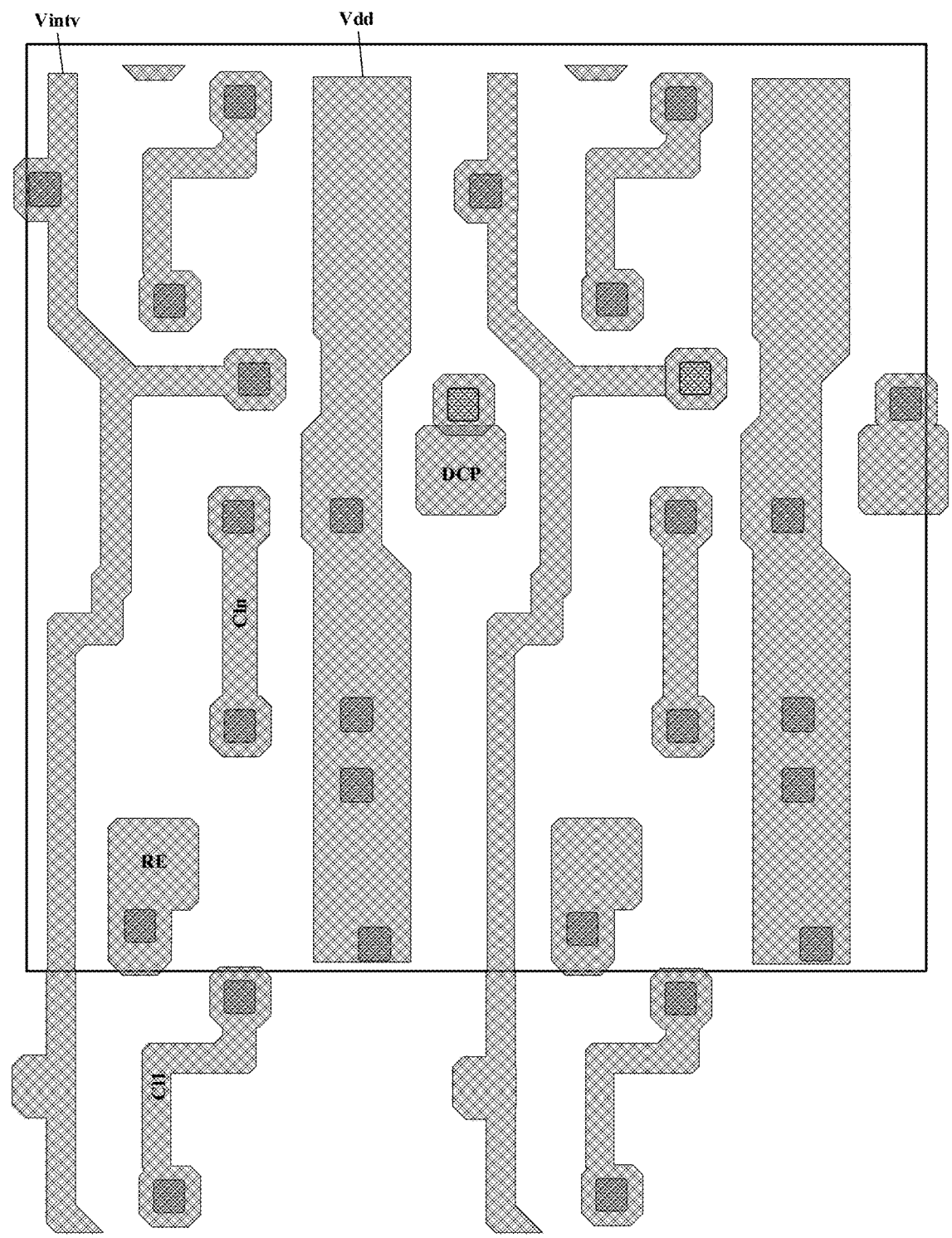
FIG. 3E is a diagram illustrating the structure of a first signal line layer in an array substrate depicted in FIG. 3A.
Figure 3F:
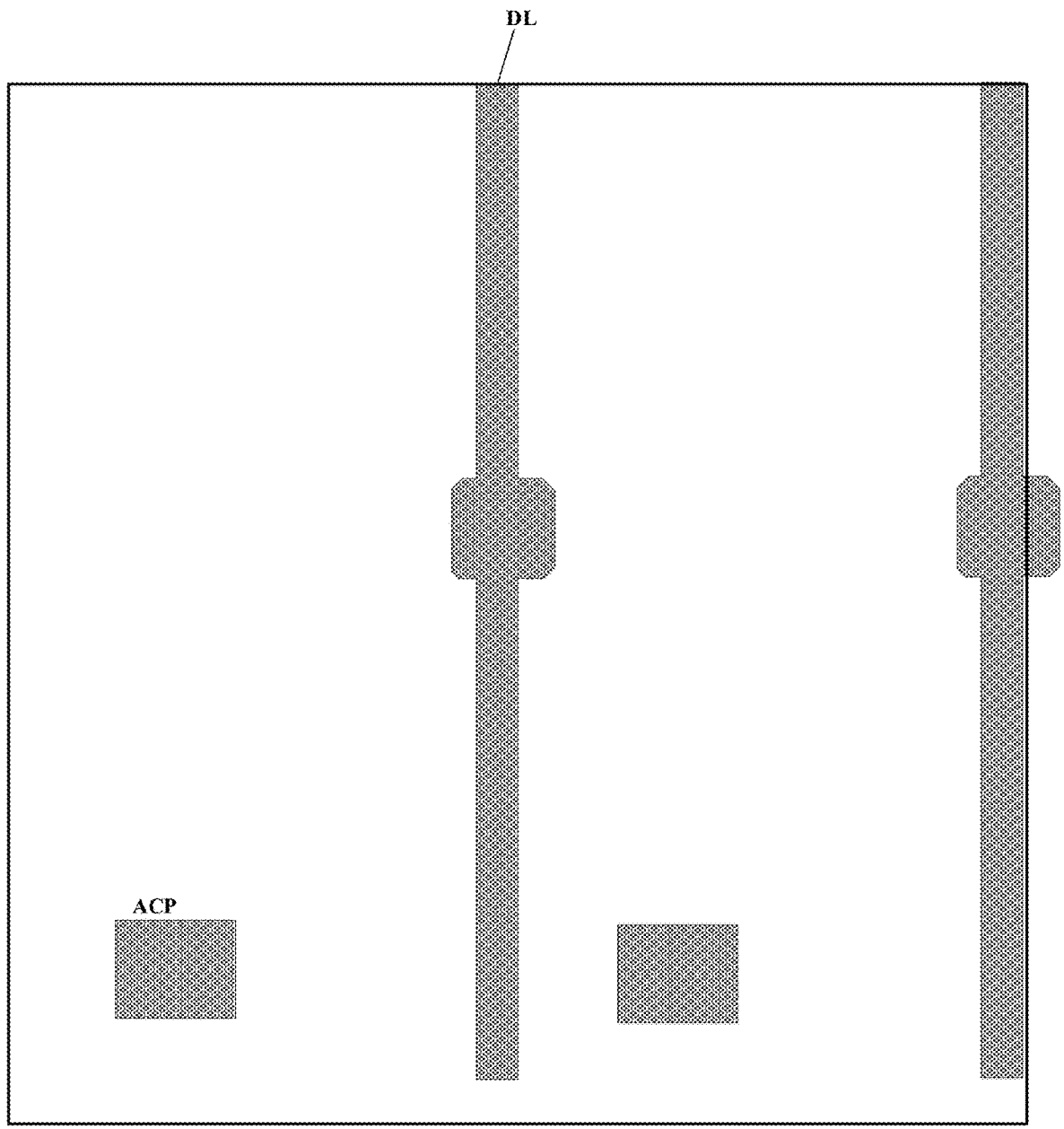
FIG. 3F is a diagram illustrating the structure of a second signal line layer in an array substrate depicted in FIG. 3A.
Figure 3G:
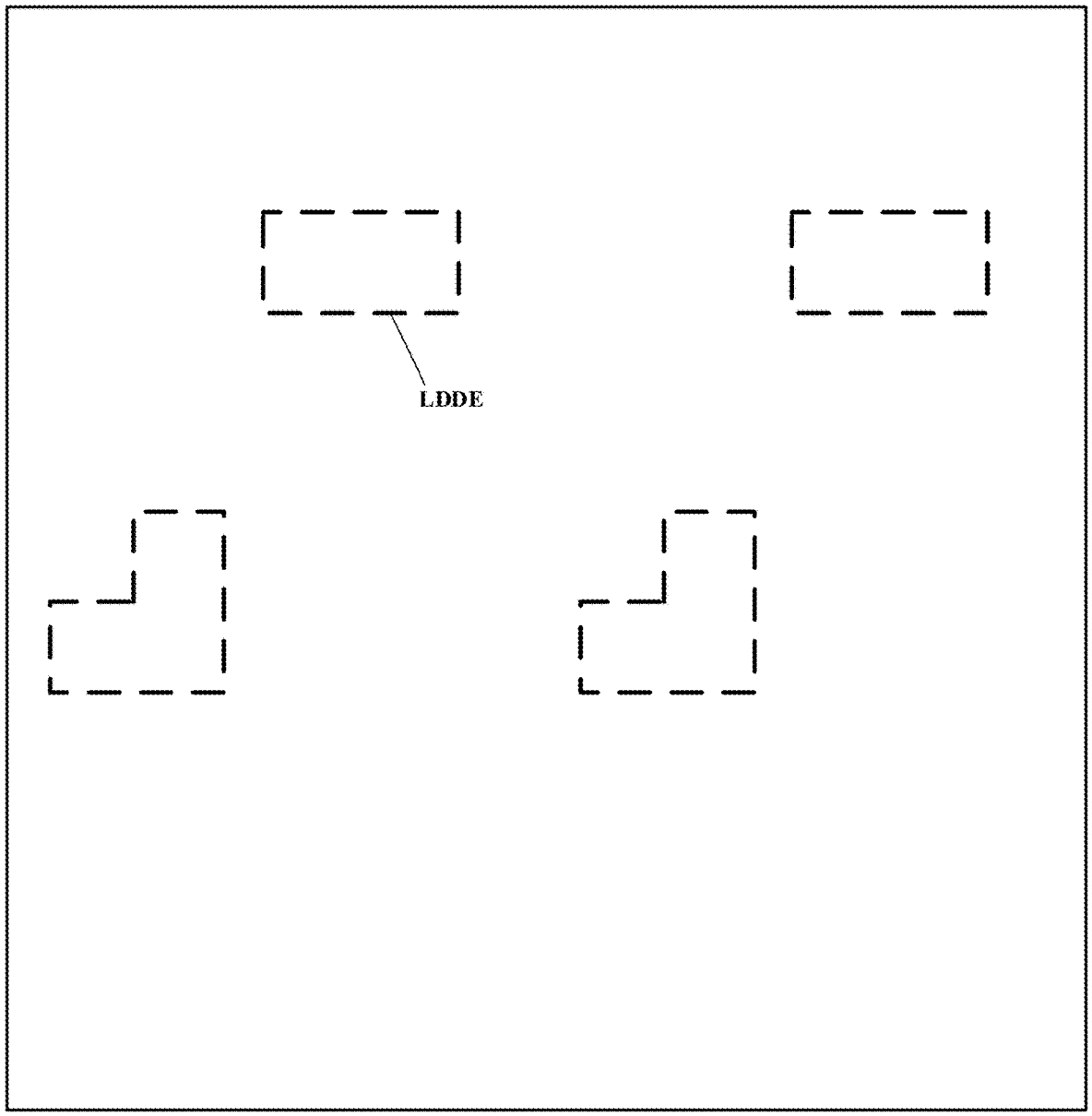
FIG. 3G is a diagram illustrating light doped drain (LDD) exposure regions in a process of fabricating an array substrate depicted in FIG. 3A.
Figure 3H:
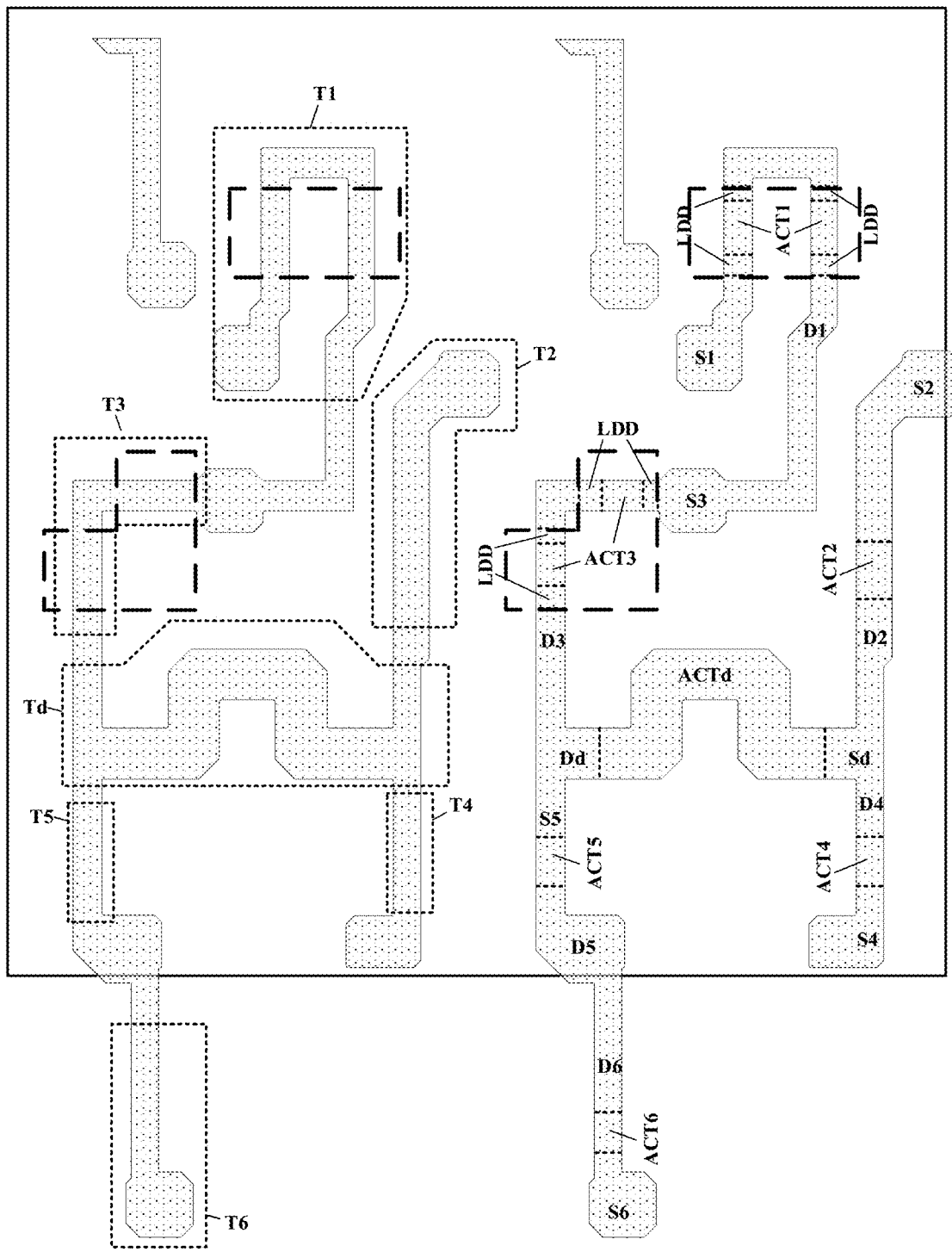
FIG. 3H shows a superimposition of the illustrating light doped drain (LDD) exposure regions and the semiconductor material layer in an array substrate depicted in FIG. 3A.
Figure 4A:
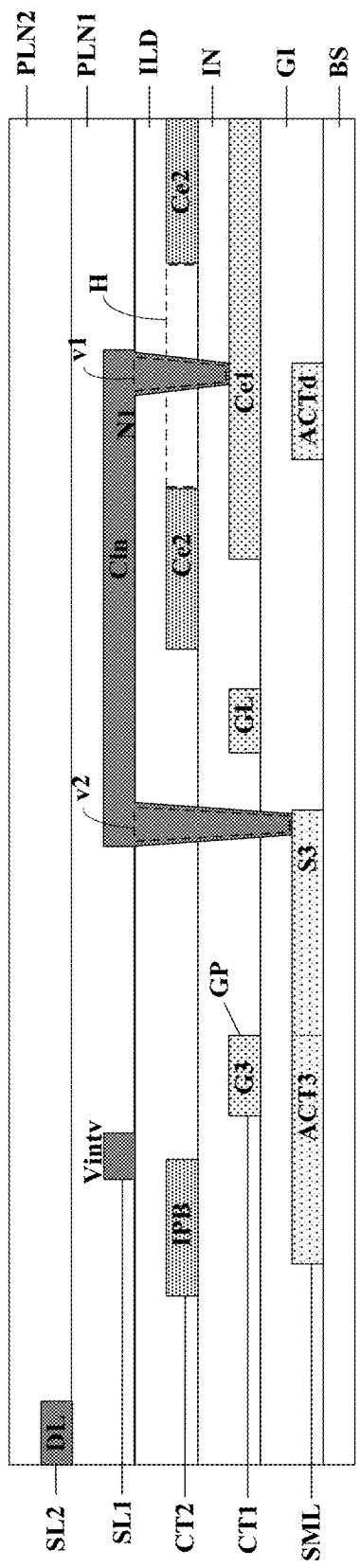
FIG. 4A is a cross-sectional view along an A-A' line in FIG. 3A.

FIG. 3A is a diagram illustrating the structure of an array substrate in some embodiments according to the present disclosure. FIG. 3B is a diagram illustrating the structure of a semiconductor material layer in an array substrate depicted in FIG. 3A. FIG. 3C is a diagram illustrating the structure of a first conductive layer in an array substrate depicted in FIG. 3A. FIG. 3D is a diagram illustrating the structure of a second conductive layer in an array substrate depicted in FIG. 3A. FIG. 3E is a diagram illustrating the structure of a first signal line layer in an array substrate depicted in FIG. 3A. FIG. 3F is a diagram illustrating the structure of a second signal line layer in an array substrate depicted in FIG. 3A. FIG. 3G is a diagram illustrating light doped drain (LDD) exposure regions in a process of fabricating an array substrate depicted in FIG. 3A. FIG. 3H shows a superimposition of the illustrating light doped drain (LDD) exposure regions and the semiconductor material layer in an array substrate depicted in FIG. 3A. FIG. 4A is a cross-sectional view along an A-A' line in FIG. 3A. The respective pixel driving circuit depicted in FIG. 3A to FIG. 3H, and FIG. 4A to FIG. 4C, corresponds to the pixel driving circuit depicted in FIG. 2A or FIG. 2B.

Referring to FIG. 3A to FIG. 3H, and FIG. 4A, in some embodiments, the array substrate includes a base substrate BS, a semiconductor material layer SML on the base substrate BS, a gate insulating layer GI on a side of the semiconductor material layer SML away from the base substrate BS, a first conductive layer CT1 on a side of the gate insulating layer GI away from the semiconductor material layer SML, an insulating layer IN on a side of the first conductive layer away from the gate insulating layer GI, a second conductive layer CT2 on a side of the insulating layer IN away from the first conductive layer CT1, an inter-layer dielectric layer ILD on a side of the second conductive layer CT2 away from the insulating layer IN, a first signal line layer SL1 on a side of the inter-layer dielectric layer ILD away from the second conductive layer CT2, a first planarization layer PLN1 on a side of the first signal line layer SL1 away from the inter-layer dielectric layer ILD, a second signal line layer SL2 on a side of the first planarization layer PLN1 away from the first signal line layer SL1, and a second planarization layer PLN2 on a side of the second signal line layer SL2 away from the first planarization layer PLN1.

Referring to FIG. 2A, FIG. 2B, FIG. 3A, and FIG. 3B, a respective pixel driving circuit is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, and the driving transistor Td. The respective pixel driving circuit is further annotated with labels indicating components of each of the plurality of transistors in the pixel driving circuit. For example, the first transistor T1 includes an active layer ACT1, a source electrode S1, and a drain electrode D1. The second transistor T2 includes an active layer ACT2, a source electrode S2, and a drain electrode D2. The third transistor T3 includes an active layer ACT3, a source electrode S3, and a drain electrode D3. The fourth transistor T4 includes an active layer ACT4, a source electrode S4, and a drain electrode D4. The fifth transistor T5 includes an active layer ACT5, a source electrode S5, and a drain electrode D5. The sixth transistor T6 includes an active layer ACT6, a source electrode S6, and a drain electrode D6. The driving transistor Td includes an active layer ACTd, a source electrode Sd, and a drain electrode Dd. In one example, the active layers (ACT1, ACT2, ACT3, ACT4, ACT5, ACT6, and ACTd) of the transistors (T1, T2, T3, T4, T5, T6, and Td) in the respective pixel driving circuit are parts of a unitary structure. In another example, the active layers (ACT1, ACT2, ACT3, ACT4, ACT5, ACT6, and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) in the respective pixel driving circuit are parts of a unitary structure. In another example, the active layers (ACT1, ACT2, ACT3, ACT4, ACT5, ACT6, and ACTd) of the transistors (T1, T2, T3, T4, T5, T6, and Td) are in a same layer. In another example, the active layers (ACT1, ACT2, ACT3, ACT4, ACT5, ACT6, and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) are in a same layer.

As used herein, the active layer refers to a component of the transistor comprising at least a portion of the semiconductor material layer whose orthographic projection on the base substrate overlaps with an orthographic projection of a gate electrode on the base substrate. A source electrode is a component of the transistor connected to one side of the active layer, and a drain electrode is a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, and a second portion of the semiconductor material layer whose orthographic projection on the base substrate overlaps with an orthographic projection of a second gate on the base substrate. Optionally, the semiconductor material layer further includes a third portion connecting the first portion and the second portion. In the context of a double-gate type transistor, a source electrode refers to a component of the transistor connected to a side of the first portion distal to the third portion, and a drain electrode refers to a component of the transistor connected to a side of the second portion distal to the third portion.

Referring to FIG. 2A, FIG. 2B, FIG. 3A, and FIG. 3C, the first conductive layer in some embodiments includes a plurality of gate lines GL, a plurality of reset control signal lines (including a respective reset control signal line of a present stage rstN and a reset control signal line of a next stage rst(N+1)), a plurality of light emitting control signal lines em, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of gate lines GL, the plurality of reset control signal lines, the plurality of light emitting control signal lines em, and the first capacitor electrode Ce1 are in a same layer.

As used herein, the term "same layer" refers to the relationship between the layers simultaneously formed in the same step. In one example, the plurality of gate lines GL and the first capacitor electrode Ce1 are in a same layer when they are formed as a result of one or more steps of a same patterning process performed in a same layer of material. In another example, the plurality of gate lines GL and the first capacitor electrode Ce1 can be formed in a same layer by simultaneously performing the step of forming the plurality of gate lines GL, and the step of forming the first capacitor electrode Ce1. The term "same layer" does not always mean that the thickness of the layer or the height of the layer in a cross-sectional view is the same.

In some embodiments, in a respective pixel driving circuit, a respective gate line of the plurality of gate lines GL includes a main portion MP extending along an extension direction of the respective gate line, and a gate protrusion GP protruding away from the main portion MP, e.g., along a direction from the respective gate line of the plurality of gate lines GL in a present stage toward the respective reset control signal line rstN in the present stage.

In some embodiments, as discussed above, the third transistor T3 is a double gate transistor. In some embodiments, the gate protrusion GP comprises one of the double gates in the third transistor T3. In some embodiments, and referring to FIG. 4A, an orthographic projection of the gate protrusion GP on the base substrate BS overlaps with an orthographic projection of the active layer ACT3 of the third transistor T3 on the base substrate BS.

Referring to FIG. 2A, FIG. 2B, FIG. 3A, and FIG. 3D, the second conductive layer in some embodiments includes a plurality of first reset signal lines (including a respective first reset signal line of a present stage Vint1N, and a respective first reset signal line of a next adjacent stage Vinit1(N+1)), a plurality of second reset signal lines (including a respective second reset signal line of a present stage Vint2N, and a respective second reset signal line of a next adjacent stage Vinit2(N+1)), an interference preventing block IPB and a second capacitor electrode Ce2 of the storage capacitor Cst. The interference preventing block IPB can effectively reduce the cross-talk, particularly vertical cross-talk between the N1 nodes of the adjacent pixel driving circuits. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first reset signal lines, the plurality of second reset signal lines, the second capacitor electrode Ce2, and the interference preventing block IPB are in a same layer.

Referring to FIG. 2A, FIG. 2B, FIG. 3A, and FIG. 3E, the first signal line layer in some embodiments includes a plurality of voltage supply lines Vdd, a node connecting line Cln, a first connecting line C11, a relay electrode RE, a data connecting pad DCP, a plurality of third reset signal lines Vintv. The node connecting line Cln connects the first capacitor electrode Ce1 and the source electrode of the third transistor T3 in a respective pixel driving circuit together. The first connecting line C11 connects a respective first reset signal line of the plurality of first reset signal lines (e.g., the respective first reset signal line of the next adjacent stage Vint1(N+1)) and the source electrode S6 of the sixth transistor T6 in a respective pixel driving circuit together. A respective third reset signal line of the plurality of third reset signal lines Vintv connects a respective second reset signal line of the plurality of second reset signal lines (e.g., the respective second reset signal line of the present stage Vint2N) and the source electrode S1 of the first transistor T1 in a respective pixel driving circuit together. The data connecting pad DCP connects a respective data line of a plurality of data lines and a source electrode of the second transistor T2 in a respective pixel driving circuit together.

The relay electrode RE connects a source electrode S5 of the fifth transistor T5 in the respective pixel driving circuit to an anode contact pad in the respective pixel driving circuit, which in turn is connected to an anode in a respective subpixel.

Various appropriate conductive materials and various appropriate fabricating methods may be used to make the signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of voltage supply lines Vdd, the plurality of third reset signal lines Vintv, the node connecting line Cln, the first connecting line Cl1, the data connecting pad DCP, and the relay electrode RE are in a same layer.

Referring to Referring to FIG. 2A, FIG. 2B, FIG. 3A, and FIG. 3F, the second signal line layer in some embodiments includes a plurality of data line DL and an anode contact pad ACP. The anode contact pad ACP is electrically connected to a source electrode of the fifth transistor T5 in the respective pixel driving circuit through a relay electrode. The anode contact pad ACP is electrically connected to an anode in a respective subpixel.

Referring FIG. 3G and FIG. 3H, a plurality of lightly doped drain exposure regions LDDE are illustrated. Referring to FIG. 3B and FIG. 3H, a plurality of lightly doped drain regions LDD are depicted in FIG. 3H. The plurality of lightly doped drain regions LDD are formed in double-gate transistors, e.g., the first transistor T1 and the third transistor T3. In each of the channel parts of a double-gate transistor, two lightly doped drain regions are formed on both sides of a respective channel part, and the plurality of lightly doped drain regions LDD are not subject to p+ doping. The plurality of lightly doped drain regions LDD have a relatively higher resistances as compared to those in remaining portions of the drain electrodes and source electrodes. By having the plurality of lightly doped drain regions LDD, current leakage issues in the double-gate transistors can be effectively obviated, improving the low-frequency flicker in the array substrate.

Referring to FIG. 2A, FIG. 2B, FIG. 3A, FIG. 3E, and FIG. 4A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the first signal line layer includes a node connecting line Cln on a side of the inter-layer dielectric layer ILD away from the second capacitor electrode Ce2. The node connecting line Cln is in a same layer as the plurality of voltage supply lines Vdd. Optionally, the array substrate further includes a first via v1 in the hole region H and extending through the inter-layer dielectric layer ILD and the insulating layer IN. Optionally, the node connecting line Cln is connected to the first capacitor electrode Ce1 through the first via v1. In some embodiments, the first capacitor electrode Ce1 is on a side of the gate insulating layer GI away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the node connecting line Cln is connected to the first capacitor electrode Ce1 through the first via v1, and the node connecting line Cln is connected to the semiconductor material layer SML through the second via v2. Optionally, the node connecting line Cln is connected to the source electrode S3 of third transistor, as depicted in FIG. 4A.

Referring to Referring to FIG. 2A, FIG. 2B, FIG. 3A to FIG. 3H, and FIG. 4A, in some embodiments, the interference preventing block IPB is in a same layer as the second capacitor electrode Ce2. The respective voltage supply line of the plurality of voltage supply lines Vdd is connected to the interference preventing block IPB through a third via v3. Optionally, the third via v3 extends through the inter-layer dielectric layer ILD. Optionally, an orthographic projection of the interference preventing block IPB on the base substrate BS partially overlaps with an orthographic projection of the respective voltage supply line of the plurality of voltage supply lines Vdd on the base substrate BS. Optionally, the orthographic projection of the interference preventing block IPB on the base substrate BS at least partially overlaps with an orthographic projection of an active layer ACT3 of the third transistor T3 on the base substrate BS.

Figure 4B:
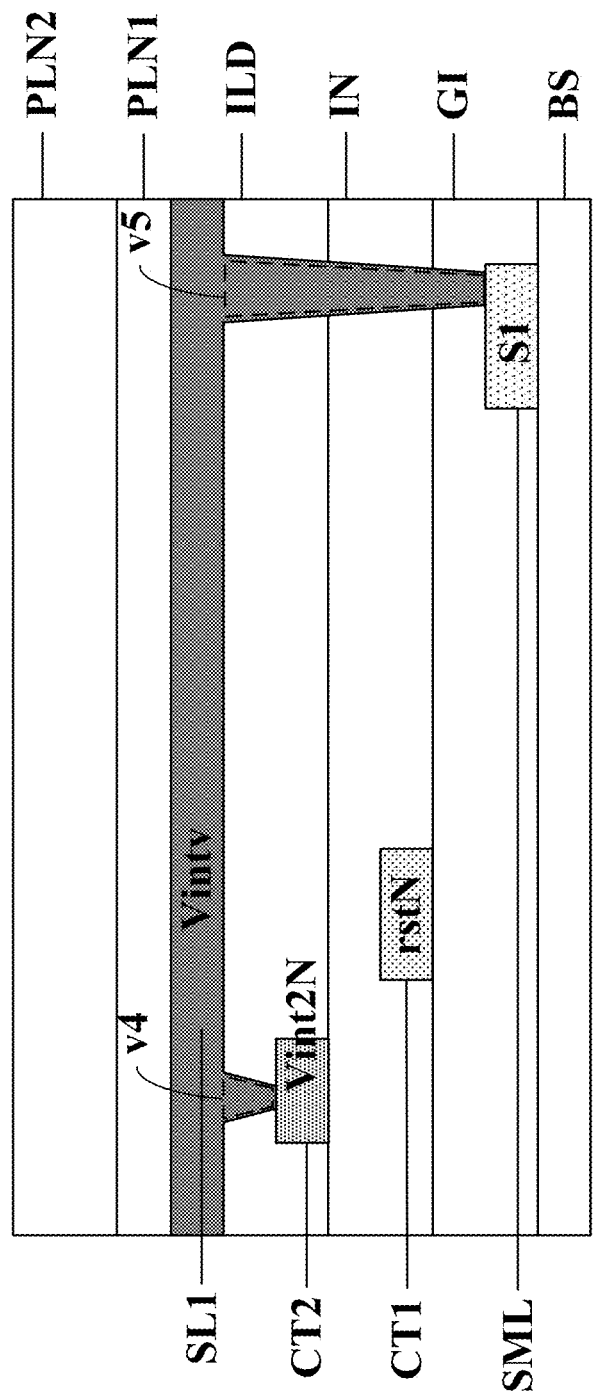
FIG. 4B is a cross-sectional view along a B-B' line in FIG. 3A.

FIG. 4B is a cross-sectional view along a B-B' line in FIG. 3A. Referring to FIG. 3A to FIG. 3H, and FIG. 4B, the respective third reset signal line of the plurality of third reset signal lines Vintv connects a respective second reset signal line of the plurality of second reset signal lines (e.g., the respective second reset signal line of the present stage Vint2N) and the source electrode S1 of the first transistor T1 in a respective pixel driving circuit together.

The respective second reset signal line of the plurality of second reset signal lines (e.g., the respective second reset signal line of the present stage Vint2N) is configured to provide a reset signal to the source electrode S1 of the first transistor T1 in the respective pixel driving circuit, through the respective third reset signal line of the plurality of third reset signal lines Vintv. Optionally, the respective third reset signal line is connected to the respective second reset signal line of the present stage Vint2N through a fourth via v4 extending through the inter-layer dielectric layer ILD. Optionally, the respective third reset signal line is connected to the source electrode S1 of the first transistor T1 in the respective pixel driving circuit through a fifth via v5 extending through the inter-layer dielectric layer ILD, the insulating layer IN, and the gate insulating layer GI.

Figure 4C:
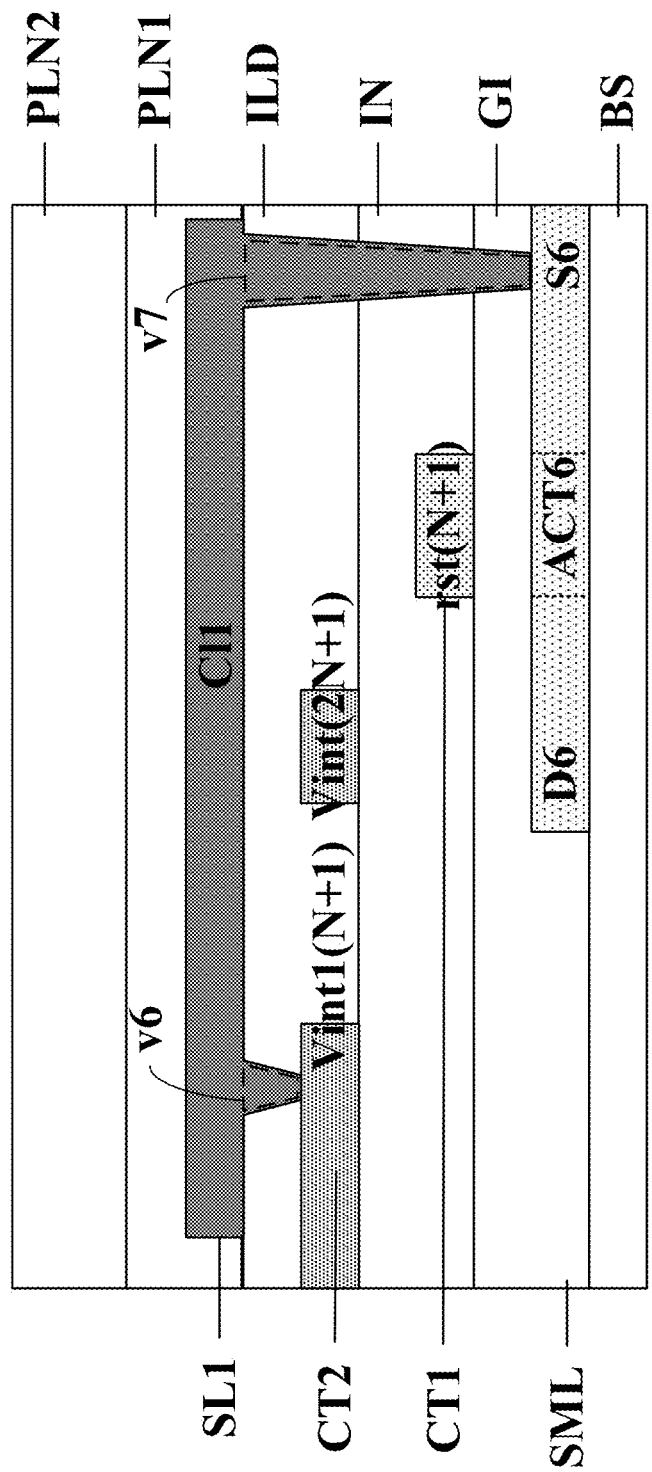
FIG. 4C is a cross-sectional view along a C-C' line in FIG. 3A.

FIG. 4C is a cross-sectional view along a C-C' line in FIG. 3A. Referring to FIG. 3A to FIG. 3H, and FIG. 4C, the first connecting line Cl1 connects a respective first reset signal line of the plurality of first reset signal lines (e.g., the respective first reset signal line of the next adjacent stage Vint1(N+1)) and the source electrode S6 of the sixth transistor T6 in a respective pixel driving circuit together.

The respective first reset signal line of the plurality of first reset signal lines (e.g., the respective first reset signal line of the next adjacent stage Vint1(N+1)) is configured to provide a reset signal to the source electrode S6 of the sixth transistor T6 in the respective pixel driving circuit, through the first connecting line Cl1. Optionally, the first connecting line Cl1 is connected to the respective first reset signal line of the next adjacent stage Vint1(N+1) through a sixth via v6 extending through the inter-layer dielectric layer ILD. Optionally, the first connecting line Cl1 is connected to the source electrode S6 of the sixth transistor T6 in the respective pixel driving circuit through a seventh via v7 extending through the inter-layer dielectric layer ILD, the insulating layer IN, and the gate insulating layer GI.

Figure 5A:
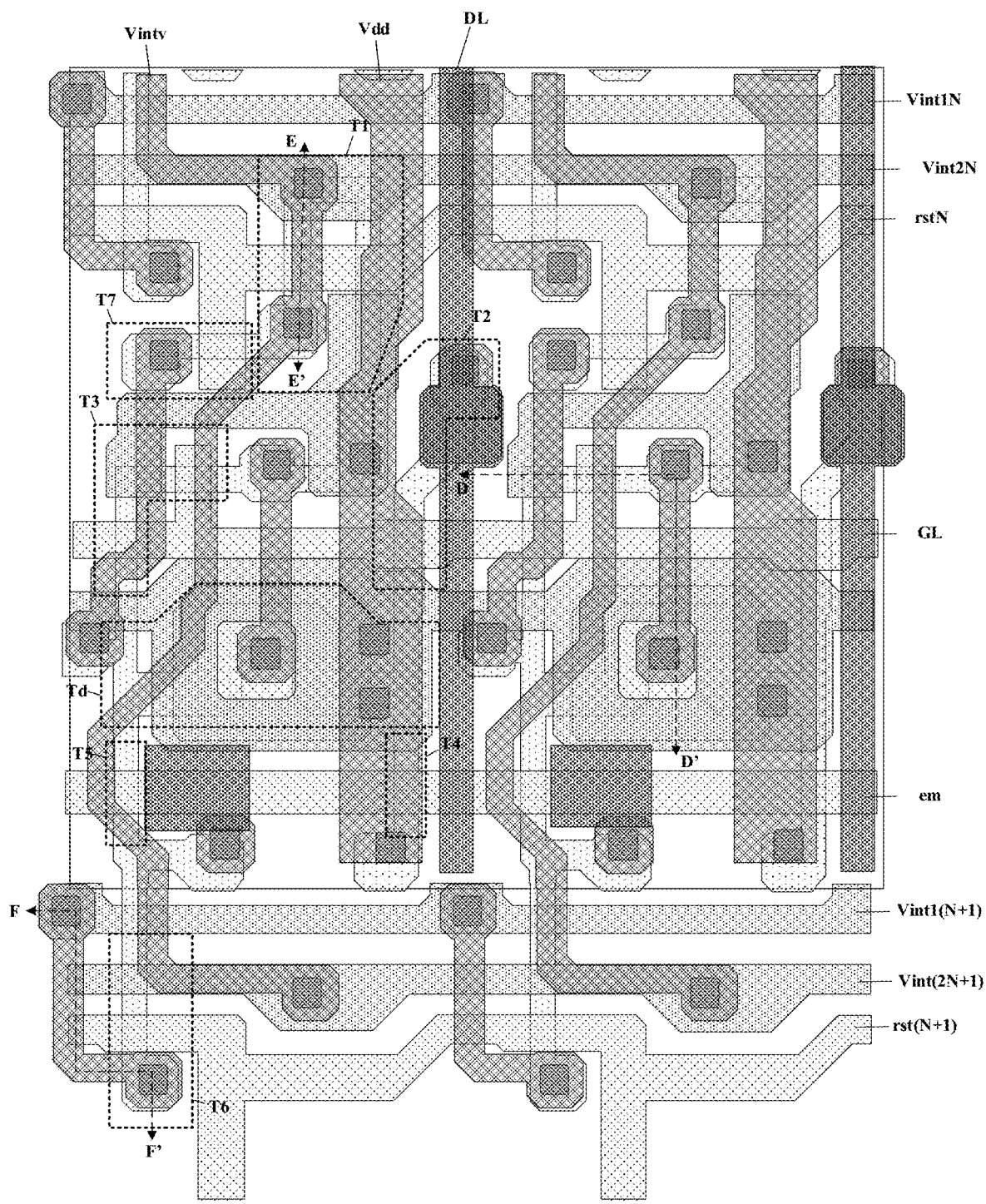
FIG. 5A is a diagram illustrating the structure of an array substrate in some embodiments according to the present disclosure.
Figure 5B:
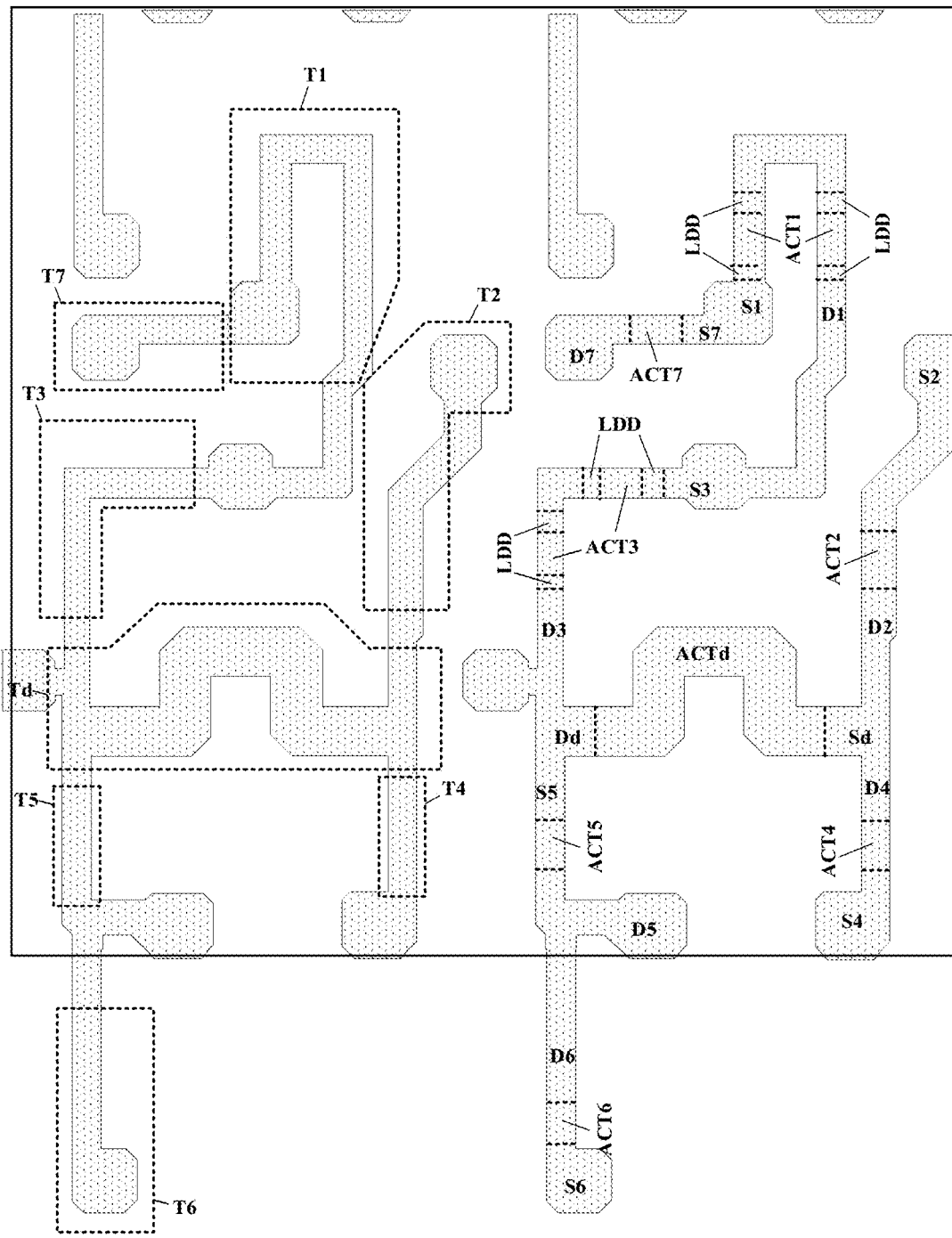
FIG. 5B is a diagram illustrating the structure of a semiconductor material layer in an array substrate depicted in FIG. 5A.
Figure 5C:
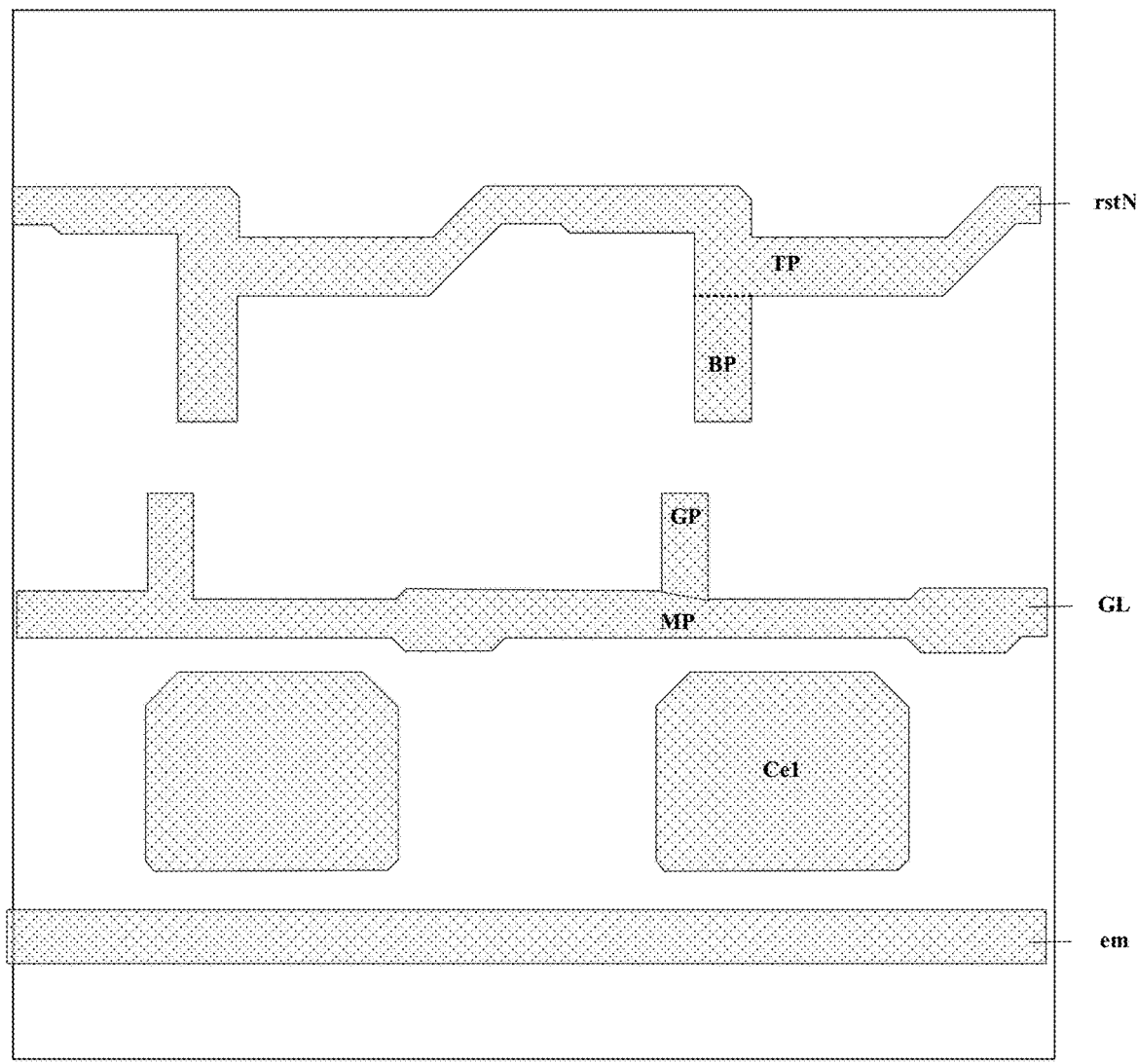
FIG. 5C is a diagram illustrating the structure of a first conductive layer in an array substrate depicted in FIG. 5A.
Figure 5C:
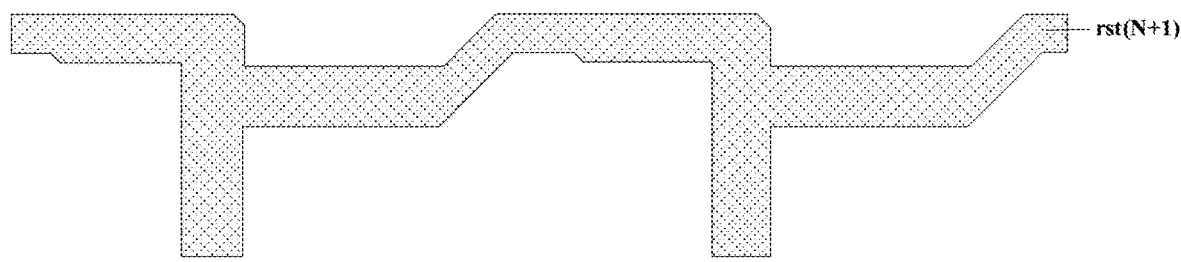
Figure 5D:
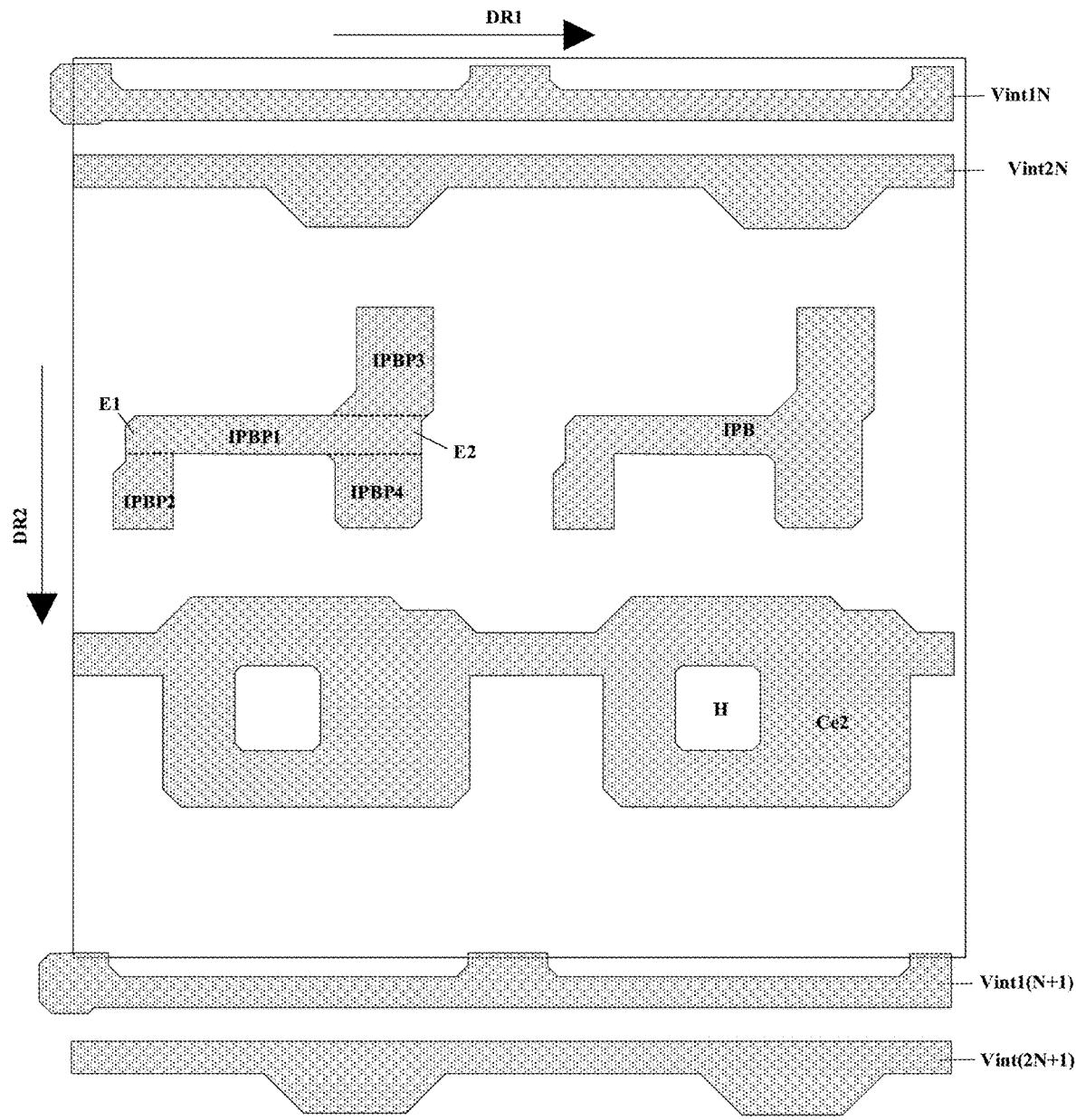
FIG. 5D is a diagram illustrating the structure of a second conductive layer in an array substrate depicted in FIG. 5A.
Figure 5E:
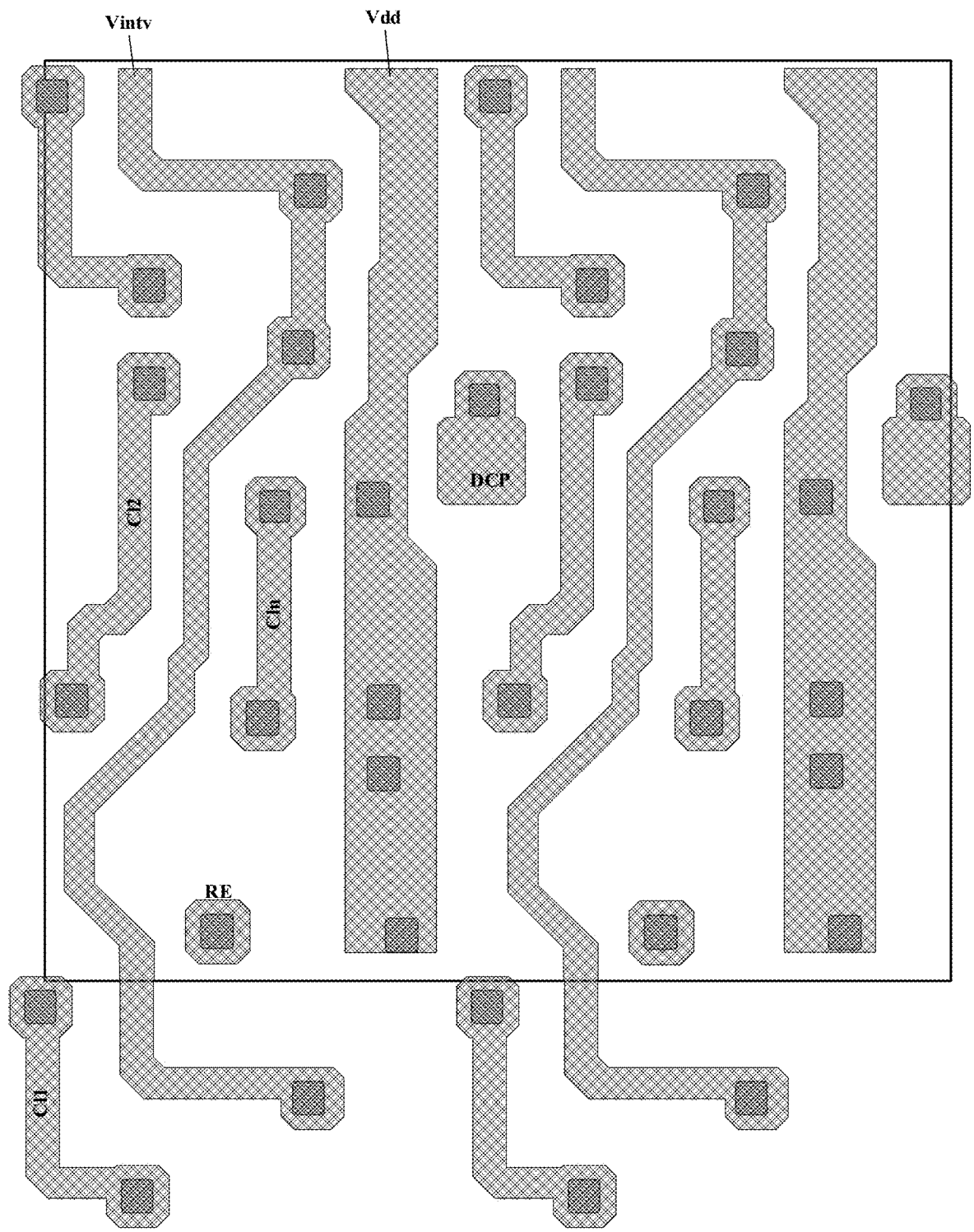
FIG. 5E is a diagram illustrating the structure of a first signal line layer in an array substrate depicted in FIG. 5A.
Figure 5F:
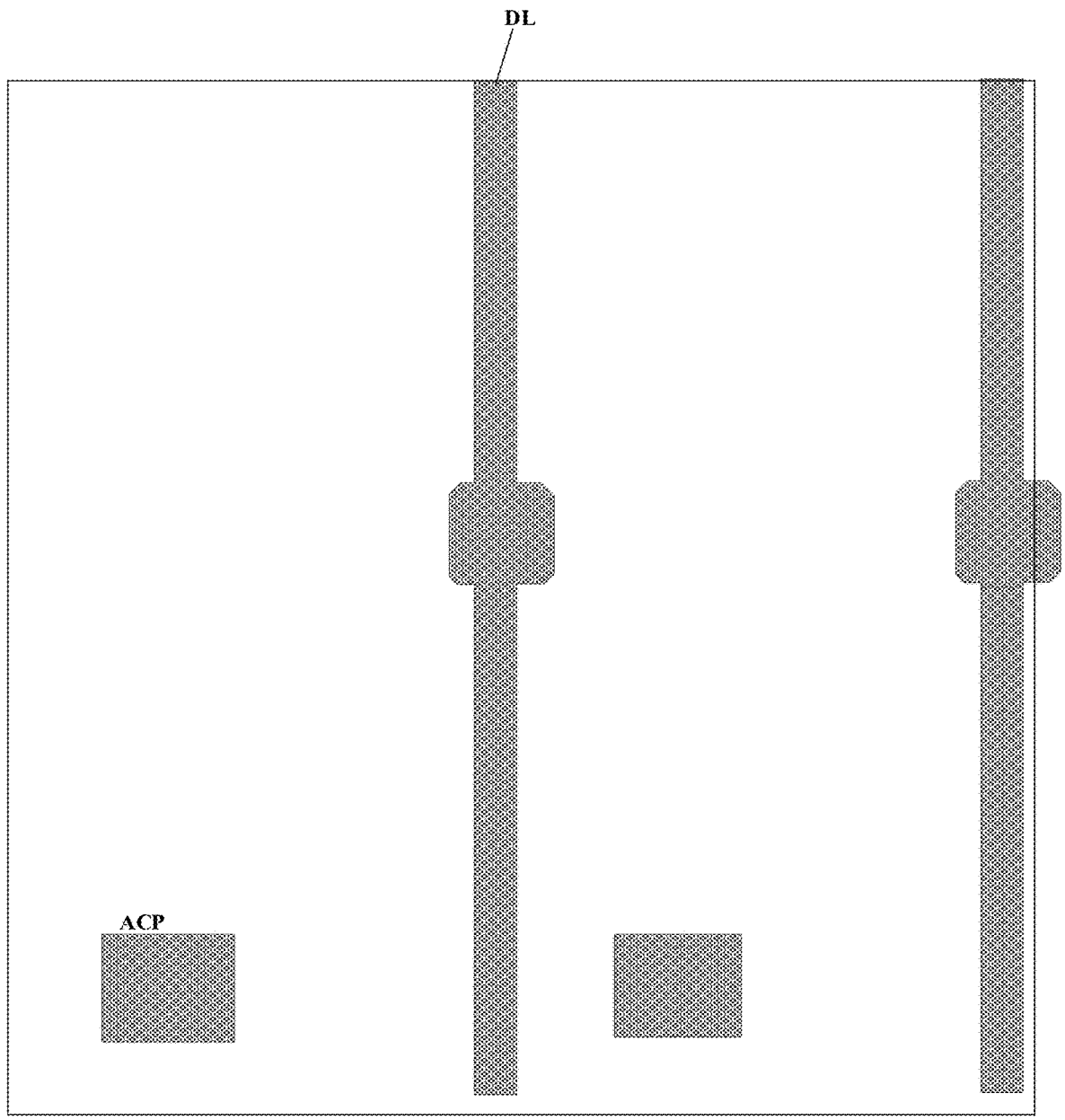
FIG. 5F is a diagram illustrating the structure of a second signal line layer in an array substrate depicted in FIG. 5A.
Figure 5G:
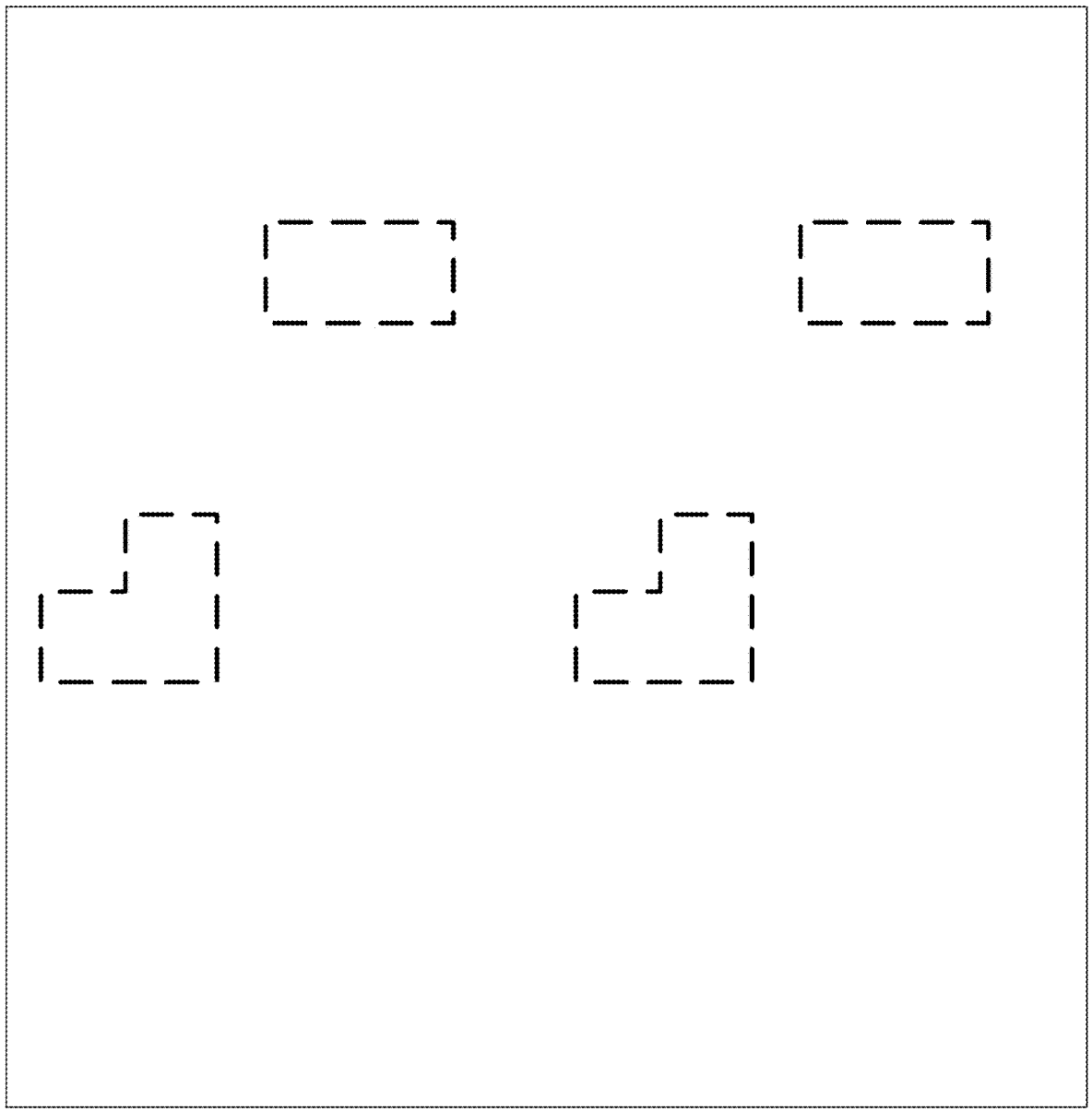
FIG. 5G is a diagram illustrating light doped drain (LDD) exposure regions in a process of fabricating an array substrate depicted in FIG. 5A.
Figure 5H:
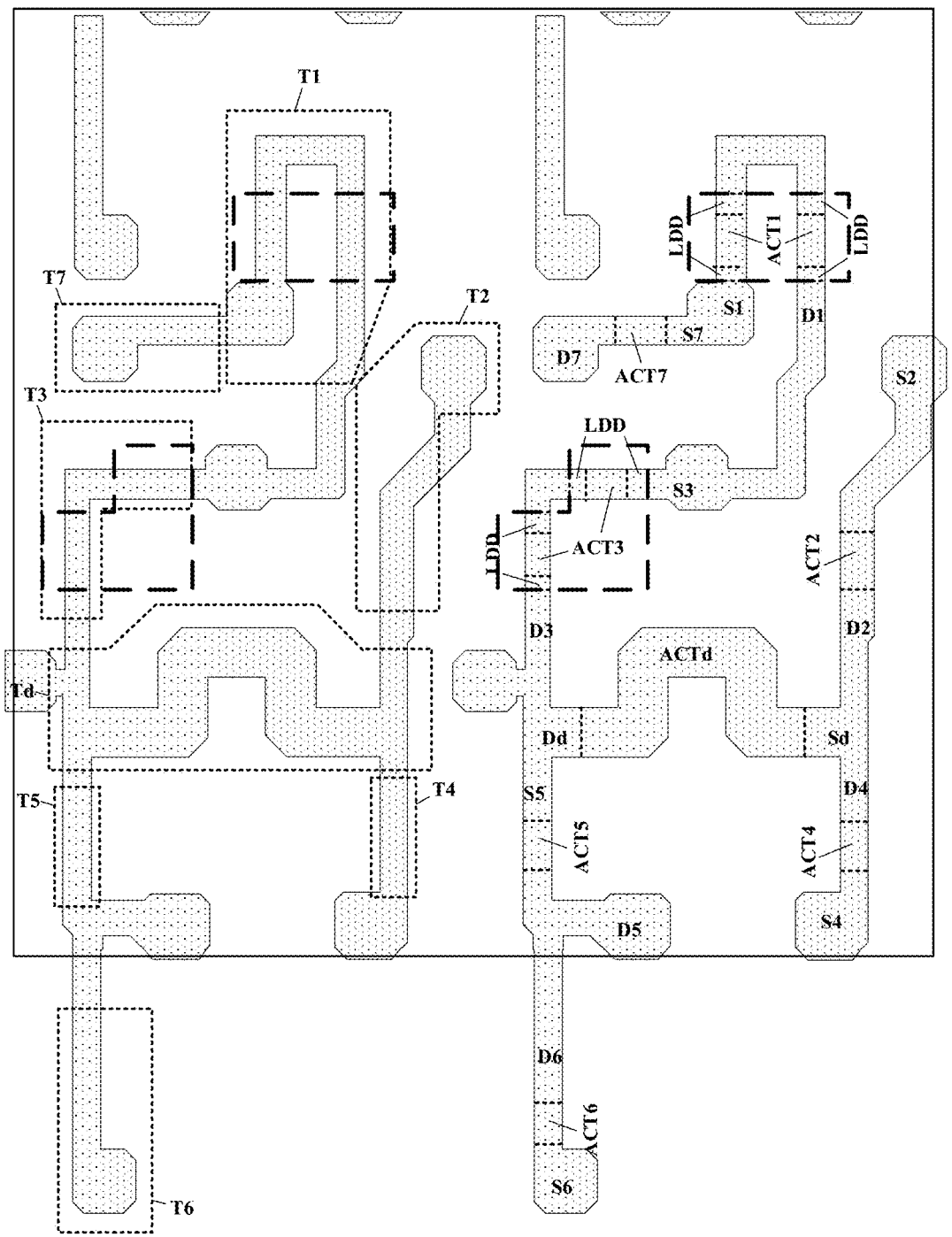
FIG. 5H shows a superimposition of the illustrating light doped drain (LDD) exposure regions and the semiconductor material layer in an array substrate depicted in FIG. 5A.
Figure 6A:
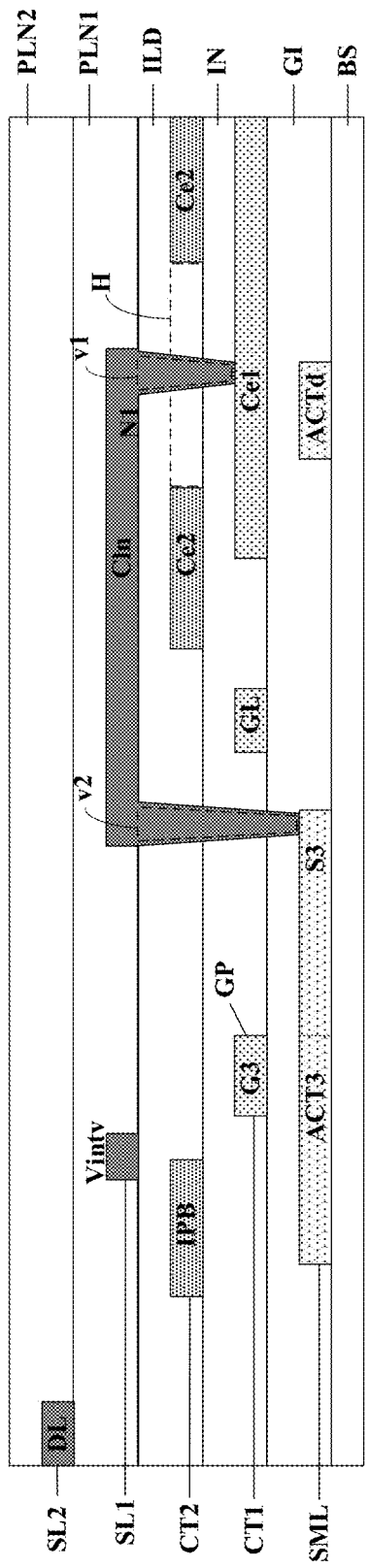
FIG. 6A is a cross-sectional view along a D-D' line in FIG. 5A.
Figure 6B:
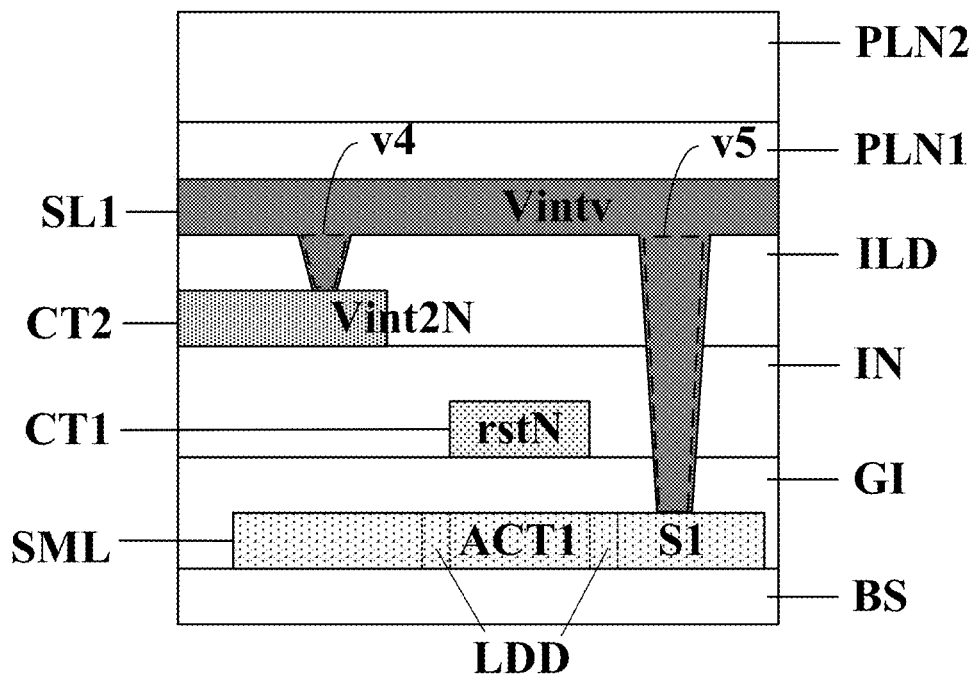
FIG. 6B is a cross-sectional view along a E-E' line in FIG. 5A.
Figure 6C:
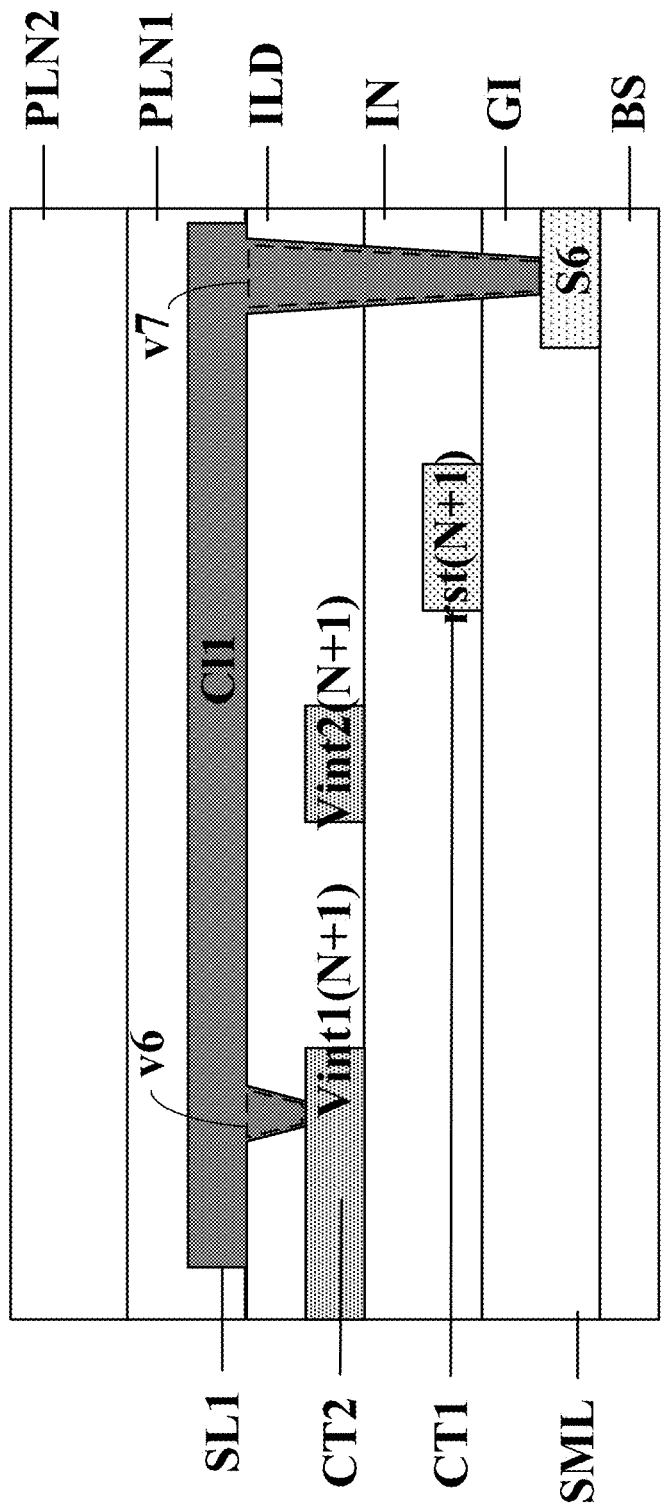
FIG. 6C is a cross-sectional view along an F-F' line in FIG. 5A.

FIG. 5A is a diagram illustrating the structure of an array substrate in some embodiments according to the present disclosure. FIG. 5B is a diagram illustrating the structure of a semiconductor material layer in an array substrate depicted in FIG. 5A. FIG. 5C is a diagram illustrating the structure of a first conductive layer in an array substrate depicted in FIG. 5A. FIG. 5D is a diagram illustrating the structure of a second conductive layer in an array substrate depicted in FIG. 5A. FIG. 5E is a diagram illustrating the structure of a first signal line layer in an array substrate depicted in FIG. 5A. FIG. 5F is a diagram illustrating the structure of a second signal line layer in an array substrate depicted in FIG. 5A. FIG. 5G is a diagram illustrating light doped drain (LDD) exposure regions in a process of fabricating an array substrate depicted in FIG. 5A. FIG. 5H shows a superimposition of the illustrating light doped drain (LDD) exposure regions and the semiconductor material layer in an array substrate depicted in FIG. 5A. FIG. 6A is a cross-sectional view along a D-D' line in FIG. 5A. FIG. 6B is a cross-sectional view along a E-E' line in FIG. 5A. FIG. 6C is a cross-sectional view along an F-F' line in FIG. 5A. The respective pixel driving circuit depicted in FIG. 5A to FIG. 5H, and FIG. 6A to FIG. 6C, corresponds to the pixel driving circuit depicted in FIG. 2C or FIG. 2D.

Referring to FIG. 2C, FIG. 2D, FIG. 5A, and FIG. 5B, a respective pixel driving circuit is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, the seventh transistor T7, and the driving transistor Td. The respective pixel driving circuit is further annotated with labels indicating components of each of the plurality of transistors in the pixel driving circuit. For example, the first transistor T1 includes an active layer ACT1, a source electrode S1, and a drain electrode D1. The second transistor T2 includes an active layer ACT2, a source electrode S2, and a drain electrode D2. The third transistor T3 includes an active layer ACT3, a source electrode S3, and a drain electrode D3. The fourth transistor T4 includes an active layer ACT4, a source electrode S4, and a drain electrode D4. The fifth transistor T5 includes an active layer ACT5, a source electrode S5, and a drain electrode D5. The sixth transistor T6 includes an active layer ACT6, a source electrode S6, and a drain electrode D6. The seventh transistor T7 includes an active layer ACT7, a source electrode S7, and a drain electrode D7. The driving transistor Td includes an active layer ACTd, a source electrode Sd, and a drain electrode Dd. In one example, the active layers (ACT1, ACT2, ACT3, ACT4, ACT5, ACT6, ACT7, and ACTd) of the transistors (T1, T2, T3, T4, T5, T6, T7, and Td) in the respective pixel driving circuit are parts of a unitary structure. In another example, the active layers (ACT1, ACT2, ACT3, ACT4, ACT5, ACT6, ACT7, and ACTd), the source electrodes (S1, S2, S3, S4, S5, S6, S7, and Sd), and the drain electrodes (D1, D2, D3, D4, D5, D6, D7, and Dd) of the transistors (T1, T2, T3, T4, T5, T6, T7, and Td) in the respective pixel driving circuit are parts of a unitary structure. In another example, the active layers (ACT1, ACT2, ACT3, ACT4, ACT5, ACT6, ACT7, and ACTd) of the transistors (T1, T2, T3, T4, T5, T6, T7, and Td) are in a same layer. In another example, the active layers (ACT1, ACT2, ACT3, ACT4, ACT5, ACT6, ACT7, and ACTd), the source electrodes (S1, S2, S3, S4, S5, S6, S7, and Sd), and the drain electrodes (D1, D2, D3, D4, D5, D6, D7, and Dd) of the transistors (T1, T2, T3, T4, T5, T6, T7, and Td) are in a same layer.

Referring to FIG. 2C, FIG. 2D, FIG. 5A, and FIG. 5C, the first conductive layer in some embodiments includes a plurality of gate lines GL, a plurality of reset control signal lines (including a respective reset control signal line of a present stage rstN and a reset control signal line of a next stage rst(N+1)), a plurality of light emitting control signal lines em, and a first capacitor electrode Ce1 of the storage capacitor Cst.

In some embodiments, in a respective pixel driving circuit, a respective reset control signal line of the plurality of reset control signal lines includes a trunk portion TP extending along an extension direction of the respective reset control signal line, and a branch portion BP protruding away from the trunk portion TP, e.g., along a direction from the respective reset control signal line rstN of the plurality of reset control signal lines in a present stage toward the respective gate line in the present stage.

In some embodiments, the branch portion BP comprises the gate electrode of the seventh transistor T7. In some embodiments, an orthographic projection of the branch portion BP on the base substrate BS overlaps with an orthographic projection of the active layer ACT7 of the seventh transistor T7 on the base substrate BS.

Referring to FIG. 2C, FIG. 2D, FIG. 5A, and FIG. 5D, the second conductive layer in some embodiments includes a plurality of first reset signal lines (including a respective first reset signal line of a present stage Vint1N, and a respective first reset signal line of a next adjacent stage Vinit1(N+1)), a plurality of second reset signal lines (including a respective second reset signal line of a present stage Vint2N, and a respective second reset signal line of a next adjacent stage Vinit2(N+1)), an interference preventing block IPB and a second capacitor electrode Ce2 of the storage capacitor Cst. The interference preventing block IPB can effectively reduce the cross-talk, particularly vertical cross-talk between the N1 nodes of the adjacent pixel driving circuits.

Referring to FIG. 2C, FIG. 2D, FIG. 5A, and FIG. 5E, the first signal line layer in some embodiments includes a plurality of voltage supply lines Vdd, a node connecting line Cln, a first connecting line C11, a second connecting line C12, a relay electrode RE, a data connecting pad DCP, a plurality of third reset signal lines Vintv. The node connecting line Cln connects the first capacitor electrode Ce1 and the source electrode of the third transistor T3 in a respective pixel driving circuit together. The first connecting line C11 connects a respective first reset signal line of the plurality of first reset signal lines (e.g., the respective first reset signal line of the next adjacent stage Vint1(N+1)) and the source electrode S6 of the sixth transistor T6 in a respective pixel driving circuit together. A respective third reset signal line of the plurality of third reset signal lines Vintv connects a respective second reset signal line of the plurality of second reset signal lines (e.g., the respective second reset signal line of the present stage Vint2N) and the source electrode S1 of the first transistor T1 in a respective pixel driving circuit together. The data connecting pad DCP connects a respective data line of a plurality of data lines and a source electrode of the second transistor T2 in a respective pixel driving circuit together. The second connecting line C12 connects a drain electrode of the seventh transistor T7 and a drain electrode of the driving transistor Td in a respective pixel driving circuit together.

The relay electrode RE connects a source electrode S5 of the fifth transistor T5 in the respective pixel driving circuit to an anode contact pad in the respective pixel driving circuit, which in turn is connected to an anode in a respective subpixel.

Referring to Referring to FIG. 2C, FIG. 2D, FIG. 5A, and FIG. 5F, the second signal line layer in some embodiments includes a plurality of data line DL and an anode contact pad ACP. The anode contact pad ACP is electrically connected to a source electrode of the fifth transistor T5 in the respective pixel driving circuit through a relay electrode. The anode contact pad ACP is electrically connected to an anode in a respective subpixel.

Referring FIG. 5G and FIG. 5H, a plurality of lightly doped drain exposure regions LDDE are illustrated. Referring to FIG. 5B and FIG. 5H, a plurality of lightly doped drain regions LDD are depicted in FIG. 5H. The plurality of lightly doped drain regions LDD are formed in double-gate transistors, e.g., the first transistor T1 and the third transistor T3. In each of the channel parts of a double-gate transistor, two lightly doped drain regions are formed on both sides of a respective channel part, and the plurality of lightly doped drain regions LDD are not subject to p+ doping. The plurality of lightly doped drain regions LDD have a relatively higher resistances as compared to those in remaining portions of the drain electrodes and source electrodes. By having the plurality of lightly doped drain regions LDD, current leakage issues in the double-gate transistors can be effectively obviated, improving the low-frequency flicker in the array substrate.

Referring to FIG. 2C, FIG. 2D, FIG. 5A, FIG. 5E, and FIG. 6A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the first signal line layer includes a node connecting line Cln on a side of the inter-layer dielectric layer ILD away from the second capacitor electrode Ce2. The node connecting line Cln is in a same layer as the plurality of voltage supply lines Vdd. Optionally, the array substrate further includes a first via v1 in the hole region H and extending through the inter-layer dielectric layer ILD and the insulating layer IN. Optionally, the node connecting line Cln is connected to the first capacitor electrode Ce1 through the first via v1. In some embodiments, the first capacitor electrode Ce1 is on a side of the gate insulating layer GI away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the node connecting line Cln is connected to the first capacitor electrode Ce1 through the first via v1, and the node connecting line Cln is connected to the semiconductor material layer SML through the second via v2. Optionally, the node connecting line Cln is connected to the source electrode S3 of third transistor, as depicted in FIG. 6A.

Referring to Referring to FIG. 2C, FIG. 2D, FIG. 5A to FIG. 5H, and FIG. 6A, in some embodiments, the interference preventing block IPB is in a same layer as the second capacitor electrode Ce2. The respective voltage supply line of the plurality of voltage supply lines Vdd is connected to the interference preventing block IPB through a third via v3. Optionally, the third via v3 extends through the inter-layer dielectric layer ILD. Optionally, an orthographic projection of the interference preventing block IPB on the base substrate BS partially overlaps with an orthographic projection of the respective voltage supply line of the plurality of voltage supply lines Vdd on the base substrate BS. Optionally, the orthographic projection of the interference preventing block IPB on the base substrate BS at least partially overlaps with an orthographic projection of an active layer ACT3 of the third transistor T3 on the base substrate BS.

Referring to FIG. 5A to FIG. 5H, and FIG. 6B, the respective third reset signal line of the plurality of third reset signal lines Vintv connects a respective second reset signal line of the plurality of second reset signal lines (e.g., the respective second reset signal line of the present stage Vint2N) and the source electrode S1 of the first transistor T1 in a respective pixel driving circuit together.

The respective second reset signal line of the plurality of second reset signal lines (e.g., the respective second reset signal line of the present stage Vint2N) is configured to provide a reset signal to the source electrode S1 of the first transistor T1 in the respective pixel driving circuit, through the respective third reset signal line of the plurality of third reset signal lines Vintv. Optionally, the respective third reset signal line is connected to the respective second reset signal line of the present stage Vint2N through a fourth via v4 extending through the inter-layer dielectric layer ILD. Optionally, the respective third reset signal line is connected to the source electrode S1 of the first transistor T1 in the respective pixel driving circuit through a fifth via v5 extending through the inter-layer dielectric layer ILD, the insulating layer IN, and the gate insulating layer GI.

Referring to FIG. 5A to FIG. 5H, and FIG. 6C, the first connecting line Cl1 connects a respective first reset signal line of the plurality of first reset signal lines (e.g., the respective first reset signal line of the next adjacent stage Vint1(N+1)) and the source electrode S6 of the sixth transistor T6 in a respective pixel driving circuit together.

The respective first reset signal line of the plurality of first reset signal lines (e.g., the respective first reset signal line of the next adjacent stage Vint1(N+1)) is configured to provide a reset signal to the source electrode S6 of the sixth transistor T6 in the respective pixel driving circuit, through the first connecting line Cl1. Optionally, the first connecting line Cl1 is connected to the respective first reset signal line of the next adjacent stage Vint1(N+1) through a sixth via v6 extending through the inter-layer dielectric layer ILD. Optionally, the first connecting line Cl1 is connected to the source electrode S6 of the sixth transistor T6 in the respective pixel driving circuit through a seventh via v7 extending through the inter-layer dielectric layer ILD, the insulating layer IN, and the gate insulating layer GI.

Figure 7A:
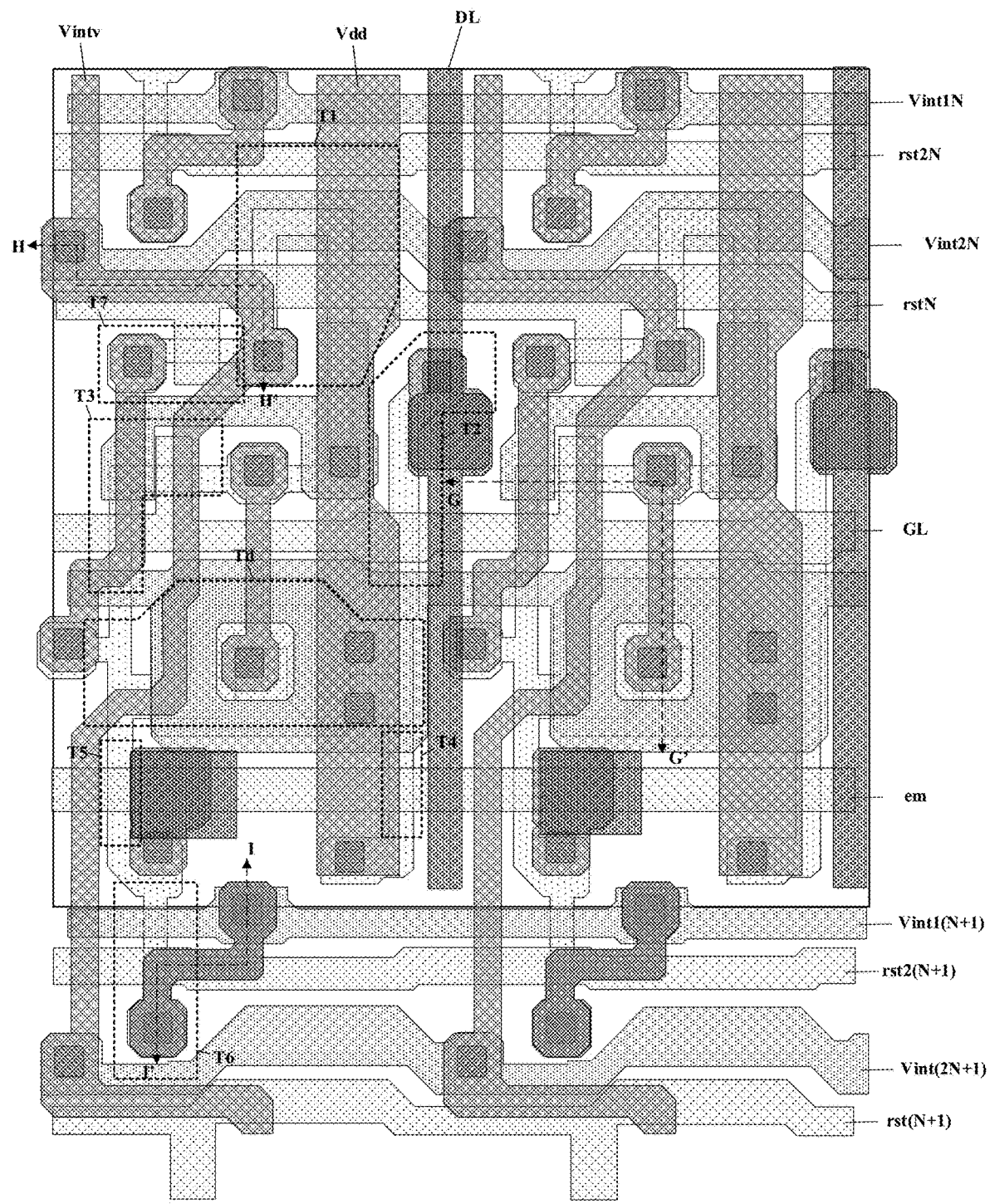
FIG. 7A is a diagram illustrating the structure of an array substrate in some embodiments according to the present disclosure.
Figure 7B:
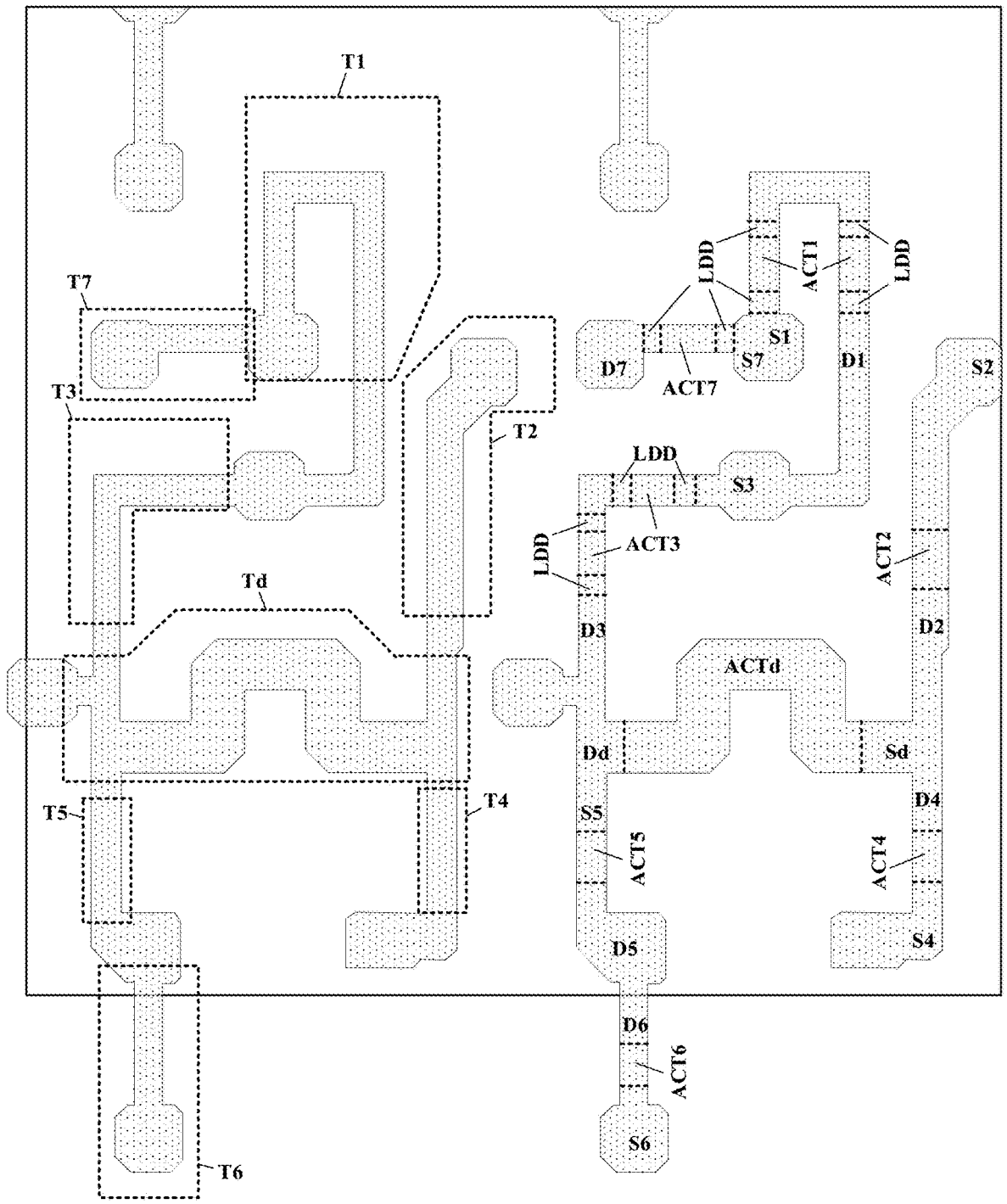
FIG. 7B is a diagram illustrating the structure of a semiconductor material layer in an array substrate depicted in FIG. 7A.
Figure 7C:
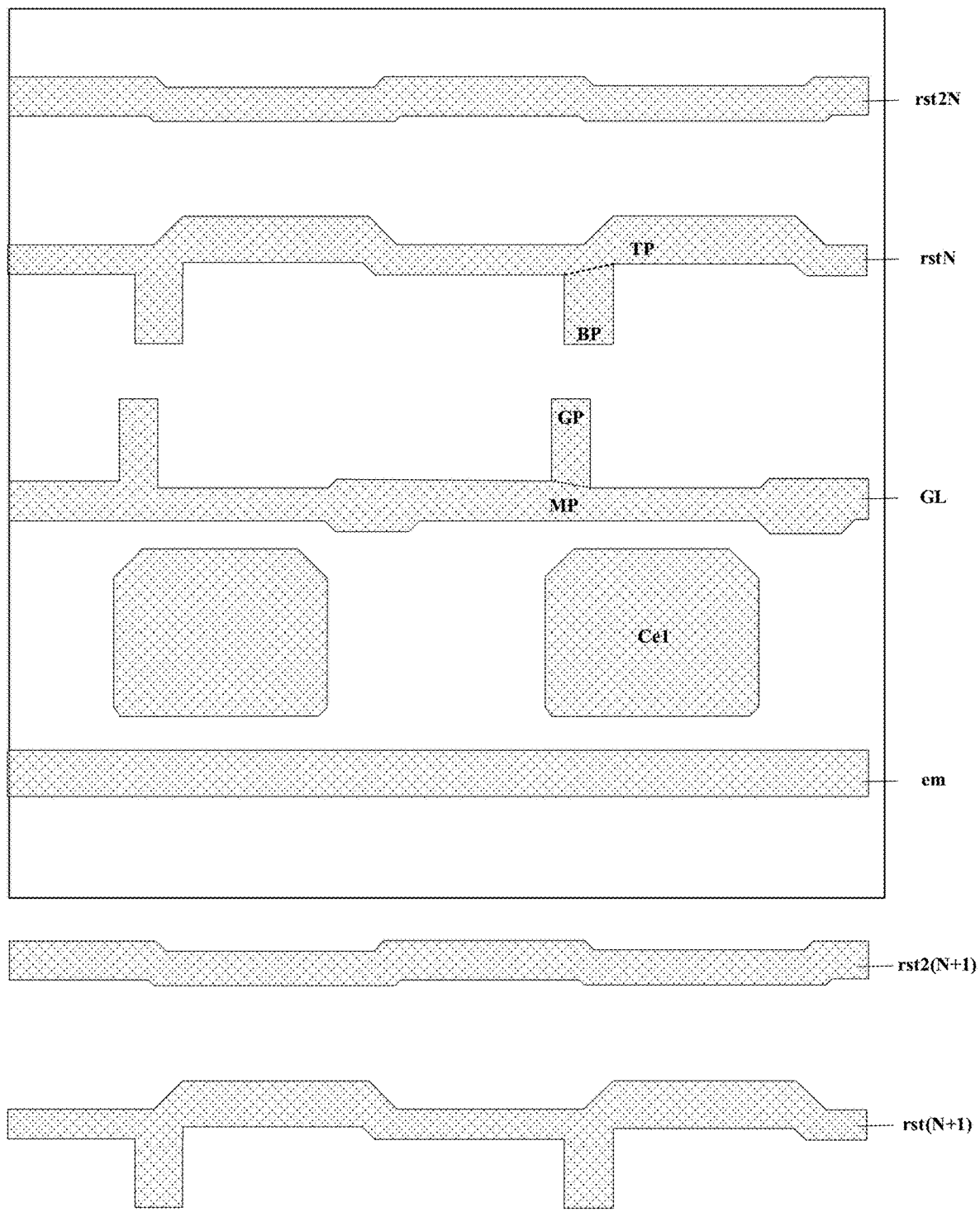
FIG. 7C is a diagram illustrating the structure of a first conductive layer in an array substrate depicted in FIG. 7A.
Figure 7D:
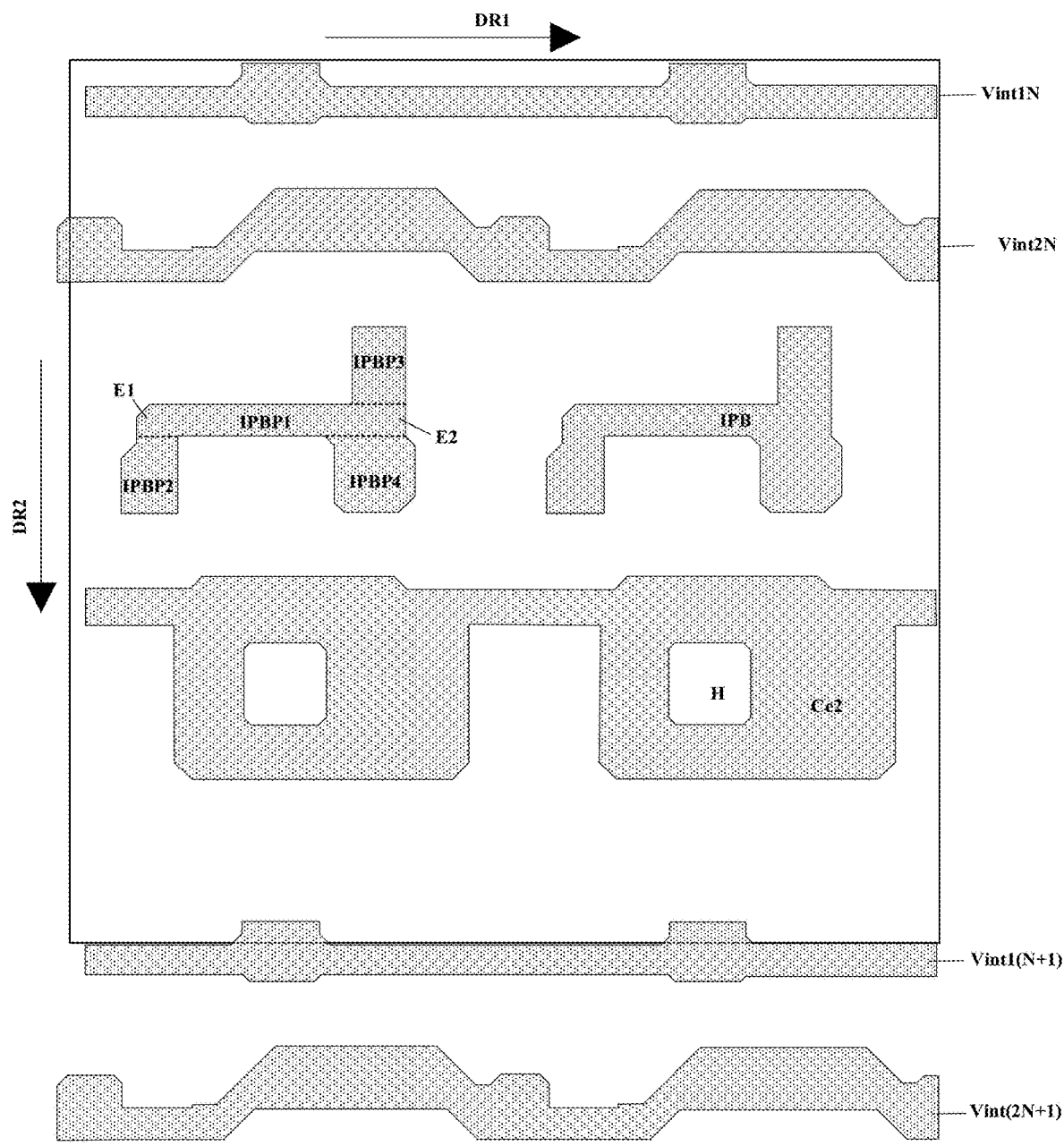
FIG. 7D is a diagram illustrating the structure of a second conductive layer in an array substrate depicted in FIG. 7A.
Figure 7E:
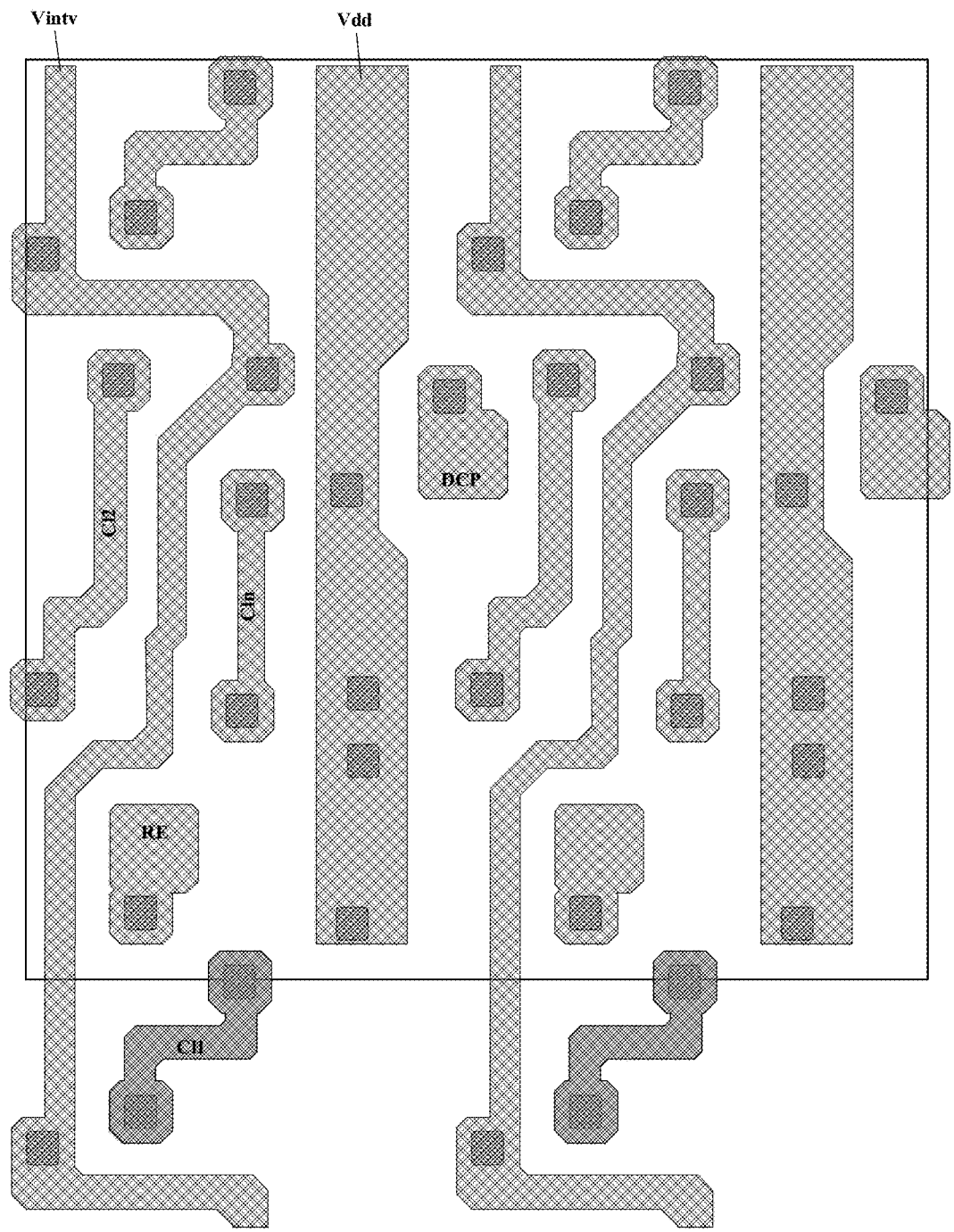
FIG. 7E is a diagram illustrating the structure of a first signal line layer in an array substrate depicted in FIG. 7A.
Figure 7F:
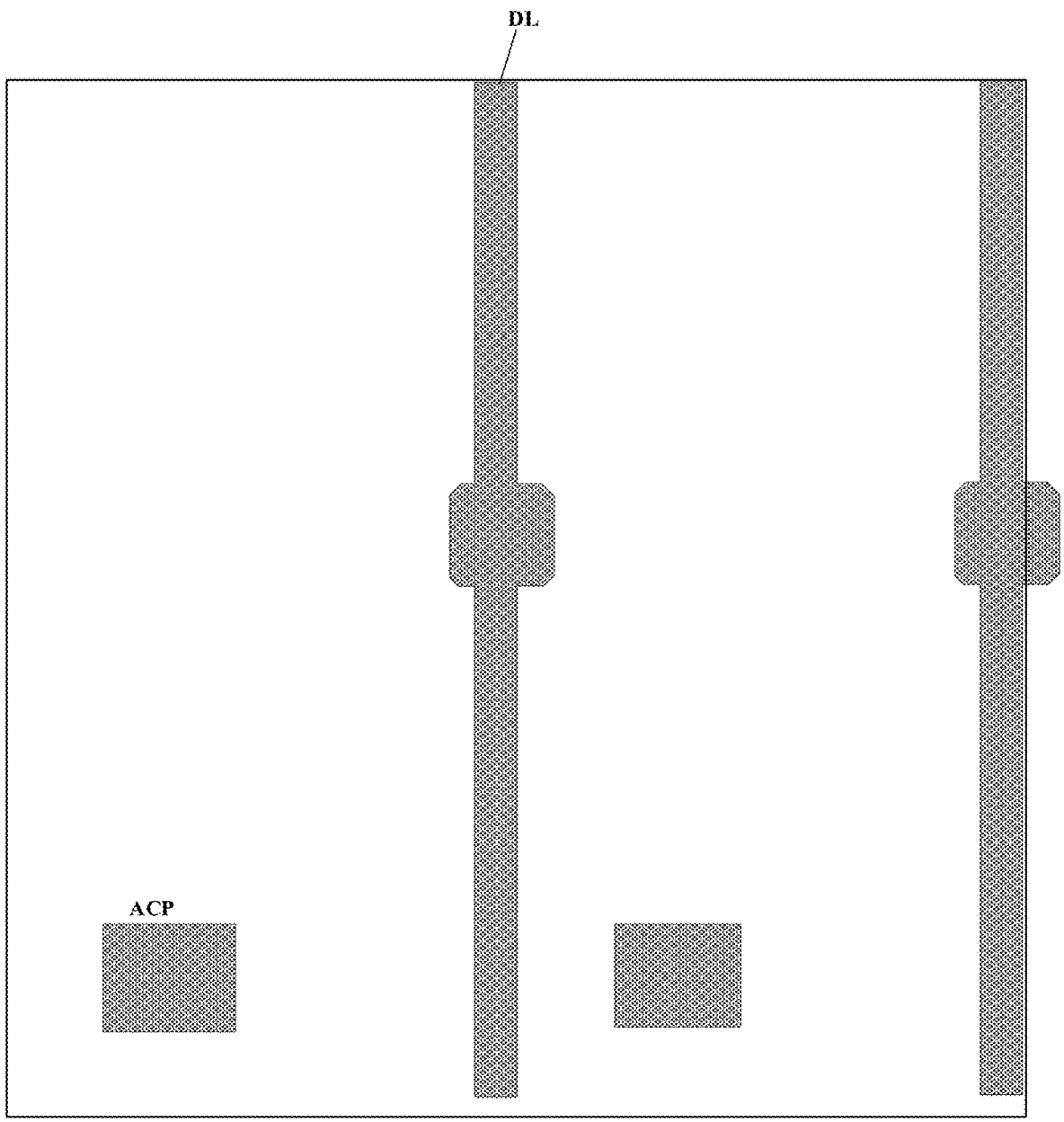
FIG. 7F is a diagram illustrating the structure of a second signal line layer in an array substrate depicted in FIG. 7A.
Figure 7G:
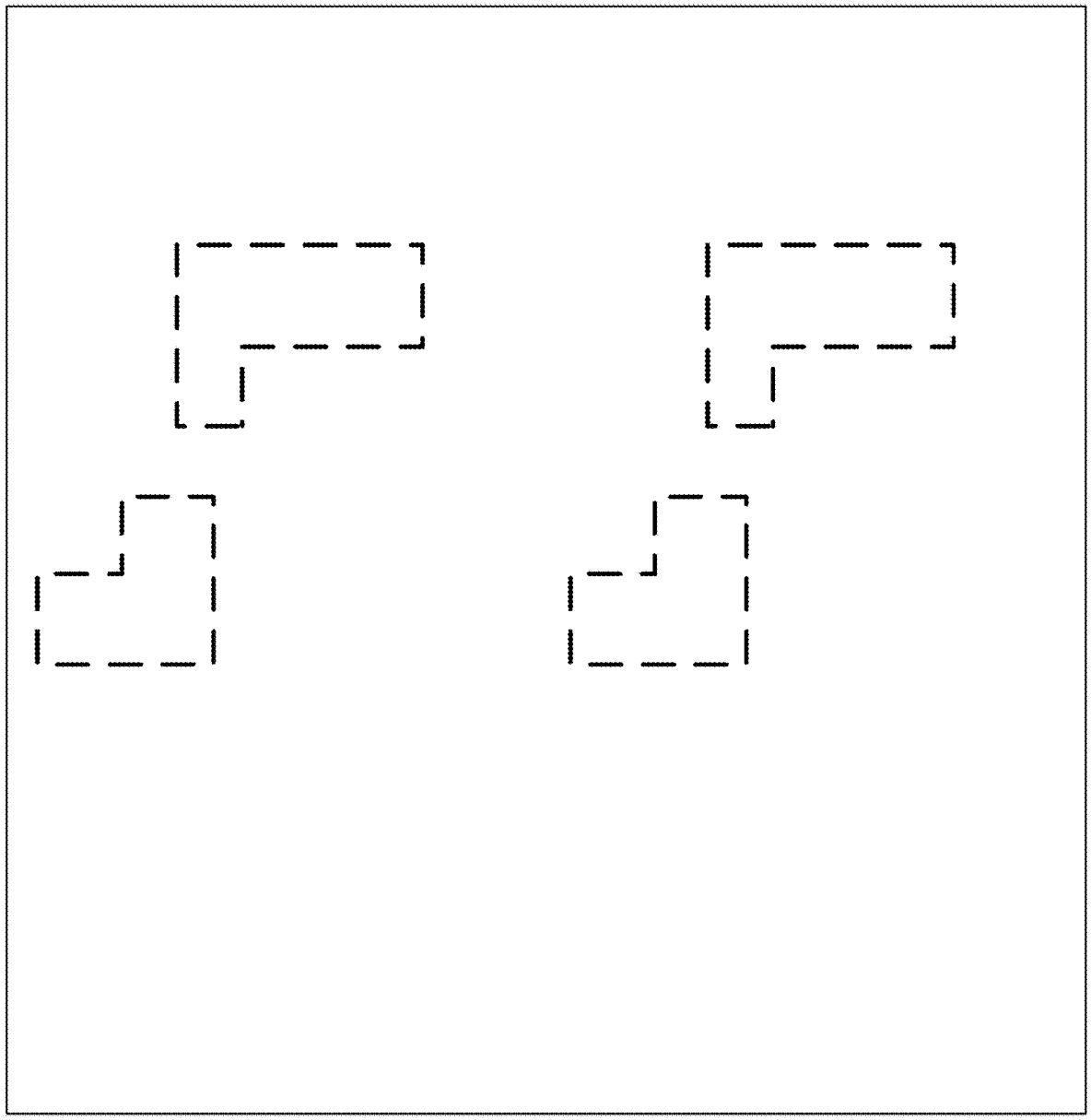
FIG. 7G is a diagram illustrating light doped drain (LDD) exposure regions in a process of fabricating an array substrate depicted in FIG. 7A.
Figure 7H:
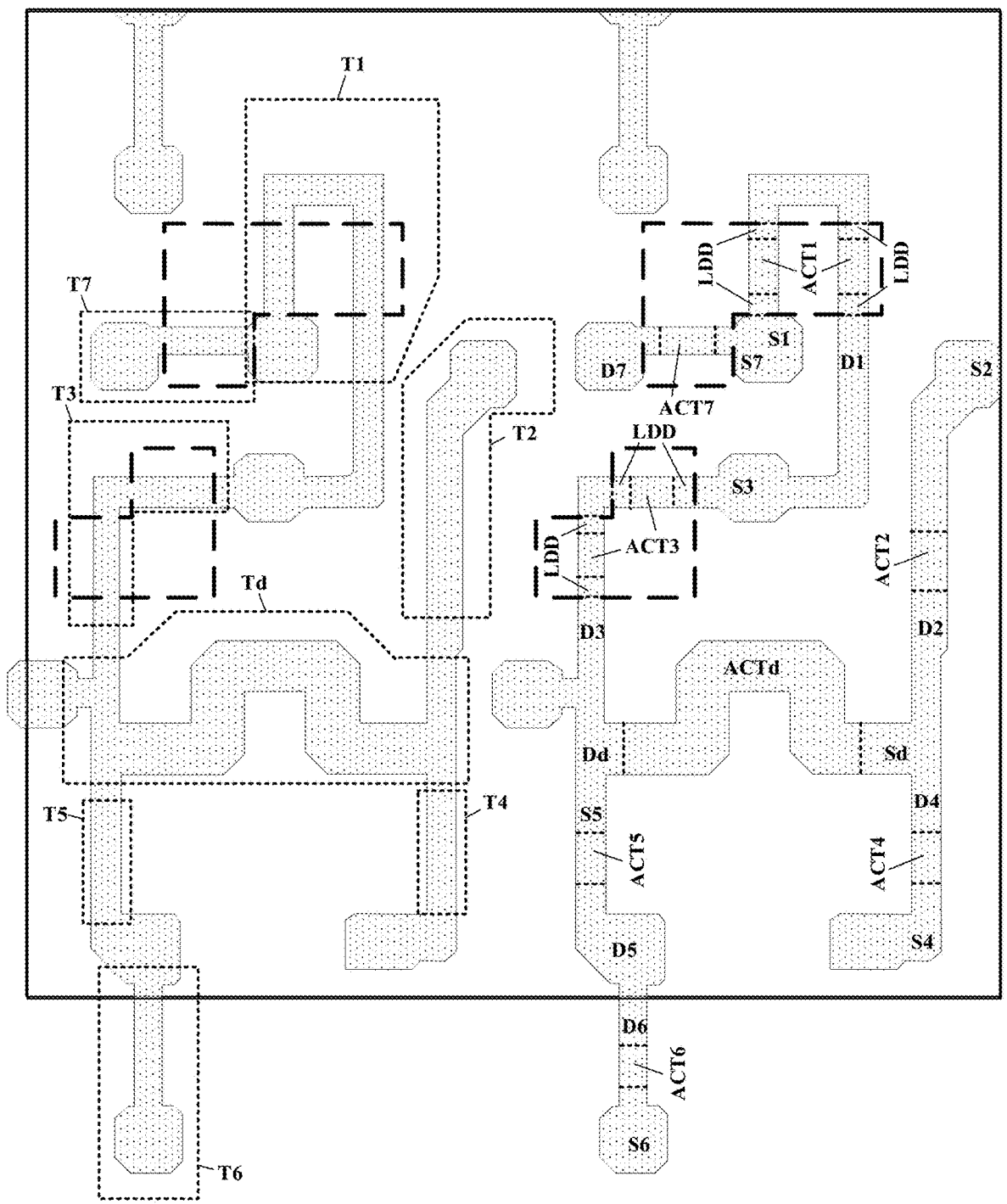
FIG. 7H shows a superimposition of the illustrating light doped drain (LDD) exposure regions and the semiconductor material layer in an array substrate depicted in FIG. 5A.
Figure 8A:
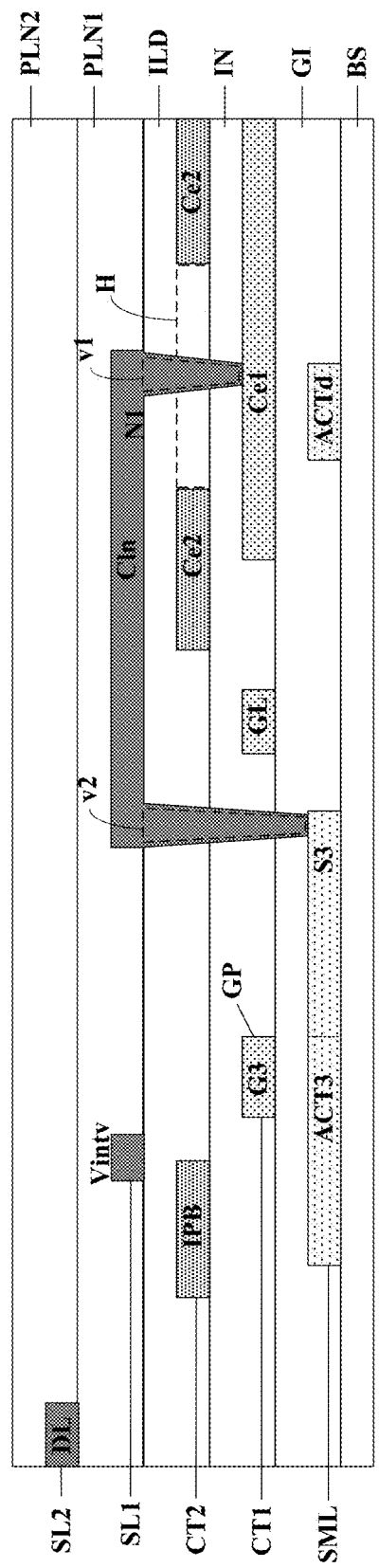
FIG. 8A is a cross-sectional view along a G-G' line in FIG. 7A.
Figure 8B:
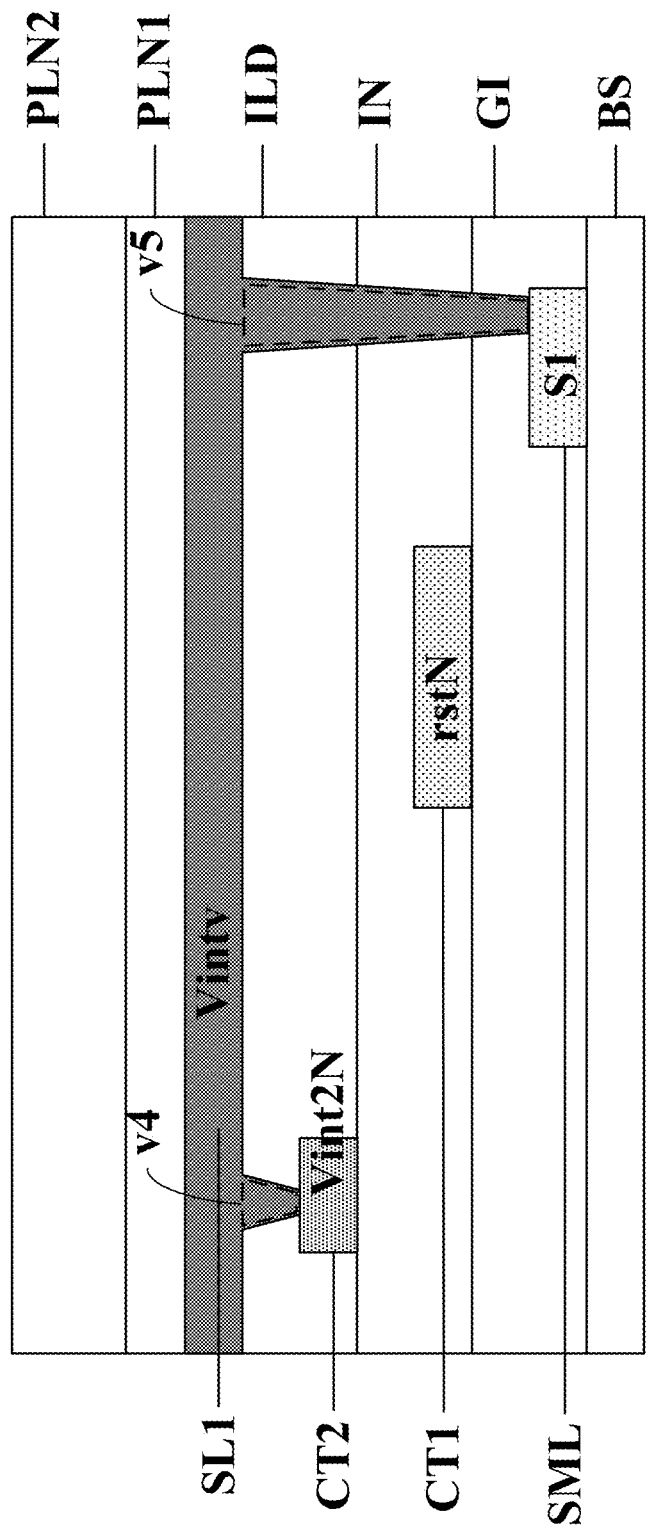
FIG. 8B is a cross-sectional view along an H-H' line in FIG. 7A.
Figure 8C:
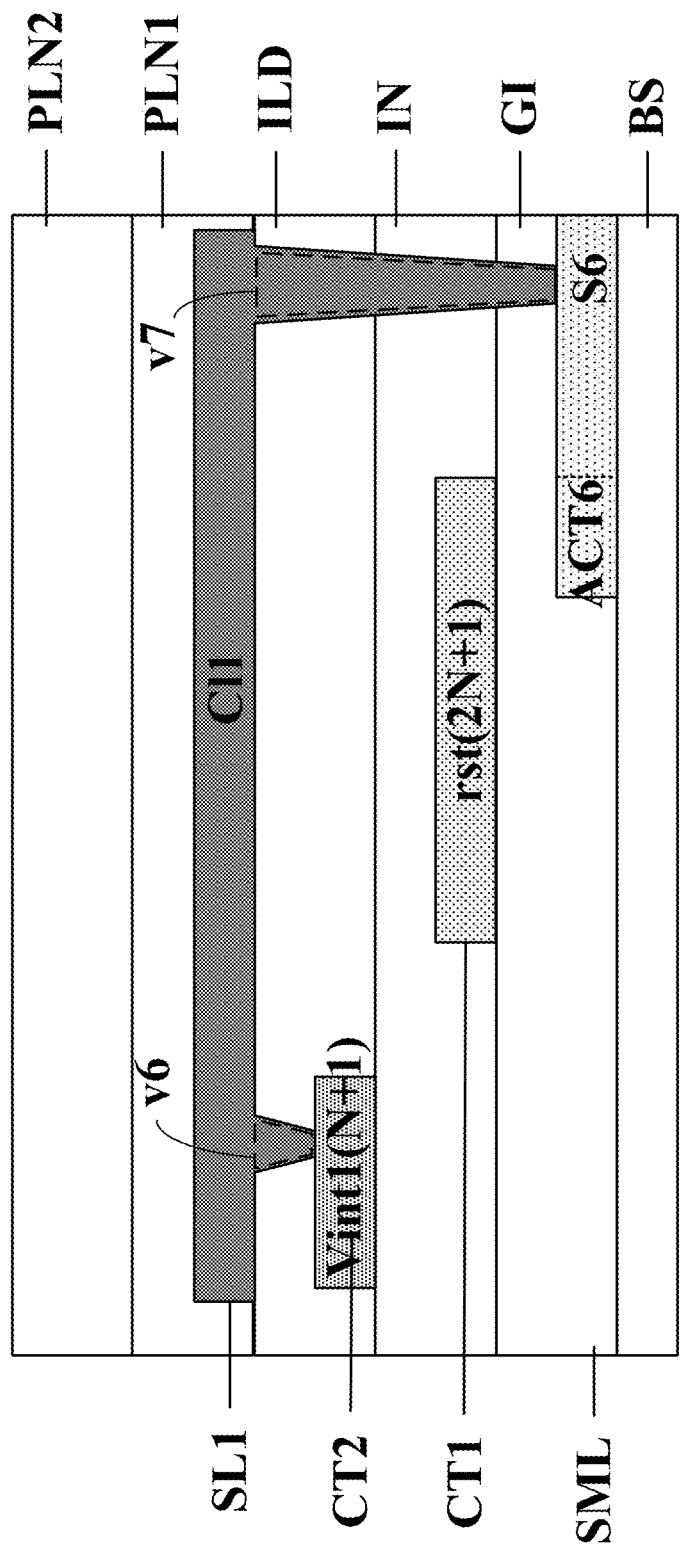
FIG. 8C is a cross-sectional view along an I-I' line in FIG. 7A.

FIG. 7A is a diagram illustrating the structure of an array substrate in some embodiments according to the present disclosure. FIG. 7B is a diagram illustrating the structure of a semiconductor material layer in an array substrate depicted in FIG. 7A. FIG. 7C is a diagram illustrating the structure of a first conductive layer in an array substrate depicted in FIG. 7A. FIG. 7D is a diagram illustrating the structure of a second conductive layer in an array substrate depicted in FIG. 7A. FIG. 7E is a diagram illustrating the structure of a first signal line layer in an array substrate depicted in FIG. 7A. FIG. 7F is a diagram illustrating the structure of a second signal line layer in an array substrate depicted in FIG. 7A. FIG. 7G is a diagram illustrating light doped drain (LDD) exposure regions in a process of fabricating an array substrate depicted in FIG. 7A. FIG. 7H shows a superimposition of the illustrating light doped drain (LDD) exposure regions and the semiconductor material layer in an array substrate depicted in FIG. 5A. FIG. 8A is a cross-sectional view along a G-G' line in FIG. 7A. FIG. 8B is a cross-sectional view along an H-H' line in FIG. 7A. FIG. 8C is a cross-sectional view along an I-I' line in FIG. 7A.

Referring to FIG. 2E, FIG. 2F, FIG. 7A, and FIG. 7B, a respective pixel driving circuit is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, the seventh transistor T7, and the driving transistor Td. The respective pixel driving circuit is further annotated with labels indicating components of each of the plurality of transistors in the pixel driving circuit. For example, the first transistor T1 includes an active layer ACT1, a source electrode S1, and a drain electrode D1. The second transistor T2 includes an active layer ACT2, a source electrode S2, and a drain electrode D2. The third transistor T3 includes an active layer ACT3, a source electrode S3, and a drain electrode D3. The fourth transistor T4 includes an active layer ACT4, a source electrode S4, and a drain electrode D4. The fifth transistor T5 includes an active layer ACT5, a source electrode S5, and a drain electrode D5. The sixth transistor T6 includes an active layer ACT6, a source electrode S6, and a drain electrode D6. The seventh transistor T7 includes an active layer ACT7, a source electrode S7, and a drain electrode D7. The driving transistor Td includes an active layer ACTd, a source electrode Sd, and a drain electrode Dd. In one example, the active layers (ACT1, ACT2, ACT3, ACT4, ACT5, ACT6, ACT7, and ACTd) of the transistors (T1, T2, T3, T4, T5, T6, T7, and Td) in the respective pixel driving circuit are parts of a unitary structure. In another example, the active layers (ACT1, ACT2, ACT3, ACT4, ACT5, ACT6, ACT7, and ACTd), the source electrodes (S1, S2, S3, S4, S5, S6, S7, and Sd), and the drain electrodes (D1, D2, D3, D4, D5, D6, D7, and Dd) of the transistors (T1, T2, T3, T4, T5, T6, T7, and Td) in the respective pixel driving circuit are parts of a unitary structure. In another example, the active layers (ACT1, ACT2, ACT3, ACT4, ACT5, ACT6, ACT7, and ACTd) of the transistors (T1, T2, T3, T4, T5, T6, T7, and Td) are in a same layer. In another example, the active layers (ACT1, ACT2, ACT3, ACT4, ACT5, ACT6, ACT7, and ACTd), the source electrodes (S1, S2, S3, S4, S5, S6, S7, and Sd), and the drain electrodes (D1, D2, D3, D4, D5, D6, D7, and Dd) of the transistors (T1, T2, T3, T4, T5, T6, T7, and Td) are in a same layer.

Referring to FIG. 2E, FIG. 2F, FIG. 7A, and FIG. 7C, the first conductive layer in some embodiments includes a plurality of gate lines GL, a plurality of reset control signal lines (including a respective reset control signal line of a present stage rstN and a reset control signal line of a next stage rst(N+1)), a plurality of second reset control signal lines (including a respective second reset control signal line of a present stage rst2N and a second reset control signal line of a next stage rst2(N+1)), a plurality of light emitting control signal lines em, and a first capacitor electrode Ce1 of the storage capacitor Cst.

In some embodiments, in a respective pixel driving circuit, a respective reset control signal line of the plurality of reset control signal lines includes a trunk portion TP extending along an extension direction of the respective reset control signal line, and a branch portion BP protruding away from the trunk portion TP, e.g., along a direction from the respective reset control signal line rstN of the plurality of reset control signal lines in a present stage toward the respective gate line in the present stage.

In some embodiments, the branch portion BP comprises the gate electrode of the seventh transistor T7. In some embodiments, an orthographic projection of the branch portion BP on the base substrate BS overlaps with an orthographic projection of the active layer ACT7 of the seventh transistor T7 on the base substrate BS.

Referring to FIG. 2E, FIG. 2F, FIG. 7A, and FIG. 7D, the second conductive layer in some embodiments includes a plurality of first reset signal lines (including a respective first reset signal line of a present stage Vint1N, and a respective first reset signal line of a next adjacent stage Vinit1(N+1)), a plurality of second reset signal lines (including a respective second reset signal line of a present stage Vint2N, and a respective second reset signal line of a next adjacent stage Vinit2(N+1)), an interference preventing block IPB and a second capacitor electrode Ce2 of the storage capacitor Cst. The interference preventing block IPB can effectively reduce the cross-talk, particularly vertical cross-talk between the N1 nodes of the adjacent pixel driving circuits.

Referring to FIG. 2E, FIG. 2F, FIG. 7A, and FIG. 7E, the first signal line layer in some embodiments includes a plurality of voltage supply lines Vdd, a node connecting line Cln, a first connecting line Cl1, a second connecting line C12, a relay electrode RE, a data connecting pad DCP, a plurality of third reset signal lines Vintv. The node connecting line Cln connects the first capacitor electrode Ce1 and the source electrode of the third transistor T3 in a respective pixel driving circuit together. The first connecting line Cl1 connects a respective first reset signal line of the plurality of first reset signal lines (e.g., the respective first reset signal line of the next adjacent stage Vint1(N+1)) and the source electrode S6 of the sixth transistor T6 in a respective pixel driving circuit together. A respective third reset signal line of the plurality of third reset signal lines Vintv connects a respective second reset signal line of the plurality of second reset signal lines (e.g., the respective second reset signal line of the present stage Vint2N) and the source electrode S1 of the first transistor T1 in a respective pixel driving circuit together. The data connecting pad DCP connects a respective data line of a plurality of data lines and a source electrode of the second transistor T2 in a respective pixel driving circuit together. The second connecting line C12 connects a drain electrode of the seventh transistor T7 and a drain electrode of the driving transistor Td in a respective pixel driving circuit together.

The relay electrode RE connects a source electrode S5 of the fifth transistor T5 in the respective pixel driving circuit to an anode contact pad in the respective pixel driving circuit, which in turn is connected to an anode in a respective subpixel.

Referring to Referring to FIG. 2E, FIG. 2F, FIG. 7A, and FIG. 7F, the second signal line layer in some embodiments includes a plurality of data line DL and an anode contact pad ACP. The anode contact pad ACP is electrically connected to a source electrode of the fifth transistor T5 in the respective pixel driving circuit through a relay electrode. The anode contact pad ACP is electrically connected to an anode in a respective subpixel.

Referring FIG. 7G and FIG. 7H, a plurality of lightly doped drain exposure regions LDDE are illustrated. Referring to FIG. 7B and FIG. 7H, a plurality of lightly doped drain regions LDD are depicted in FIG. 7H. The plurality of lightly doped drain regions LDD are formed in double-gate transistors, e.g., the first transistor T1 and the third transistor T3. In each of the channel parts of a double-gate transistor, two lightly doped drain regions are formed on both sides of a respective channel part, and the plurality of lightly doped drain regions LDD are not subject to p+ doping. The plurality of lightly doped drain regions LDD have a relatively higher resistances as compared to those in remaining portions of the drain electrodes and source electrodes. By having the plurality of lightly doped drain regions LDD, current leakage issues in the double-gate transistors can be effectively obviated, improving the low-frequency flicker in the array substrate.

In some embodiments, two lightly doped drain regions LDD are also formed in the seventh transistor T7. In the seventh transistor T7, two lightly doped drain regions are formed on both sides of the channel part, and the plurality of lightly doped drain regions LDD are not subject to p+ doping. The plurality of lightly doped drain regions LDD have a relatively higher resistances as compared to those in remaining portions of the drain electrodes and source electrodes. By having the plurality of lightly doped drain regions LDD, current leakage issues in the seventh transistor T7 can be effectively obviated, improving the low-frequency flicker in the array substrate.

Referring to FIG. 2E, FIG. 2F, FIG. 7A, FIG. 7E, and FIG. 8A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the first signal line layer includes a node connecting line Cln on a side of the inter-layer dielectric layer ILD away from the second capacitor electrode Ce2. The node connecting line Cln is in a same layer as the plurality of voltage supply lines Vdd. Optionally, the array substrate further includes a first via v1 in the hole region H and extending through the inter-layer dielectric layer ILD and the insulating layer IN. Optionally, the node connecting line Cln is connected to the first capacitor electrode Ce1 through the first via v1. In some embodiments, the first capacitor electrode Ce1 is on a side of the gate insulating layer GI away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the node connecting line Cln is connected to the first capacitor electrode Ce1 through the first via v1, and the node connecting line Cln is connected to the semiconductor material layer SML through the second via v2. Optionally, the node connecting line Cln is connected to the source electrode S3 of third transistor, as depicted in FIG. 8A.

Referring to Referring to FIG. 2E, FIG. 2F, FIG. 7A to FIG. 7H, and FIG. 8A, in some embodiments, the interference preventing block IPB is in a same layer as the second capacitor electrode Ce2. The respective voltage supply line of the plurality of voltage supply lines Vdd is connected to the interference preventing block IPB through a third via v3. Optionally, the third via v3 extends through the inter-layer dielectric layer ILD. Optionally, an orthographic projection of the interference preventing block IPB on the base substrate BS partially overlaps with an orthographic projection of the respective voltage supply line of the plurality of voltage supply lines Vdd on the base substrate BS. Optionally, the orthographic projection of the interference preventing block IPB on the base substrate BS at least partially overlaps with an orthographic projection of an active layer ACT3 of the third transistor T3 on the base substrate BS.

Referring to FIG. 7A to FIG. 7H, and FIG. 8B, the respective third reset signal line of the plurality of third reset signal lines Vintv connects a respective second reset signal line of the plurality of second reset signal lines (e.g., the respective second reset signal line of the present stage Vint2N) and the source electrode S1 of the first transistor T1 in a respective pixel driving circuit together.

The respective second reset signal line of the plurality of second reset signal lines (e.g., the respective second reset signal line of the present stage Vint2N) is configured to provide a reset signal to the source electrode S1 of the first transistor T1 in the respective pixel driving circuit, through the respective third reset signal line of the plurality of third reset signal lines Vintv. Optionally, the respective third reset signal line is connected to the respective second reset signal line of the present stage Vint2N through a fourth via v4 extending through the inter-layer dielectric layer ILD. Optionally, the respective third reset signal line is connected to the source electrode S1 of the first transistor T1 in the respective pixel driving circuit through a fifth via v5 extending through the inter-layer dielectric layer ILD, the insulating layer IN, and the gate insulating layer GI.

Referring to FIG. 7A to FIG. 7H, and FIG. 8C, the first connecting line Cl1 connects a respective first reset signal line of the plurality of first reset signal lines (e.g., the respective first reset signal line of the next adjacent stage Vint1(N+1)) and the source electrode S6 of the sixth transistor T6 in a respective pixel driving circuit together.

The respective first reset signal line of the plurality of first reset signal lines (e.g., the respective first reset signal line of the next adjacent stage Vint1(N+1)) is configured to provide a reset signal to the source electrode S6 of the sixth transistor T6 in the respective pixel driving circuit, through the first connecting line C11. Optionally, the first connecting line Cl1 is connected to the respective first reset signal line of the next adjacent stage Vint1(N+1) through a sixth via v6 extending through the inter-layer dielectric layer ILD. Optionally, the first connecting line Cl1 is connected to the source electrode S6 of the sixth transistor T6 in the respective pixel driving circuit through a seventh via v7 extending through the inter-layer dielectric layer ILD, the insulating layer IN, and the gate insulating layer GI.

The inventors of the present disclosure discover that, surprisingly and unexpectedly, the intricate structure of the array substrate leads to significantly reduced residual image and low-frequency flicker. Referring to FIG. 2A to FIG. 2F, FIG. 3A, FIG. 5A, and FIG. 7A, the array substrate in some embodiments includes a plurality of first reset signal lines configured to provide a plurality of first reset signals and a plurality of second reset signal lines configured to provide a plurality of second reset signals. The N1 node and the N4 node in a respective pixel driving circuit are initialized by a respective first reset signal and a respective second reset signal, respectively. The reset (initialization) voltage levels for the N1 node and the N4 node may be different from each other, tailored to different situations at the N1 node and the N4 node. Optionally, the N1 node is a node connected to a gate electrode of the driving transistor Td, and the first capacitor electrode Ce1 of the storage capacitor Cst. Optionally, the N1 node is further connected to a drain electrode of a reset transistor (e.g., the first transistor T1). Optionally, the N1 node is further connected to a source electrode of a compensation transistor (e.g., the third transistor T3). Optionally, the N4 node is a node connected to a drain electrode of a light emitting control transistor (e.g., the fifth transistor T5), and connected to, either directly or through one or more anode connecting pads, an anode of a respective light emitting element. Optionally, the N4 node is further connected to a drain electrode of a reset transistor (e.g., the sixth transistor T6).

Figure 9A:
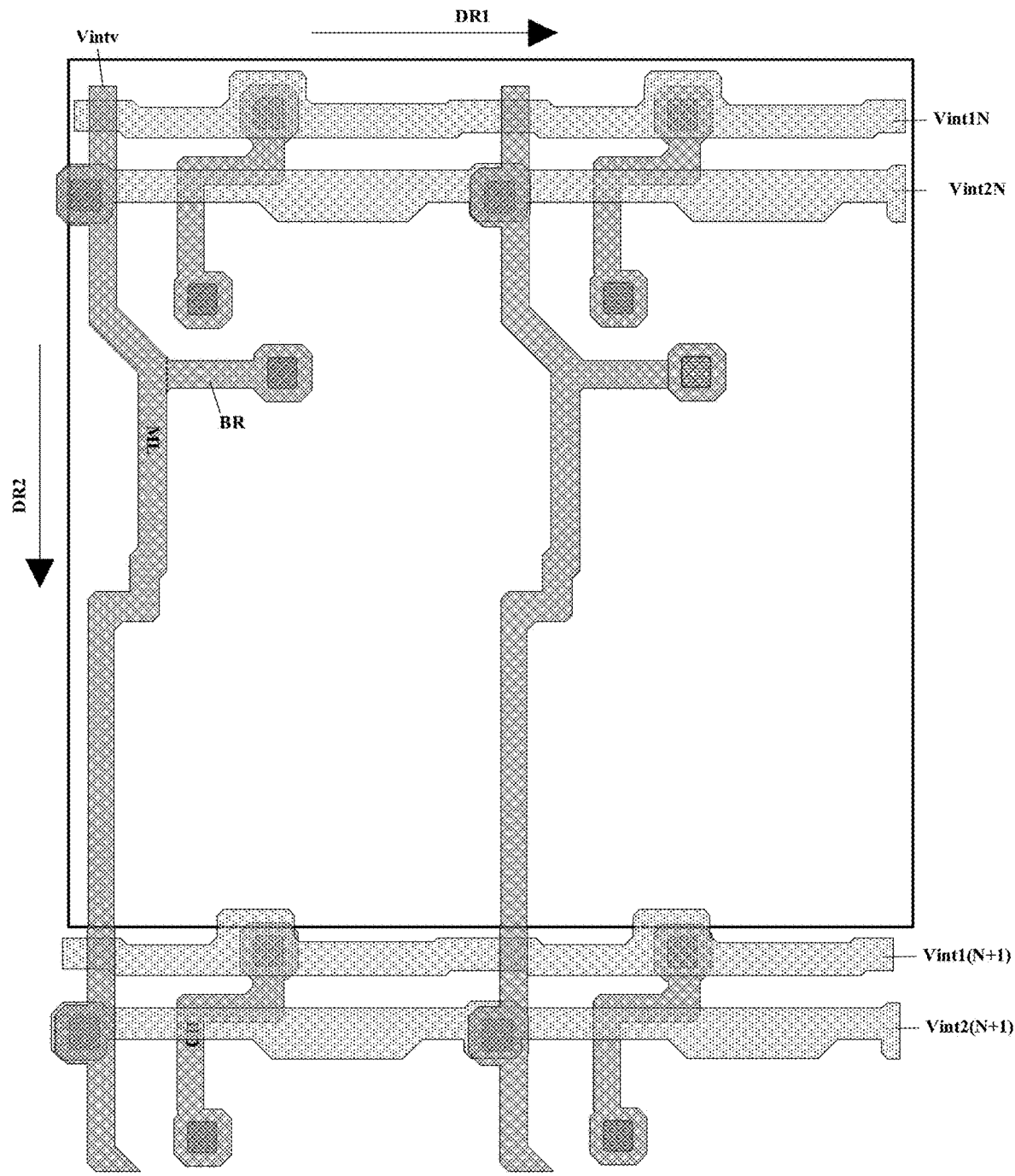
FIG. 9A illustrates the structure of a second conductive layer and a first signal line layer in an array substrate depicted in FIG. 3A.
Figure 9B:
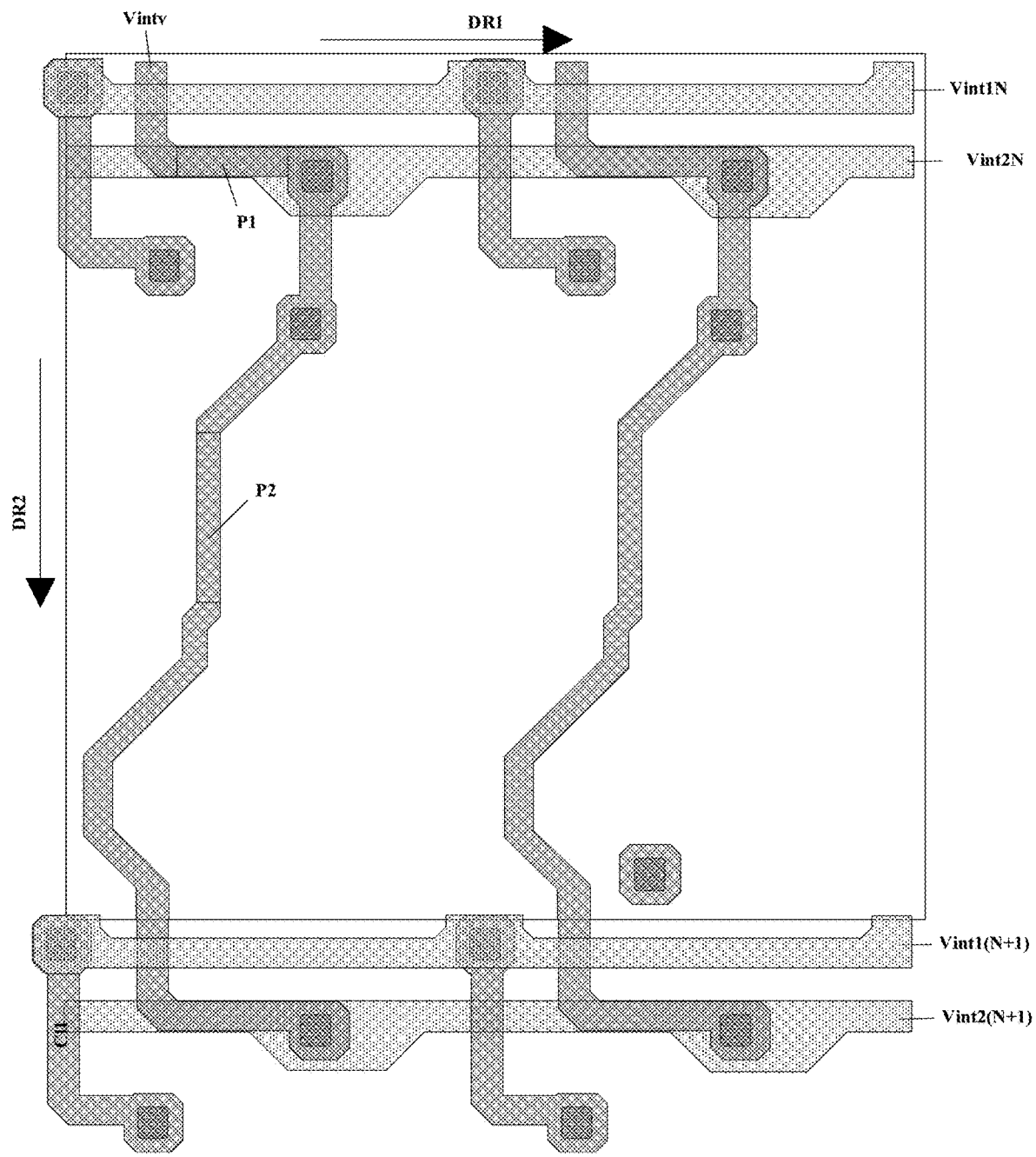
FIG. 9B illustrates the structure of a second conductive layer and a first signal line layer in an array substrate depicted in FIG. 5A.
Figure 9C:
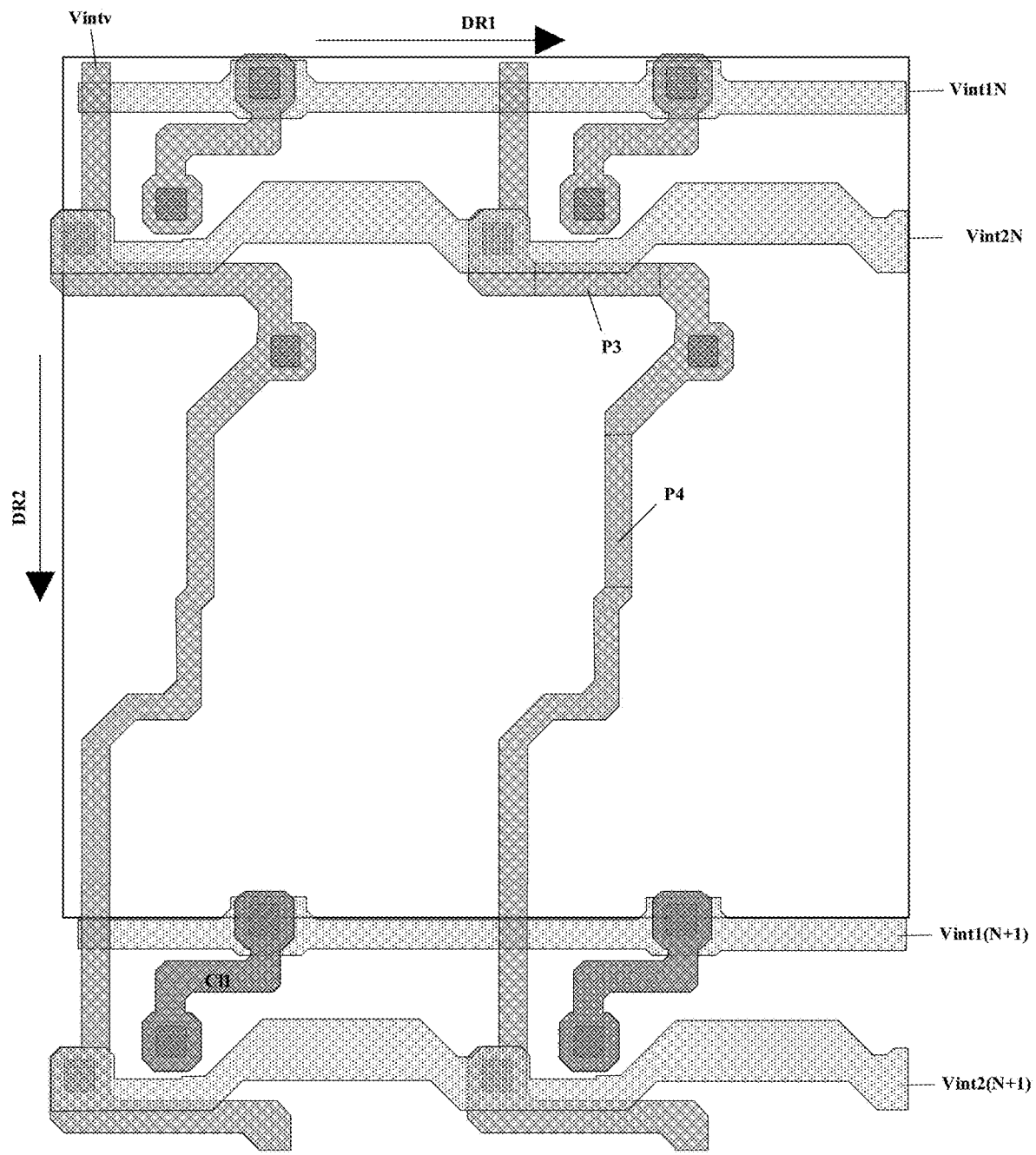
FIG. 9C illustrates the structure of a second conductive layer and a first signal line layer in an array substrate depicted in FIG. 7A.

FIG. 9A illustrates the structure of a second conductive layer and a first signal line layer in an array substrate depicted in FIG. 3A. FIG. 9B illustrates the structure of a second conductive layer and a first signal line layer in an array substrate depicted in FIG. 5A. FIG. 9C illustrates the structure of a second conductive layer and a first signal line layer in an array substrate depicted in FIG. 7A. Referring to FIG. 3A to FIG. 3C, and FIG. 9A to FIG. 9C, the array substrate in some embodiments includes a plurality of first reset signal lines (e.g., Vint1N and Vint1(N+1)) and a plurality of first connecting lines (e.g., Cl1). A respective first reset signal line is connected to a row of first connecting lines, which in turn are connected to source electrodes of sixth transistors in a row of subpixels, respectively. The plurality of first reset signal lines are configured to provide a plurality of first reset signals to source electrodes of sixth transistors in the array substrate.

In some embodiments, the array substrate further includes a reset signal supply network. Referring to FIG. 3A to FIG. 3C, and FIG. 9A to FIG. 9C, the reset signal supply network in some embodiments includes a plurality of second reset signal lines (e.g., Vint2N and Vint2(N+1)) respectively extending along the first direction DR1 (e.g., a row direction) and a plurality of third reset signal lines Vintv respectively extending along the second direction DR2 (e.g., a column direction). A respective second reset signal line is connected to one or more (e.g., multiple ones, or optionally all) of the plurality of third reset signal lines Vintv. A respective third reset signal line is connected to one or more (e.g., multiple ones, or optionally all) of the plurality of second reset signal lines. The plurality of second reset signal lines respectively cross over the plurality of third reset signal lines Vintv. Optionally, the plurality of second reset signal lines are in the second conductive layer, and the plurality of third reset signal lines Vintv are in the first signal line layer.

By having an interconnected reset signal supply network comprising the plurality of second reset signal lines and the plurality of third reset signal lines Vintv, the initialization at the N1 node can be sped up, obviating loading issues in the reset signal lines. In pixel driving circuits having the seventh transistor T7 (e.g., the pixel driving circuits as shown in FIG. 2C to FIG. 2F), the initialization at the N1 node and at the N3 node can be sped up by having an interconnected reset signal supply network comprising the plurality of second reset signal lines and the plurality of third reset signal lines Vintv.

Referring to FIG. 9A, in some embodiments, a respective third reset signal line of the plurality of third reset signal lines Vintv includes a main line ML with an overall extension direction along the second direction DR2, and a branch line BR connected to and extending away from the main line ML. Optionally, the branch line BR extends along a direction substantially parallel to the first direction DR1. As used herein, the term "substantially parallel" means that an angle is in the range of 0 degree to approximately 30 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees.

Referring to FIG. 3A to FIG. 3H, and FIG. 9A, an orthographic projection of the branch line BR on a base substrate is non-overlapping with an orthographic projection of any of the signal lines in the first conductive layer on the base substrate, is non-overlapping with an orthographic projection of any of the signal lines in the second conductive layer on the base substrate, and is non-overlapping with an orthographic projection of any of the signal lines in the second signal line layer on the base substrate. The orthographic projection of the branch line BR on a base substrate is between an orthographic projection of the respective reset control signal line rstN on the base substrate and an orthographic projection of the interference preventing block IPB on the base substrate, and between an orthographic projection of the main line ML on the base substrate and an orthographic projection of a respective voltage supply line of the plurality of voltage supply lines Vdd on the base substrate.

Referring to FIG. 5A to FIG. 5H, and FIG. 9B, in some embodiments, a respective third reset signal line of the plurality of third reset signal lines Vintv includes a first portion P1 extending along a direction substantially parallel to the first direction DR1, and a second portion P2 extending along a direction substantially parallel to the second direction DR2. Optionally, an orthographic projection of the first portion P1 on the base substrate at least partially overlaps with an orthographic projection of the respective second reset signal line of the present stage Vint2N on the base substrate. Optionally, an orthographic projection of the second portion P2 on the base substrate at least partially overlaps with an orthographic projection of the gate protrusion GP of a respective gate line of the plurality of gate lines GL on the base substrate.

Referring to FIG. 7A to FIG. 7H, and FIG. 9C, in some embodiments, a respective third reset signal line of the plurality of third reset signal lines Vintv includes a third portion P3 extending along a direction substantially parallel to the first direction DR1, and a fourth portion P4 extending along a direction substantially parallel to the second direction DR2. Optionally, an orthographic projection of the third portion P3 on the base substrate at least partially overlaps with an orthographic projection of the respective second reset signal line of the present stage Vint2N on the base substrate, and an orthographic projection of the respective reset control signal line rstN in a present stage of a plurality of reset control signal lines on the base substrate. Optionally, an orthographic projection of the fourth portion P4 on the base substrate at least partially overlaps with an orthographic projection of the gate protrusion GP of a respective gate line of the plurality of gate lines GL on the base substrate.

The inventors of the present disclosure further discover that, surprisingly and unexpectedly, a synergistic effect can be achieved for reducing residual image and low-frequency flicker in the array substrate by combining the independently controlled reset signal lines with inclusion of lightly doped drain regions in selected transistors of the pixel driving circuits.

Referring to FIG. 2A to FIG. 2F, FIG. 3A to FIG. 3H, FIG. 5A to FIG. 5H, and FIG. 7A to FIG. 7H, in some embodiments, at least one transistor includes a source electrode, a drain electrode, and an active layer having a channel part. Optionally, the active layer further includes at least one of a first lightly doped drain region between the channel part and the source electrode, or a second lightly doped drain region between the channel part and the drain electrode. Optionally, the active layer includes a first lightly doped drain region between the channel part and the source electrode, and a second lightly doped drain region between the channel part and the drain electrode.

In some embodiments, the at least one transistor having the lightly doped drain region is a reset transistor (e.g., the first transistor T1, the seventh transistor T7).

In some embodiments, the at least one reset transistor having the lightly doped drain region is a reset transistor having a drain electrode connected to the N1 node (e.g., the first transistor T1). Optionally, the N1 node is a node connected to a gate electrode of the driving transistor Td, and the first capacitor electrode Ce1 of the storage capacitor Cst.

In some embodiments, the at least one reset transistor having the lightly doped drain region is a reset transistor having a drain electrode connected to the N3 node (e.g., the seventh transistor T7). Optionally, the N3 node is a node connected to a drain electrode of the driving transistor Td and a source electrode of a light emitting control transistor (e.g., the fifth transistor T5).

In some embodiments, the at least one reset transistor having the lightly doped drain region is a compensation transistor (e.g., the third transistor T3) configured to provide a compensation voltage signal to a gate electrode of the driving transistor.

In some embodiments, the compensation transistor is a transistor having a source electrode connected to the N1 node, and a drain electrode connected to the N3 node. Optionally, a gate electrode of the compensation transistor is connected to a respective gate line of the plurality of gate lines GL.

In some embodiments, the at least one transistor is a double-gate transistor. The active layer of the double-gate transistor includes a first channel part and a second channel part spaced apart from each other by a third part. Optionally, the active layer further includes at least one of a first lightly doped drain region between the channel part and the source electrode, a second lightly doped drain region between the channel part and the drain electrode, a third lightly doped drain region between the first channel part and the third part, or a fourth lightly doped drain region between the second channel part and the third part. Optionally, the double-gate transistor includes a first lightly doped drain region between the first channel part and the source electrode, and a second lightly doped drain region between the second channel part and the drain electrode. Optionally, the double-gate transistor further includes a first lightly doped drain region between the first channel part and the source electrode, a second lightly doped drain region between the second channel part and the drain electrode, a third lightly doped drain region between the first channel part and the third part, and a fourth lightly doped drain region between the second channel part and the third part.

In some embodiments, the at least one transistor is a single-gate transistor.

Figure 10A:
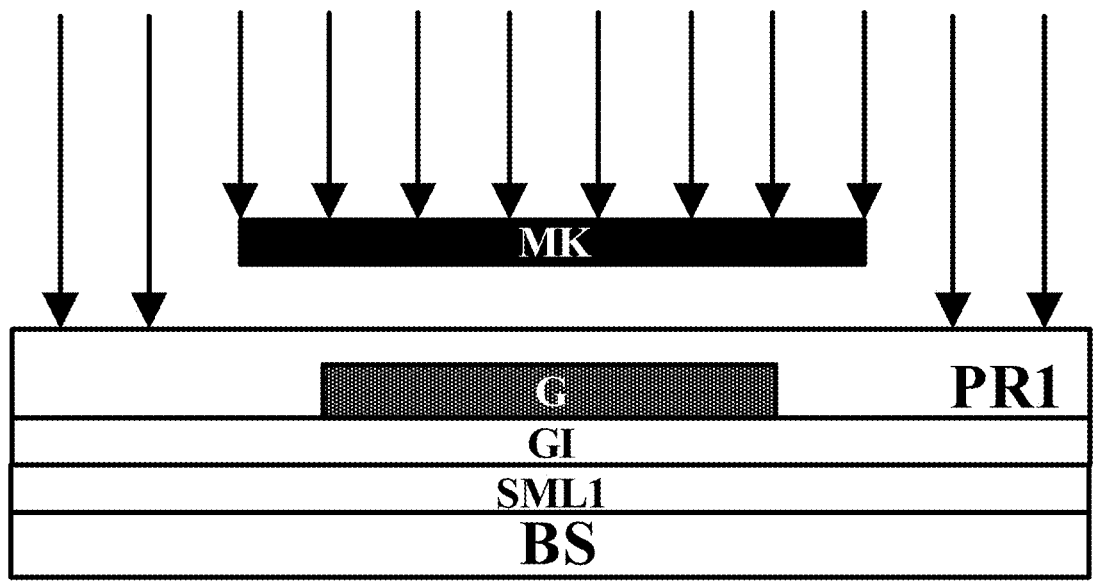
FIG. 10A to FIG. 10E illustrate a process of forming lightly doped drain regions in an array substrate in some embodiments according to the present disclosure.
Figure 10B:
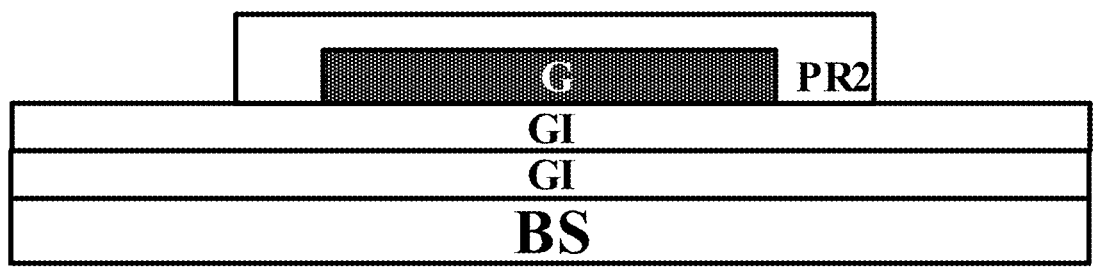
Figure 10C:
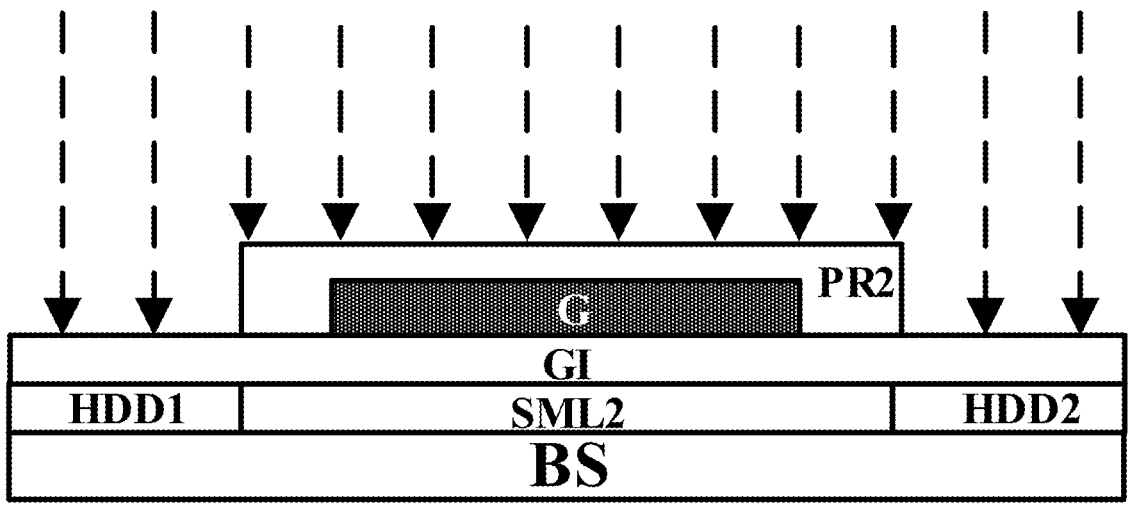

FIG. 10A to FIG. 10E illustrate a process of forming lightly doped drain regions in an array substrate in some embodiments according to the present disclosure. Referring to FIG. 10A, a first semiconductor material layer SML1 is formed on a base substrate BS, a gate insulating layer GI is formed on a side of the first semiconductor material layer SML1 away from the base substrate BS, a gate electrode G is formed on a side of the gate insulating layer GI away from the first semiconductor material layer SML1, and a first photoresist layer PR1 is formed on a side of the gate electrode G and the gate insulating layer GI away from the base substrate BS. The first photoresist layer PR1 is exposed using a mask plate MK. An orthographic projection of the mask plate MK on the base substrate BS covers an orthographic projection of the gate electrode G on the base substrate BS, with a margin. The margin is equivalent to lightly doped drain regions to be formed in the array substrate.

Referring to FIG. 10 B, subsequent to exposure, the first photoresist layer PR1 is developed to form a second photoresist layer PR2. Referring to FIG. 10C, the substrate is subject to a first doping process, e.g., a heavily doping process. In one example, the first doping process is a P+ doping process. The first doping process converts the first semiconductor material layer SML1 into a first heavily doped drain region HDD1, a second heavily doped drain region HDD2, and a second semiconductor material layer SML2 between the first heavily doped drain region HDD1 and the second heavily doped drain region HDD2. The second semiconductor material layer SML2 is not subject to the first doping due to the presence of the second photoresist layer PR2 and the gate electrode G. The first heavily doped drain region HDD1 and the second heavily doped drain region HDD2 are heavily doped.

Figure 10D:
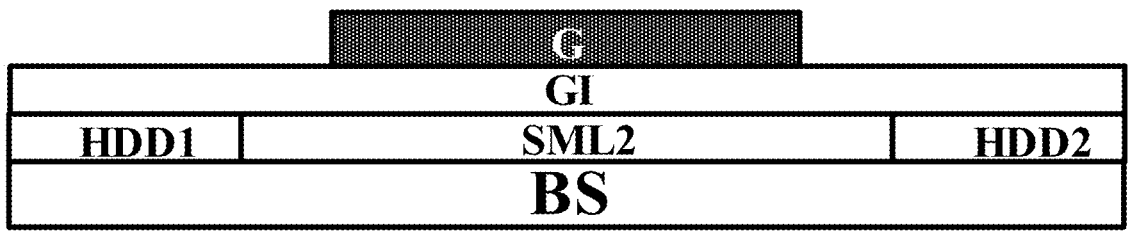

Referring to FIG. 10D, subsequent to the first doping process, the second photoresist layer PR2 is removed.

Figure 10E:
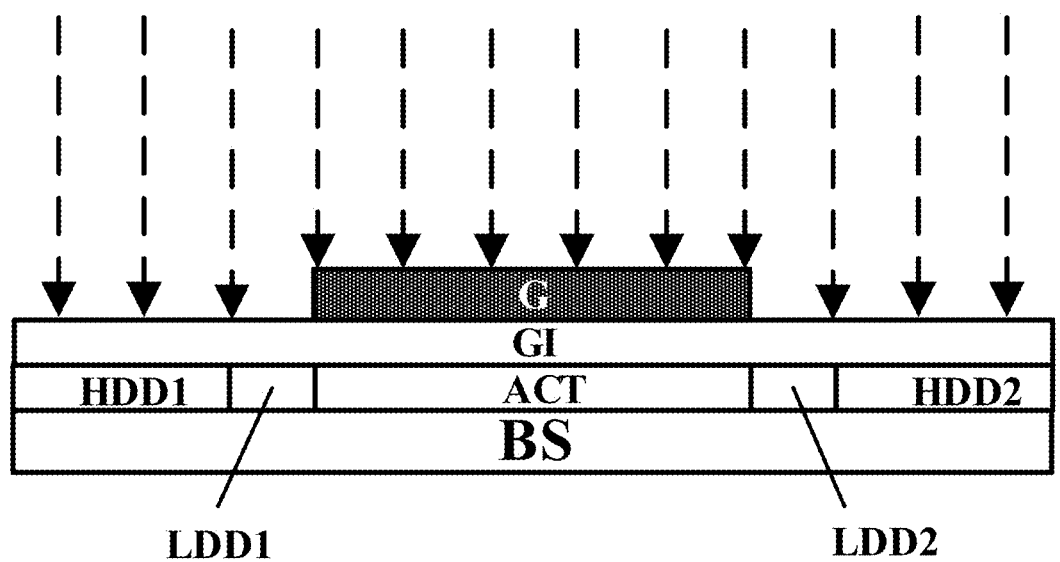

Referring to FIG. 10E, the substrate is then subject to a second doping process, e.g., a lightly doping process. The second doping process converts the second semiconductor material layer SML2 into a channel part CH, a first lightly doped drain region LDD1, and a second light doped drain region LDD2. The channel part CH is not subject to the second doping due to the presence of the gate electrode G as a mask. The first lightly doped drain region LDD1 and the second light doped drain region LDD2 are lightly doped.

In some embodiments, the heavily doped drain regions HDD1 and HDD2 have a doping concentration in a range of $4.5\times10^{15}$ ions/cm$^3$ to $6\times10^{15}$ ions/cm$^3$ (e.g., $4.5\times10^{15}$ ions/cm$^3$ to $5.0\times10^{15}$ ions/cm$^3$, $5.0\times10^{15}$ ions/cm$^3$ to $5.5\times10^{15}$ ions/cm$^3$, or $5.5\times10^{15}$ ions/cm$^3$ to $6.0\times10^{15}$ ions/cm$^3$), and thelightly doped drain regions LDD1 and LDD2 have a doping concentration in a range of $5\times10^{12}$ ions/cm$^3$ to $4.5\times10^{15}$ ions/cm$^3$ (e.g., $5.0\times10^2$ ions/cm$^3$ to $5.0\times10^{13}$ ions/cm$^3$, $5.0\times10^{13}$ ions/cm$^3$ to $5.0\times10^{14}$ ions/cm$^3$, or $5.0\times10^4$ ions/cm$^3$ to $4.5\times10^{15}$ ions/cm$^3$). Optionally, the doping concentration in the heavily doped drain regions HDD1 and HDD2 is greater than or equal to 100 times of the doping concentration in the lightly doped drain regions LDD1 and LDD2.

In some embodiments, an off-current $I_{off}$ of a transistor having the lightly doped drain regions LDD1 and LDD2 (for example, the first transistor T1, the third transistor T3, or the seventh transistor T7) is less than an off-current $I_{off}$ of a transistor without a lightly doped drain region (the second transistor T2, the fourth transistor T4, the fifth transistor T5, or the sixth transistor T6). In one example, the off-current $I_{off}$ of the transistor having the lightly doped drain regions LDD1 and LDD2 is equal to or less than 1/10 of the off-current $I_{off}$ of the transistor without a lightly doped drain region.

In some embodiments, a conductivity type of the channel part CH is a N-type, a conductivity type of the lightly doped drain regions LDD1 and LDD2 is a P-type, and a conductivity type of the heavily doped drain regions HDD1 and HDD2 is a P-type.

The inventors of the present disclosure further discover that further synergistic effects can be achieved for reducing residual image and low-frequency flicker in the array substrate by including an additional reset transistor (e.g., the seventh transistor T7). The additional reset transistor is a reset transistor connected to the N3 node. Having the additional transistor ensures that the voltage levels at third nodes of all subpixels are uniform at the time prior to a data write stage, enhancing the display uniformity in the array substrate.

In some embodiments, referring to FIG. 5A to FIG. 5H, and FIG. 7A to FIG. 7H, the interference preventing block IPB includes at least one of a first interference preventing portion IPBP1, a second interference preventing portion IPBP2, a third interference preventing portion IPBP3, or a fourth interference preventing portion IPBP4. Optionally, an orthographic projection of the first interference preventing portion IPBP1 on the base substrate is between an orthographic projection of a gate electrode of the third transistor T3 on the base substrate and an orthographic projection of a gate electrode of the seventh transistor T7 on the base substrate. Optionally, the orthographic projection of the first interference preventing portion IPBP1 on the base substrate spaces apart the orthographic projection of a gate electrode of the third transistor T3 on the base substrate and the orthographic projection of a gate electrode of the seventh transistor T7 on the base substrate. Optionally, the first interference preventing portion IPBP1 extends along a direction substantially parallel to a first direction DR1.

In some embodiments, the second interference preventing portion IPBP2 connects to, and extends away from, a first end E1 of the first interference preventing portion IPBP1. Optionally, the second interference preventing portion IPBP2 extends away from the first interference preventing portion IPBP1 along a direction substantially parallel to a second direction DR2. Optionally, an orthographic projection of the second interference preventing portion IPBP2 on the base substrate at least partially overlaps with an orthographic projection of a third part of an active layer of the third transistor T3 on the base substrate. The third part is between the first channel part and the second channel part of the active layer of the third transistor T3. By having the second interference preventing portion IPBP2, a voltage level in the third part can be stabilized.

In some embodiments, the third interference preventing portion IPBP3 and the fourth interference preventing portion IPBP4 connect to a second end E2 of the first interference preventing portion IPBP1, respectively. The second end E2 is opposite to the first end E1. The third interference preventing portion IPBP3 and the fourth interference preventing portion IPBP4 extend away from the first interference preventing portion IPBP1, respectively, along opposite directions, for example, both of the opposite directions being substantially parallel to the second direction DR2. Optionally, the third interference preventing portion IPBP3 extends away from the first interference preventing portion IPBP1 toward the respective second reset signal line of the present stage Vint2N. Optionally, the fourth interference preventing portion IPBP4 extends away from the first interference preventing portion IPBP1 toward a second capacitor electrode Ce2 of the storage capacitor Cst. Optionally, an orthographic projection of the third interference preventing portion IPBP3 and the fourth interference preventing portion IPBP4 on the base substrate at least partially overlaps with an orthographic projection of the N1 node on the base substrate. The third interference preventing portion IPBP3 and the fourth interference preventing portion IPBP4 form a parasitic capacitance with the N1 node, effectively reducing the cross-talk, particularly vertical cross-talk between the N1 nodes of the adjacent pixel driving circuits.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus.

In another aspect, the present disclosure provides a method of fabricating an array substrate. In some embodiments, the method includes forming a plurality of first reset signal lines configured to provide a plurality of first reset signals, forming a plurality of second reset signal lines configured to provide a plurality of second reset signals, forming a plurality of third reset signal lines, and forming a plurality of first connecting lines. Optionally, a respective first reset signal line of the plurality of first reset signal lines is connected to a row of first connecting lines of the plurality of first connecting lines, which in turn are connected to source electrodes of first reset transistors in a row of subpixels, respectively. Optionally, the plurality of second reset signal lines and the plurality of third reset signal lines form an interconnected reset signal supply network. Optionally, a respective second reset signal line of the plurality of second reset signal lines is connected to one or more of the plurality of third reset signal lines. Optionally, a respective third reset signal line of the plurality of third reset signal lines is connected to one or more of the plurality of second reset signal lines. Optionally, the plurality of second reset signal lines respectively cross over the plurality of third reset signal lines. Optionally, the respective third reset signal line is connected to source electrodes of second reset transistors in a column of subpixels.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a plurality of first reset signal lines configured to provide a plurality of first reset signals, a plurality of second reset signal lines configured to provide a plurality of second reset signals, a plurality of third reset signal lines, and a plurality of first connecting lines;

wherein a respective first reset signal line of the plurality of first reset signal lines is connected to a row of first connecting lines of the plurality of first connecting lines, which in turn are connected to source electrodes of first reset transistors in a row of subpixels, respectively;

the plurality of second reset signal lines and the plurality of third reset signal lines form an interconnected reset signal supply network;

a respective second reset signal line of the plurality of second reset signal lines is connected to one or more of the plurality of third reset signal lines;

a respective third reset signal line of the plurality of third reset signal lines is connected to one or more of the plurality of second reset signal lines;

the plurality of second reset signal lines respectively cross over the plurality of third reset signal lines; and the respective third reset signal line is connected to source electrodes of second reset transistors in a column of subpixels.

2. The array substrate of claim 1, wherein voltage levels of the plurality of first reset signals and the plurality of second reset signals are different from each other.

3. The array substrate of claim 1, comprising a plurality of pixel driving circuits configured to drive light emission in a plurality of subpixels;

wherein a respective pixel driving circuit of the plurality of pixel driving circuits comprises an N1 node connected to a gate electrode of a driving transistor and an N4 node connected to a drain electrode of a light emitting control transistor; and reset voltage levels at the N1 node and the N4 node are different from each other.

4. The array substrate of claim 1, comprising a plurality of pixel driving circuits configured to drive light emission in a plurality of subpixels;

wherein the plurality of first reset signal lines, the plurality of second reset signal lines are in a second conductive layer comprising second capacitor electrodes of storage capacitors of the plurality of pixel driving circuits; and the plurality of third reset signal lines and the plurality of first connecting lines are in a first signal line layer comprising a plurality of voltage supply lines.

5. The array substrate of claim 1, wherein a respective third reset signal line of the plurality of third reset signal lines comprises a main line with an overall extension direction along a second direction, and a branch line connected to and extending away from the main line; and the branch line extends along a direction substantially parallel to a first direction.

6. The array substrate of claim 5, wherein an orthographic projection of the branch line on a base substrate is between an orthographic projection of a respective reset control signal line of a plurality of reset control signal lines on the base substrate and an orthographic projection of an interference preventing block on the base substrate, and between an orthographic projection of the main line on the base substrate and an orthographic projection of a respective voltage supply line of a plurality of voltage supply lines on the base substrate.

7. The array substrate of claim 5, wherein an orthographic projection of the branch line on a base substrate is non-overlapping with an orthographic projection of any signal line in a first conductive layer on the base substrate, is non-overlapping with an orthographic projection of any signal line in a second conductive layer on the base substrate, and is non-overlapping with an orthographic projection of any signal line in a second signal line layer on the base substrate.

8. The array substrate of claim 1, wherein a respective third reset signal line of the plurality of third reset signal lines comprises a first portion extending along a direction substantially parallel to a first direction, and a second portion extending along a direction substantially parallel to a second direction;

an orthographic projection of the first portion on a base substrate at least partially overlaps with an orthographic projection of a respective second reset signal line of a present stage on the base substrate; and an orthographic projection of the second portion on the base substrate at least partially overlaps with an orthographic projection of a gate protrusion of a respective gate line of a plurality of gate lines on the base substrate.

9. The array substrate of claim 1, wherein a respective third reset signal line of the plurality of third reset signal lines comprises a third portion extending along a direction substantially parallel to a first direction, and a fourth portion extending along a direction substantially parallel to a second direction;

an orthographic projection of the third portion on a base substrate at least partially overlaps with an orthographic projection of a respective second reset signal line of a present stage of the plurality of second reset signal lines on the base substrate, and at least partially overlaps with an orthographic projection of a respective reset control signal line in the present stage of a plurality of reset control signal lines on the base substrate; and an orthographic projection of the fourth portion on the base substrate at least partially overlaps with an orthographic projection of a gate protrusion of a respective gate line of a plurality of gate lines on the base substrate.

10. The array substrate of claim 1, comprising a plurality of pixel driving circuits configured to drive light emission in a plurality of subpixels;

wherein a respective pixel driving circuit of the plurality of pixel driving circuits comprises at least one transistor, which includes a source electrode, a drain electrode, and an active layer having a channel part; and the active layer further comprises at least one of a first lightly doped drain region between the channel part and the source electrode, or a second lightly doped drain region between the channel part and the drain electrode.

11. The array substrate of claim 10, wherein the at least one transistor having lightly doped drain region is a reset transistor.

12. The array substrate of claim 10, wherein the at least one transistor having lightly doped drain region is a reset transistor having a drain electrode connected to an N1 node; and the N1 node is a node connected to a gate electrode of a driving transistor, and connected to a first capacitor electrode of a storage capacitor.

13. The array substrate of claim 10, wherein the at least one transistor having lightly doped drain region is a reset transistor having a drain electrode connected to an N3 node; and the N3 node is a node connected to a drain electrode of a driving transistor and a source electrode of a light emitting control transistor.

14. The array substrate of claim 10, wherein the at least one transistor having lightly doped drain region is a compensation transistor configured to provide a compensation voltage signal to a gate electrode of a driving transistor;
- a source electrode of the compensation transistor is connected an N1 node;
- a drain electrode of the compensation transistor is connected to an N3 node;
- the N1 node is a node connected to a gate electrode of a driving transistor, and connected to a first capacitor electrode of a storage capacitor; and
- the N3 node is a node connected to a drain electrode of a driving transistor and a source electrode of a light emitting control transistor.

15. The array substrate of claim 10, wherein the at least one transistor having lightly doped drain region is a double-gate transistor.

16. The array substrate of claim 1, comprising a plurality of pixel driving circuits configured to drive light emission in a plurality of subpixels;
- wherein a respective pixel driving circuit of the plurality of pixel driving circuits comprises a third reset transistor;
- a drain electrode of the third reset transistor is connected to an N3 node; and
- the N3 node is a node connected to a drain electrode of a driving transistor and a source electrode of a light emitting control transistor.

17. The array substrate of claim 1, comprising a plurality of pixel driving circuits configured to drive light emission in a plurality of subpixels;
- wherein a respective pixel driving circuit of the plurality of pixel driving circuits comprises an interference preventing block;
- the interference preventing block comprises at least one of a first interference preventing portion, a second interference preventing portion, a third interference preventing portion, or a fourth interference preventing portion;
- an orthographic projection of the first interference preventing portion on the base substrate is between an orthographic projection of a gate electrode of a compensation transistor on the base substrate and an orthographic projection of a gate electrode of a third reset transistor on the base substrate; and
- the orthographic projection of the first interference preventing portion on the base substrate spaces apart the orthographic projection of the gate electrode of the compensation transistor on the base substrate and the orthographic projection of the gate electrode of the third reset transistor on the base substrate.

18. The array substrate of claim 17, wherein the second interference preventing portion connects to, and extends away from, a first end of the first interference preventing portion;
- the second interference preventing portion extends away from the first interference preventing portion along a direction substantially parallel to a second direction;
- an orthographic projection of the second interference preventing portion on the base substrate at least partially overlaps with an orthographic projection of a third part of an active layer of the compensation transistor on the base substrate; and
- the third part is between a first channel part and a second channel part of the active layer of the compensation transistor.

19. The array substrate of claim 18, wherein the third interference preventing portion and the fourth interference preventing portion connect to a second end of the first interference preventing portion, respectively;
- the second end is opposite to the first end;
- the third interference preventing portion and the fourth interference preventing portion extend away from the first interference preventing portion, respectively, along opposite directions;
- both of the opposite directions are substantially parallel to a second direction;
- the third interference preventing portion extends away from the first interference preventing portion toward a respective second reset signal line of a present stage of the plurality of second reset signal lines;
- the fourth interference preventing portion extends away from the first interference preventing portion toward a second capacitor electrode of a storage capacitor;
- an orthographic projection of the third interference preventing portion and the fourth interference preventing portion on the base substrate at least partially overlaps with an orthographic projection of an N1 node on the base substrate; and
- the N1 node is a node connected to a gate electrode of a driving transistor, and connected to a first capacitor electrode of the storage capacitor.

20. A display apparatus, comprising the array substrate of claim 1, and an integrated circuit connected to the array substrate.

* * * * *